United States Patent
Kweon

(10) Patent No.: US 9,019,341 B2
(45) Date of Patent: Apr. 28, 2015

(54) METHOD FOR OBTAINING A COMPOSITE IMAGE USING ROTATIONALLY SYMMETRICAL WIDE-ANGLE LENSES, IMAGING SYSTEM FOR SAME, AND CMOS IMAGE SENSOR FOR IMAGE-PROCESSING USING HARDWARE

(76) Inventor: Gyeongil Kweon, Gwangju (KR)

( * ) Notice: Subject to any disclaimer, the term of this patent is extended or adjusted under 35 U.S.C. 154(b) by 380 days.

(21) Appl. No.: 13/379,032

(22) PCT Filed: Jul. 7, 2010

(86) PCT No.: PCT/KR2010/004415
§ 371 (c)(1),
(2), (4) Date: Dec. 18, 2011

(87) PCT Pub. No.: WO2011/005024
PCT Pub. Date: Jan. 13, 2011

(65) Prior Publication Data
US 2012/0098926 A1    Apr. 26, 2012

(30) Foreign Application Priority Data

Jul. 8, 2009 (KR) .................. 10-2009-0061928
Jul. 6, 2010 (KR) .................. 10-2010-0064690

(51) Int. Cl.
H04N 5/335     (2011.01)
G06T 1/00      (2006.01)
H04N 5/232     (2006.01)

(52) U.S. Cl.
CPC .............. *G06T 1/00* (2013.01); *H04N 5/23238* (2013.01)

(58) Field of Classification Search
USPC .......................................... 348/308, E05.091
See application file for complete search history.

(56) References Cited

U.S. PATENT DOCUMENTS

| 6,455,831 | B1 | 9/2002 | Bandera et al. |
| 7,009,645 | B1 | 3/2006 | Sandini et al. |
| 8,482,595 | B2 * | 7/2013 | Kweon ............................ 348/37 |
| 8,553,069 | B2 * | 10/2013 | Kweon ............................ 348/36 |
| 2006/0023105 | A1 * | 2/2006 | Kostrzewski et al. ........ 348/335 |

FOREIGN PATENT DOCUMENTS

KR  10-2000-0026590 A   5/2000
KR  10-2004-0036458 A   4/2004
(Continued)

OTHER PUBLICATIONS

International Search Report of PCT/KR2010/004415 Dated on Feb. 24, 2011.
KR Patent Office Action Issued on Aug. 16, 2010.
(Continued)

*Primary Examiner* — Thai Tran
*Assistant Examiner* — Nien-Ru Yang
(74) *Attorney, Agent, or Firm* — Maxon IP, LLC; Justin H. Kim

(57) ABSTRACT

The present invention provides a method for obtaining a composite image, which performs a mathematically correct image-processing on images obtained by wide-angle lenses which are rotationally symmetrical with regard to an optical axis, to achieve a desirable projection system. The present invention also provides a variety of imaging systems using the method. Further, the present invention provides a CMOS image sensor which has an accurate arrangement of pixels to perform image processing using hardware without the need for image processing by software.

30 Claims, 36 Drawing Sheets

(56) References Cited

FOREIGN PATENT DOCUMENTS

| KR | 10-2007-0009151 A | 1/2007 |
| KR | 10-2008-0002383 A | 1/2008 |

OTHER PUBLICATIONS

Alireza Moini, Vision Chips or Seeing Silicon, www.eleceng.adelaide.edu.au/personal/moini/, Mar. 1997.

Robert Wodnicki, Gordon W. Roberts, Martin D. Levine, A foveated Image Sensor in Standard CMOS Technology, Department of Electrical Engineering, McGill University.

F. Pardo, J.A. Boluda, J.J. Perez, S. Felici, B Dierickx, Design of a foveated log-polar image sensor in standard CMOS technology, Design of Integrated Circuits and Systems, DCIS'96, Spain, Nov. 1996.

Fernando Pardo, Space-Variant Non-orthogonal Structure CMOS Image Sensor Design, IEEE Journal of Solid-State Circuits, vol. 33, No. 6, Jun. 1998.

Giulio Sandini, Paolo Questa, Danny Scheffer, Bart Dierickx, Andrea Mannucci, A Retina-like CMOS Sensor and Its Application, Proceedings of 1st IEEE SAM Workshop, Mar. 16-17, 2000, Cambridge, USA.

Giulio Sandini, Jose Santos-Victor, Tomas Pajdla, Fabio Berton, Direct Omnidirectional Imaging Based on a Retina-like Sensor, IEEE International Conference on Sensors, Jun. 11-14, 2002—Sensors 2002.

\* cited by examiner

METHOD FOR OBTAINING A COMPOSITE IMAGE USING ROTATIONALLY SYMMETRICAL WIDE-ANGLE LENSES, IMAGING SYSTEM FOR SAME, AND CMOS IMAGE SENSOR FOR IMAGE-PROCESSING USING HARDWARE

TECHNICAL FIELD

The present invention generally relates to mathematically precise image processing methods of extracting complex images from images acquired using a camera equipped with a wide-angle lens that is rotationally symmetric about an optical axis and imaging systems employing these methods, as well as CMOS image sensors for hardwired image processing.

BACKGROUND ART

Panoramic camera, which captures the 360° view of scenic places such as tourist resorts, is an example of a panoramic imaging system. Panoramic imaging system is an imaging system that captures the views one could get by making one complete turn-around from a given spot. On the other hand, an omnidirectional imaging system captures the views of every possible direction from a given position. Omnidirectional imaging system provides a view that a person could observe from a given position by turning around as well as looking up and down. In a mathematical terminology, the solid angle of the region that can be captured by the imaging system is 4π steradian.

There have been a lot of studies and developments of panoramic and omnidirectional imaging systems not only in the traditional areas such as photographing buildings, nature scenes, and heavenly bodies, but also in security/surveillance systems using CCD (charge-coupled device) or CMOS (complementary metal-oxide-semiconductor) cameras, virtual touring of real estates, hotels and tourist resort, and navigational aids for mobile robots and unmanned aerial vehicles (UAV).

One method of obtaining a panoramic image is to employ a fisheye lens with a wide field of view (FOV). For example, the stars in the entire sky and the horizon can be captured in a single image by pointing a camera equipped with a fisheye lens with 180° FOV toward the zenith (i.e., the optical axis of the camera is aligned perpendicular to the ground plane). On this reason, fisheye lenses have been often referred to as "all-sky lenses". Particularly, a high-end fisheye lens by Nikon, namely, 6 mm f/5.6 Fisheye-Nikkor, has a FOV of 220°. Therefore, a camera equipped with this lens can capture a portion of the backside of the camera as well as the front side of the camera. Then, panoramic image can be obtained from thus obtained fisheye image after proper image processing.

In many cases, imaging systems are installed on vertical walls. Imaging systems installed on outside walls of a building for the purpose of monitoring the surroundings, or a rear view camera for monitoring the backside of a passenger car are such examples. In such cases, it is rather inefficient if the horizontal field of view is significantly larger than 180°. This is because a wall, which is not needed to be monitored, takes up a large space in the monitor screen. Pixels are wasted in this case, and the screen appears dull. Therefore, a horizontal FOV around 180° is more appropriate for such cases. Nevertheless, a fisheye lens with 180° FOV is not desirable for such applications. This is because the barrel distortion, which accompanies a fisheye lens, evokes psychological discomfort and thus abhorred by the consumer.

References 1 and 2 provide fundamental technologies of extracting an image having a particular viewpoint or projection scheme from an image having a different viewpoint or projection scheme. Specifically, reference 2 provides an example of a cubic panorama. In short, a cubic panorama is a special technique of illustration wherein the observer is assumed to be located at the very center of an imaginary cubic room made of glass, and the outside view from the center of the glass room is directly transcribed on the region of the glass wall where the ray vector from the object to the observer meets the glass wall. However, the environment was not a real environment captured by an optical lens, but a computer-created imaginary environment captured with an imaginary distortion-free pinhole camera.

From another point of view, all animals and plants including human are bound on the surface of the earth due to the gravitational pull, and most of the events, which need attention or cautionary measure, take place near the horizon. Therefore, even though it is necessary to monitor every 360° direction on the horizon, it is not as important to monitor high along the vertical direction, for example, as high as to the zenith or deep down to the nadir. Distortion is unavoidable if we want to describe the scene of every 360° direction on a two-dimensional plane. Similar difficulty exists in the cartography where geography on Earth, which is a structure on the surface of a sphere, needs to be mapped on a planar two-dimensional atlas.

All the animals, plants and inanimate objects such as buildings on the Earth are all under the influence of gravity, and the direction of the gravitational force is the up-right direction or the vertical direction. Among all the distortions, the distortion that appears most unnatural to the human is the distortion where vertical lines appear as curved lines. Therefore, even if other kinds of distortions are present, it is important to make sure that such a distortion is absent. In general, a ground plane is perpendicular to the direction of the gravitational force, but it not so on a slanted ground. Therefore, in a strict sense of the words, a reference has to be made with respect to the horizontal plane, and a vertical direction is a direction perpendicular to the horizontal plane.

Described in reference 3 are the well-known map projection schemes among the diverse map projection schemes such as equi-rectangular projection, Mercator projection and cylindrical projection schemes, and reference 4 provides a brief history of diverse map projection schemes. Among these, the equi-rectangular projection scheme is the projection scheme most familiar to us when we describe the geography on the Earth, or when we draw the celestial sphere in order to make a map of the constellation.

Referring to FIG. 1, if we assume the surface of the Earth or the celestial sphere is a spherical surface with a radius S, then an arbitrary point Q on the Earth's surface with respect to the center N of the Earth has a longitude $\psi$ and a latitude $\delta$. On the other hand, FIG. 2 is a schematic diagram of a planar map of the Earth's surface or the celestial sphere drawn according to the equi-rectangular projection scheme. A point Q on the Earth's surface having a longitude V and a latitude $\delta$ has a corresponding point P" on the planar map(234) drawn according to the equi-rectangular projection scheme. The rectangular coordinate of this corresponding point is given as (x", y"). Furthermore, the reference point on the equator having a longitude 0° and a latitude 0° has a corresponding point O" on the planar map, and this corresponding point O" is the origin of the rectangular coordinate system. Here, according to the equi-rectangular projection scheme, a same interval in the longitude (i.e., a same angular distance along the equatorial line) corresponds to a same lateral interval on the planar map. In other words, the lateral coordinate x" on the planar map(234) is proportional to the longitude.

$$x''=c\psi \quad \text{[Equation 1]}$$

Here, c is proportionality constant. Also, the longitudinal coordinate y" is proportional to the latitude, and has the same proportionality constant as the lateral coordinate.

$$y''=c\delta \quad \text{[Equation 2]}$$

Such an equi-rectangular projection scheme appears as a natural projection scheme considering the fact that the Earth's surface is close to a sphere. Nevertheless, it is disadvantageous in that the size of a geographical area is greatly distorted. For example, two very close points near the North Pole can appear as if they are on the opposite sides of the Earth in a map drawn according to the equi-rectangular projection scheme.

On the other hand, in a map drawn according to the Mercator projection scheme, the longitudinal coordinate is given as a complex function given in Eq. 3.

$$y'' = c\ln\left\{\tan\left(\frac{\pi}{4} + \frac{\delta}{2}\right)\right\} \quad \text{[Equation 3]}$$

On the other hand, FIG. 3 is a conceptual drawing illustrating a cylindrical projection scheme or a panoramic perspective. In a cylindrical projection scheme, an imaginary observer is located at the center N of a celestial sphere(331) with a radius S, and it is desired to make a map of the celestial sphere centered on the observer, the map covering most of the region, but excluding the zenith and the nadir. In other words, the span of the longitude must be 360° ranging from −180° to +180°, but the range of the latitude can be narrower including the equator within its span. Specifically, the span of the latitude can be assumed as ranging from −Δ to +Δ, and here, Δ must be smaller than 90°.

In this projection scheme, an imaginary cylindrical plane (334) is assumed which contacts the celestial sphere(331) at the equator(303). Then, for a point Q(ψ, δ) on the celestial sphere having a given longitude ψ and a latitude δ, a line segment connecting the center N of the celestial sphere and the point Q is extended until it meets the said cylindrical plane. This intersection point is designated as P(ψ, δ). In this manner, a corresponding point P on the cylindrical plane(334) can be obtained for every point Q on the celestial sphere(331) within the said latitude range. Then, a map having a cylindrical projection scheme is obtained when the cylindrical plane is cut and flattened out. Therefore, the lateral coordinate x" of the point P on the flattened-out cylindrical plane is given by Eq. 4, and the longitudinal coordinate y" is given by Eq. 5.

$$x''=S\psi \quad \text{[Equation 4]}$$

$$y''=S\tan\delta \quad \text{[Equation 5]}$$

Such a cylindrical projection scheme is used in panoramic cameras that produce panoramic images by rotating in the horizontal plane. Especially, if the lens mounted on the rotating panoramic camera is a distortion-free rectilinear lens, then the resulting panoramic image exactly follows a cylindrical projection scheme. In principle, such a cylindrical projection scheme is the most accurate panoramic projection scheme. However, the panoramic image appears unnatural when the latitudinal range is large, and thus it is not widely used in practice.

References 5 and 6 provide an example of a fisheye lens with 190° FOV, and reference 7 provides various examples of wide-angle lenses including dioptric and catadioptric fisheye lenses with stereographic projection schemes.

On the other hand, reference 8 provides various examples of obtaining panoramic images following cylindrical projection schemes, equi-rectangular projection schemes, or Mercator projection schemes from images acquired using rotationally symmetric wide-angle lenses including fisheye lenses. Referring to FIG. 4 through FIG. 12, most of the examples provided in the said references can be summarized as follows.

FIG. 4 is a conceptual drawing illustrating a real projection scheme of a rotationally symmetric wide-angle lens(412) including a fisheye lens. Z-axis of the world coordinate system describing objects captured by the wide-angle lens coincides with the optical axis(401) of the wide-angle lens(412). An incident ray(405) having a zenith angle θ with respect to the Z-axis is refracted by the lens(412), and as a refracted ray(406), converges toward an image point P on the focal plane(432). The distance between the nodal point N of the lens and the said focal plane is approximately equal to the effective focal length of the lens. The sub area on the focal plane whereon real image points have been formed is the image plane(433). To obtain a sharp image, the said image plane(433) must coincide with the image sensor plane(413) within the camera body(414). Said focal plane and the said image sensor plane are perpendicular to the optical axis. The intersection point ○ between the optical axis(401) and the image plane(433) is hereinafter referred to as the first intersection point. The distance between the first intersection point and the said image point P is r.

For general wide-angle lenses, the image height r is given by Eq. 6.

$$r=r(\theta) \quad \text{[Equation 6]}$$

Here, the unit of the incidence angle θ is radian, and the above function r(θ) is a monotonically increasing function of the zenith angle θ of the incident ray.

Such a real projection scheme of a lens can be experimentally measured using an actual lens, or can be calculated from the lens prescription using dedicated lens design software such as Code V or Zemax. For example, the y-axis coordinate y of the image point on the focal plane by an incident ray having given horizontal and vertical incidence angles can be calculated using a Zemax operator REAY, and the x-axis coordinate x can be similarly calculated using an operator REAX.

FIG. 5 is an imaginary interior scene produced by Professor Paul Bourke by using a computer, and it has been assumed that an imaginary fisheye lens with 180° FOV and having an ideal equidistance projection scheme has been used to capture the scene. This image is a square image, of which both the lateral and the longitudinal dimensions are 250 pixels. Therefore, the coordinate of the optical axis is (125.5, 125.5), and the image height for an incident ray with a zenith angle of 90° is given as r'(π/2)=125.5−1=124.5. Here, r' is not a physical distance, but an image height measured in pixel distance. Since this imaginary fisheye lens follows an equidistance projection scheme, the projection scheme of this lens is given by Eq. 7.

$$r'(\theta) = \frac{124.5}{\left(\frac{\pi}{2}\right)}\theta = 79.26\theta \quad \text{[Equation 7]}$$

FIG. 6 through FIG. 8 show diverse embodiments of wide-angle lenses presented in reference 7. FIG. 6 is a dioptric (i.e., refractive) fisheye lens with a stereographic projection scheme, FIG. 7 is a catadioptric fisheye lens with a stereographic projection scheme, and FIG. 8 is a catadioptric panoramic lens with a rectilinear projection scheme. In this manner, wide-angle lenses from the prior arts and in the current invention are not limited to fisheye lenses with equidistance projection schemes, but encompass all kind of wide-angle lenses that are rotationally symmetric about the optical axes.

The main point of the invention in reference 8 is about providing methods of obtaining panoramic images by applying mathematically accurate image processing algorithms on images obtained using rotationally symmetric wide-angle lenses. Referring to FIG. 9, diverse embodiments in reference 8 can be summarized as follows. FIG. 9 is a schematic diagram of a world coordinate system of prior arts.

The world coordinate system of the said invention takes the nodal point N of a rotationally symmetric wide-angle lens as the origin, and a vertical line passing through the origin as the Y-axis. Here, the vertical line is a line perpendicular to the ground plane, or more precisely to the horizontal plane(917). The X-axis and the Z-axis of the world coordinate system are contained within the ground plane. The optical axis(901) of the said wide-angle lens generally does not coincide with the Y-axis, and can be contained within the ground plane (i.e., parallel to the ground plane), or may not contained within the ground plane. The plane(904) containing both the said Y-axis and the said optical axis(901) is referred to as the reference plane. The intersection line(902) between this reference plane (904) and the ground plane(917) coincides with the Z-axis of the world coordinate system. On the other hand, an incident ray(905) originating from an object point Q having a rectangular coordinate (X, Y, Z) in the world coordinate system has an altitude angle δ from the ground plane, and an azimuth angle ψ with respect to the reference plane. The plane(906) containing both the Y-axis and the said incident ray(905) is the incidence plane. The horizontal incidence angle ψ of the said incident ray with respect to the said reference plane is given by Eq. 8.

$$\psi = \tan^{-1}\left(\frac{X}{Z}\right)$$ [Equation 8]

On the other hand, the vertical incidence angle (i.e., the altitude angle) δ subtended by the said incident ray and the X-Z plane is given by Eq. 9.

$$\delta = \tan^{-1}\left(\frac{Y}{\sqrt{X^2+Z^2}}\right)$$ [Equation 9]

The elevation angle μ of the said incident ray is given by Eq. 10, wherein χ is an arbitrary angle larger than −90° and smaller than 90°.

$$\mu = \delta - \chi$$ [Equation 10]

FIG. 10 is a schematic diagram of a panoramic imaging system, and mainly comprised of an image acquisition means (1010), an image processing means(1016) and image display means(1015, 1017). The image acquisition means(1010) includes a rotationally symmetric wide-angle lens(1012) and a camera body(1014) having an image sensor(1013) inside. The said wide-angle lens can be a fisheye lens with more than 180° FOV and having an equidistance projection scheme, but it is by no means limited to such a fisheye lens. Rather, it can be any rotationally symmetric wide-angle lens including a catadioptric fisheye lens. Hereinafter, for the sake of notational simplicity, a wide-angle lens will be referred to as a fisheye lens. Said camera body contains photodiodes such as CCD or CMOS sensors, and it can acquire either a still image or a movie. By the said fisheye lens(1012), a real image of the object plane(1031) is formed on the focal plane(1032). In order to obtain a sharp image, the image sensor plane(1013) must coincide with the focal plane(1032). In FIG. 10, the symbol 1001 refers to the optical axis.

The real image of the objects on the object plane(1031) formed by the fisheye lens(1012) is converted by the image sensor(1013) into electrical signals, and displayed as an uncorrected image plane(1034) on an image display means (1015). This uncorrected image plane(1034) is a distorted image by the fisheye lens. This distorted image plane can be rectified by the image processing means(1016), and then displayed as a processed image plane(1035) on an image display means(1017) such as a computer monitor or a CCTV monitor. Said image processing can be accomplished by software running on a computer, or it can be done by embedded software running on FPGA (Field Programmable Gate Array), CPLD (Complex Programmable Logic Device), ARM core processor, ASIC (Application-Specific Integrated Circuit), or DSP (Digital Signal Processor) chips.

An arbitrary rotationally symmetric lens including a fisheye lens does not provide said panoramic images or distortion-free rectilinear images. Therefore, image processing stage is essential in order to obtain desirable images. FIG. 11 is a conceptual drawing of an uncorrected image plane(1134) prior to an image processing stage, which corresponds to the real image on the image sensor plane(1013). If the lateral dimension of the image sensor plane(1013) is B and the longitudinal dimension is V, then the lateral dimension of the uncorrected image plane is gB and the longitudinal dimension is gV, where g is proportionality constant.

Uncorrected image plane(1134) can be considered as an image displayed on an image display means without rectification of distortion, and is a magnified image of the real image on the image sensor plane by a magnification ratio g. For example, the image sensor plane of a ⅓-inch CCD sensor has a rectangular shape having a lateral dimension of 4.8 mm, and a longitudinal dimension of 3.6 mm. On the other hand, if the monitor is 48 cm in width and 36 cm in height, then the magnification ratio g is 100. More desirably, the side dimension of a pixel in digital image is considered as 1. A VGA-grade ⅓-inch CCD sensor has pixels in an array form with 640 columns and 480 rows. Therefore, each pixel has a right rectangular shape with both width and height measuring as 4.8 mm/640=7.5 μm, and in this case, the magnification ratio g is given by 1 pixel/7.5 μm=133.3 pixel/mm. In recapitulation, the uncorrected image plane(1134) is a distorted digital image obtained by converting the real image formed on the image sensor plane into electrical signals.

The first intersection point O on the image sensor plane is the intersection point between the optical axis and the image sensor plane. Therefore, a ray entered along the optical axis forms an image point on the said first intersection point O. By definition, the point O' on the uncorrected image plane corresponding to the first intersection point O on the image sensor plane—hereinafter referred to as the second intersection point—corresponds to an image point by an incident ray entered along the optical axis.

A second rectangular coordinate systems is assumed wherein x'-axis is taken as the axis that passes through the second intersection point O' on the uncorrected image plane and is parallel to the sides of the uncorrected image plane along the lateral direction, and y'-axis is taken as the axis that passes through the said second intersection point and is parallel to the sides of the uncorrected image plane along the longitudinal direction. The positive direction of the x'-axis runs from the left side to the right side, and the positive direction of the y'-axis runs from the top end to the bottom end. Then, the lateral coordinate x' of an arbitrary point on the uncorrected image plane(1134) has a minimum value $x'_1=gx_1$ and a maximum value $x'_2=gx_2$(i.e., $gx_1 \leq x' \leq gx_2$). In the same manner, the longitudinal coordinate y' of the said point has a minimum value $y'_1=gy_1$ and a maximum value $y'_2=gy_2$(i.e., $gy_1 \leq y' \leq gy_2$).

FIG. 12 is a conceptual drawing of a processed image plane(1235) of the image display means of the current invention, wherein the distortion has been removed. The processed image plane(1235) has a rectangular shape, of which the lateral side measuring as W and the longitudinal side measuring as H. Furthermore, a third rectangular coordinate system is assumed wherein x"-axis is parallel to the sides of the processed image plane along the lateral direction, and y"-axis is parallel to the sides of the processed image plane along the longitudinal direction. The z"-axis of the third rectangular coordinate system coincides with the z-axis of the first rectangular coordinate system and the z'-axis of the second rectangular coordinate system. The intersection point O" between the said z"-axis and the processed image plane—hereinafter referred to as the third intersection point—can take an arbitrary position, and it can even be located outside the processed image plane. Here, the positive direction of the x"-axis runs from the left side to the right side, and the positive direction of the y"-axis runs from the top end to the bottom end.

The first and the second intersection points correspond to the location of the optical axis. On the other hand, the third intersection point corresponds not to the location of the optical axis but to the principal direction of vision. The principal direction of vision may coincide with the optical axis, but it is not needed to. Principal direction of vision is the direction of the optical axis of an imaginary panoramic or rectilinear camera corresponding to the desired panoramic or rectilinear images. Hereinafter, for the sake of notational simplicity, the principal direction of vision is referred to as the optical axis direction.

The lateral coordinate x" of a third point P" on the processed image plane(1235) has a minimum value $x"_1$ and a maximum value $x"_2$(i.e., $x"_1 \leq x" \leq x"_2$). By definition, the difference between the maximum lateral coordinate and the minimum lateral coordinate is the lateral dimension of the processed image plane(i.e., $x"_2-x"_1=W$). In the same manner, the longitudinal coordinate y" of the third point P" has a minimum value $y"_1$ and a maximum value $y"_2$(i.e., $y"_1 \leq y" \leq y"_2$). By definition, the difference between the maximum longitudinal coordinate and the minimum longitudinal coordinate is the longitudinal dimension of the processed image plane(i.e., $y"_2-y"_1=H$).

The following table 1 summarizes corresponding variables in the object plane, the image sensor plane, the uncorrected image plane, and the processed image plane.

TABLE 1

| Surface | object plane | image sensor plane | uncorrected image plane | processed image plane |
|---|---|---|---|---|
| lateral dimension of the plane | B | gB | gB | W |
| longitudinal dimension of the plane | V | gV | gV | H |
| coordinate system | world coordinate system | the first rectangular coordinate system | the second rectangular coordinate system | the third rectangular coordinate system |
| location of the coordinate origin | nodal point of the lens | nodal point of the lens | nodal point of the lens | nodal point of the lens |
| symbol of the origin | | O | O' | O" |
| coordinate axes | (X, Y, Z) | (x, y, z) | (x', y', z') | (x", y", z") |
| name of the object point or the image point | object point | the first point | the second point | the third point |
| symbol of the object point or the image point | Q | P | P' | P" |
| two-dimensional coordinate of the object point or the image point | | (x, y) | (x', y') | (x", y") |

On the other hand, if we assume the coordinate of an image point P" on the processed image plane(1235) corresponding to an object point with a coordinate (X, Y, Z) in the world coordinate system is (x", y"), then the said image processing means process the uncorrected image plane so that an image point corresponding to an incident ray originating from the said object point appears on the said screen with the coordinate (x", y"), wherein the lateral coordinate x" of the image point is given by Eq. 11.

$$x"=c\psi \qquad \text{[Equation 11]}$$

Here, c is proportionality constant.

Furthermore, the longitudinal coordinate y" of the said image point is given by Eq. 12.

$$y"=cF(\mu) \qquad \text{[Equation 12]}$$

Here, $F(\mu)$ is a monotonically increasing function passing through the origin. In mathematical terminology, it means that Eq. 13 and Eq. 14 are satisfied.

$$F(0)=0 \qquad \text{[Equation 13]}$$

$$\frac{\partial F(\mu)}{\partial \mu} > 0 \qquad \text{[Equation 14]}$$

The above function $F(\mu)$ can take an arbitrary form, but the most desirable forms are given by Eq. 15 through Eq. 18.

$$F(\mu) = \tan\mu \qquad \text{[Equation 15]}$$

$$F(\mu) = \frac{\tan\mu}{\cos\chi} \qquad \text{[Equation 16]}$$

$$F(\mu) = \mu \qquad \text{[Equation 17]}$$

$$F(\mu) = \ln\left\{\tan\left(\frac{\mu}{2}+\frac{\pi}{4}\right)\right\} \qquad \text{[Equation 18]}$$

FIG. 13 is a schematic diagram for understanding the field of view (FOV) and the projection scheme of a panoramic imaging system according to an embodiment of a prior art. A panoramic imaging system of the current embodiment is assumed as attached on a vertical wall(1330), which is perpendicular to the ground plane. The wall coincides with the X-Y plane, and the Y-axis runs from the ground plane(i.e., X-Z plane) to the zenith. The origin of the coordinate system is located at the nodal point N of the lens, and the optical axis(1301) of the lens coincides with the Z-axis. In a rigorous sense, the direction of the optical axis is the direction of the negative Z-axis of the world coordinate system. This is because, by the notational convention of imaging optics, the direction from the object (or, an object point) to the image plane(or, an image point) is the positive direction. Despite this fact, we will describe the optical axis as coinciding with the Z-axis of the world coordinate system for the sake of simplicity in argument. The present invention is not an invention about designing a lens but an invention employing a lens, and in the viewpoint of a lens user, it makes easier to understand the optical axis as in the current embodiment of the present invention.

The image sensor plane(1313) is a plane having a rectangular shape and perpendicular to the optical axis, whereof the lateral dimension is B, and the longitudinal dimension is V. In the current embodiment, the X-axis of the world coordinate system is parallel to the x-axis of the first rectangular coordinate system, and points in the same direction. On the other hand, the Y-axis of the world coordinate system is parallel to the y-axis of the first rectangular coordinate system, but the direction of the Y-axis is the exact opposite of the direction of the y-axis. Therefore, in FIG. 13, the positive direction of the x-axis of the first rectangular coordinate system runs from the left to the right, and the positive direction of the y-axis runs from the top to the bottom.

The intersection point O between the z-axis of the first rectangular coordinate system and the sensor plane(1313)—in other words, the first intersection point—is not generally located at the center of the sensor plane(1313), and it can even be located outside the sensor plane. Such a case can happen when the center of the image sensor is moved away from the center position of the lens—i.e., the optical axis—on purpose in order to obtain an asymmetrical vertical or horizontal field of view.

A panoramic camera with a cylindrical projection scheme follows a rectilinear projection scheme in the vertical direction, and an equidistance projection scheme in the horizontal direction. Such a projection scheme corresponds to assuming a hemi-cylindrical object plane(1331) with a radius S and having the Y-axis as the rotational symmetry axis. The image of an arbitrary point Q on the object plane(1331)—hereinafter referred to as an object point—appears as an image point P on the said sensor plane(1213). According to the desirable projection scheme of the current embodiment, the image of an object on the hemi-cylindrical object plane(1331) is captured on the sensor plane(1313) with its vertical proportions preserved, and the lateral coordinate x of the image point is proportional to the horizontal arc length of the corresponding object point on the said object plane. The image points on the image sensor plane by all the object points on the object plane(1331) collectively form a real image.

FIG. 14 shows the cross-sectional view of the object plane in FIG. 13 in X-Z plane, and FIG. 15 shows the cross-sectional view of the object plane in FIG. 13 in Y-Z plane. From FIG. 13 through FIG. 15, the following Eq. 19 can be obtained.

$$A = \frac{H}{\tan\delta_2 - \tan\delta_1} = \frac{y''}{\tan\delta} = \frac{y''_2}{\tan\delta_2} = \frac{y''_1}{\tan\delta_1} = \frac{W}{\Delta\psi} = \frac{x''}{\psi} = \frac{x''_1}{\psi_1} = \frac{x''_2}{\psi_2}$$ [Equation 19]

Therefore, when setting-up the size and the FOV of a desirable processed image plane, it must be ensured that Eq. 19 is satisfied.

If the processed image plane in FIG. 12 satisfies the said projection scheme, then the horizontal incidence angle of an incident ray corresponding to a lateral coordinate x'' of a third point P''' on the said processed image plane is given by Eq. 20.

$$\psi = \frac{\Delta\psi}{W}x'' = \frac{x''}{A}$$ [Equation 20]

Likewise, the vertical incidence angle of an incident ray corresponding to the third point having a longitudinal coordinate y'' is, from Eq. 19, given as Eq. 21.

$$\delta = \tan^{-1}\left(\frac{y''}{A}\right)$$ [Equation 21]

Therefore, the signal value of a third point on the processed image plane having an ideal projection scheme must be given as the signal value of an image point on the image sensor plane formed by an incident ray originating from an object point on the object plane having a horizontal incidence angle (i.e., the longitude) given by Eq. 20 and a vertical incidence angle (i.e., the latitude) given by Eq. 21.

According to a prior art, a panoramic image having an ideal projection scheme can be obtained as follows from a fisheye image having a distortion. First, according to the user's need, the size (W, H) of the panoramic image and the location of the third intersection point O''' are determined. The said third intersection point can be located outside the said processed image plane. In other words, the range $(x''_1, x''_2)$ of the lateral coordinate and the range $(y''_1, y''_2)$ of the longitudinal coordinate on the processed image plane can take arbitrary real numbers. Also, the horizontal field of view $\Delta\psi$ of this panoramic image (in other words, the processed image plane) is determined. Then, the horizontal incidence angle γ and the vertical incidence angle δ of an incident ray corresponding to the rectangular coordinate (x'', y'') of a third point on the panoramic image can be obtained using Eq. 20 and Eq. 21. Next, the zenith angle θ and the azimuth angle φ of an incident ray corresponding to these horizontal and vertical incidence angles are obtained using Eq. 22 and Eq. 23.

$$\phi = \tan^{-1}\left(\frac{\tan\delta}{\sin\psi}\right)$$ [Equation 22]

$$\theta = \cos^{-1}(\cos\delta\cos\psi)$$ [Equation 23]

Next, the image height r corresponding to the zenith angle θ of the incident ray is obtained using Eq. 6. Then, using this image height r, the magnification ratio g and the azimuth angle φ of the incident ray, the two-dimensional rectangular coordinate (x', y') of the image point on the uncorrected image plane can be obtained as in Eq. 24 and Eq. 25.

$$x' = gr(\theta)\cos\phi$$ [Equation 24]

$$y' = gr(\theta)\sin\phi$$ [Equation 25]

In this procedure, the coordinate of the second intersection point on the uncorrected image plane, or equivalently the coordinate of the first intersection point on the image sensor plane, has to be accurately determined. Such a location of the intersection point can be easily found using various methods including image processing method. Since such techniques are well known to the people in this field, they will not be described in this document. Finally, the video signal (i.e., RGB signal) value of an image point by the fisheye lens having this rectangular coordinate is substituted as the video signal value for an image point on the panoramic image having a rectangular coordinate (x", y"). A panoramic image having an ideal projection scheme can be obtained by image processing for all the image points on the processed image plane by the above-described method.

However, in reality, a complication arises due to the fact that all the image sensors and display devices are digital devices. Processed image plane has pixels in the form of a two-dimensional array having $J_{max}$ columns in the lateral direction and $I_{max}$ lows in the longitudinal direction. Although, in general, each pixel has a square shape with both the lateral dimension and the longitudinal dimension measuring as p, the lateral and the longitudinal dimensions of a pixel are considered as 1 in the image processing field. To designate a particular pixel P''', the low number I and the column number J are used.

There is an image point—i.e., the first point—on the image sensor plane corresponding to a pixel P''' on the said processed image plane. The horizontal incidence angle of an incident ray in the world coordinate system forming an image at this first point can be written as $\psi_{I,J}=\psi(I, J)$. Also, the vertical incidence angle can be written as $\delta_{I,J}=\delta(I, J)$. Incidentally, the location of this first point does not generally coincide with the exact location of any one pixel.

Here, if the said processed image plane is a panoramic image, then as given by Eq. 26, the horizontal incidence angle must be a sole function of the lateral pixel coordinates J.

$$\psi_{I,J}=\psi_J=\psi(J) \quad \text{[Equation 26]}$$

Likewise, the vertical incidence angle must be a sole function of the longitudinal pixel coordinates I.

$$\delta_{I,J}=\delta_I=\delta(I) \quad \text{[Equation 27]}$$

Compared with the previous image processing methods, image processing methods for digitized images must follow the following set of procedures. First, the real projection scheme of the wide-angle lens that is meant to be used for image acquisition is obtained either by experiment or based on an accurate lens design prescription. Herein, when an incident ray having a zenith angle θ with respect to the optical axis forms a sharp image point on the image sensor plane by the image forming properties of the lens, the real projection scheme of the lens refers to the distance r from the intersection point O between the said image sensor plane and the optical axis to the said image point obtained as a function of the zenith angle θ of the incident ray.

$$r=r(\theta) \quad \text{[Equation 28]}$$

Said function is a monotonically increasing function of the zenith angle θ. Next, the location of the optical axis on the uncorrected image plane, in other words, the location of the second intersection point O' on the uncorrected image plane corresponding to the first intersection point O on the image sensor plane is obtained. The pixel coordinate of this second intersection point is assumed as $(K_o, L_o)$. In addition to this, the magnification ratio g of the pixel distance r' on the uncorrected image plane over the real image height r on the image sensor plane is obtained. This magnification ratio g is given by Eq. 29.

$$g = \frac{r'}{r} \quad \text{[Equation 29]}$$

Once such a series of preparatory stages have been completed, then a camera mounted with the said fisheye lens is installed with its optical axis aligned parallel to the ground plane, and a raw image(i.e., an uncorrected image plane) is acquired. Next, a desirable size of the processed image plane and the location $(I_o, J_o)$ of the third intersection point is determined, and then the horizontal incidence angle $\psi_J$ given by Eq. 30 and the vertical incidence angle $\delta_I$ given by Eq. 31 are computed for all the pixels (I, J) on the said processed image plane.

$$\psi_J = \frac{\psi_{Jmax} - \psi_1}{J_{max} - 1}(J - J_o) \quad \text{[Equation 30]}$$

$$\delta_I = \tan^{-1}\left\{\frac{\psi_{Jmax} - \psi_1}{J_{max} - 1}(I - I_o)\right\} \quad \text{[Equation 31]}$$

From these horizontal and vertical incidence angles, the zenith angle $\theta_{I,J}$ and the azimuth angle $\phi_{I,J}$ of the incident ray in the first rectangular coordinate system are obtained using Eq. 32 and Eq. 33.

$$\theta_{I,J} = \cos^{-1}(\cos\delta_I \cos\psi_J) \quad \text{[Equation 32]}$$

$$\phi_{I,J} = \tan^{-1}\left(\frac{\tan\delta_I}{\sin\psi_J}\right) \quad \text{[Equation 33]}$$

Next, the image height $r_{I,J}$ on the image sensor plane is obtained using Eq. 34 and Eq. 28.

$$r_{I,J}=r(\theta_{I,J}) \quad \text{[Equation 34]}$$

Next, using the location $(K_o, L_o)$ of the second intersection point on the uncorrected image plane and the magnification ratio g, the location of the second point on the uncorrected image plane is obtained using Eq. 35 and Eq. 36.

$$x'_{I,J}=L_o+gr_{I,J}\cos\phi_{I,J} \quad \text{[Equation 35]}$$

$$y'_{I,J}=K_o+gr_{I,J}\sin\phi_{I,J} \quad \text{[Equation 36]}$$

The location of the said second point does not exactly coincide with the location of any one pixel. Therefore, $(x'_{I,J}, x'_{I,J})$ can be considered as the coordinate of a virtual pixel on the uncorrected image plane corresponding to the third point on the processed image plane, and they are real numbers in general.

Since the said second point does not coincide with any one pixel, an appropriate interpolation method must be used for image processing. FIG. 16 is a panoramic image following a cylindrical projection scheme that has been extracted from the image in FIG. 5, of which the lateral and the longitudinal dimensions are both 250 pixels, and the third intersection point is located at the center of the processed image plane. Furthermore, the horizontal FOV of the processed image plane is 180° (i.e., π). As can be seen from FIG. 16, all the vertical lines in the three walls, namely the front, the left, and the right walls in FIG. 5 appear as straight lines in FIG. 16.

On the other hand, FIG. 17 is an exemplary image of an interior scene, which has been acquired by aligning the optical axis of a fisheye lens with 190° FOV described in references 5 and 6 parallel to the ground plane. The real projection scheme of this fisheye lens is described in detail in the said references. On the other hand, FIG. 18 is a panoramic image having a cylindrical projection scheme extracted from the fisheye image in FIG. 17. Here, the width:height ratio of the processed image plane is 16:9, the position of the third intersection point coincides with the center of the processed image plane, and the horizontal FOV is set as 190°. As can be seen from FIG. 18, all the vertical lines are captured as vertical lines and all the objects appear natural. Slight errors are due to the error in aligning the optical axis parallel to the ground plane, and the error in experimentally determining the position of the optical axis on the uncorrected image plane.

Inventions in reference 8 provide mathematically accurate image processing algorithms for extracting panoramic images and devices implementing the algorithms. In many cases, however, distortion-free rectilinear images can be more valuable. Or, it can be more satisfactory when panoramic images and rectilinear images are both available. FIG. 19 is a conceptual drawing illustrating the rectilinear projection scheme of a prior art described in reference 9. A lens with a rectilinear projection scheme is a so-called distortion-free lens, and the characteristics of a rectilinear lens are considered identical to those of a pinhole camera. To acquire an image with such a rectilinear projection scheme, we assume an object plane(1931) and a processed image plane(1935) in the world coordinate system as schematically shown in FIG. 19.

The imaging system in this embodiment is heading in an arbitrary direction, and the third rectangular coordinate system takes the optical axis(1901) of the imaging system as the negative z"-axis, and the nodal point of the lens as the origin. Image sensor plane has a rectangular shape with a lateral width B and a longitudinal height V, and the image sensor plane is a plane perpendicular to the optical axis. On the other hand, the processed image plane has a rectangular shape with a lateral width W and a longitudinal height H. The x-axis of the first rectangular coordinate system, the x'-axis of the second rectangular coordinate system, the x"-axis of the third rectangular coordinate system and the X-axis of the world coordinate system are all parallel to the sides of the image sensor plane along the lateral direction. Furthermore, the z-axis of the first rectangular coordinate system, the z'-axis of the second rectangular coordinate system, and the z"-axis of the third rectangular coordinate systems are all identical to each other and are heading to the exact opposite direction to the Z-axis of the world coordinate system.

In this embodiment, the processed image plane is assumed to be located at a distance s" from the nodal point of the lens. In a rectilinear projection scheme, the shape of the object plane(1931) is also a plane perpendicular to the optical axis, and the image of objects on the object plane is faithfully reproduced on the processed image plane(1935) with both the lateral and the longitudinal scales preserved. The ideal projection scheme of a rectilinear lens is identical to the projection scheme of a pinhole camera. Considering the simple geometrical characteristics of a pinhole camera, it is convenient to assume that the shape and the size of the object plane(1931) are identical to those of the processed image plane. Therefore, the distance from the object plane(1931) to the nodal point N of the lens is also assumed as s".

FIG. 20 illustrates the case where the intersection point O between the image sensor plane and the optical axis, or equivalently the third intersection point O" on the processed image plane corresponding to the first intersection point O does not coincide with the center C" of the processed image plane(2043). Therefore, it corresponds to an imaging system with a slide operation as has been described in an embodiment of the prior art. In two-dimensional rectangular coordinate system having the third intersection point as the origin, the coordinate of the said center C" is given as ($x''_c$, $y''_c$). Since the lateral dimension of the processed image plane is W, the lateral coordinate with respect to the center C" has a minimum value $x''_1 = -W/2$ and a maximum value $x''_2 = W/2$. Considering the coordinate of the center C" on top of this, the range of the lateral coordinate of the processed image plane has a minimum value $x''_1 = x''_c - W/2$ and a maximum value $x''_2 = x''_c + W/2$. Likewise, the range of the longitudinal coordinate has a minimum value $y''_1 = y''_c - H/2$ and a maximum value $y''_2 = y''_c + H/2$.

The distance between the third intersection point O" on the processed image plane to the third point P", in other words, the image height r" is given by Eq. 37.

$$r'' = \sqrt{(x'')^2 + (y'')^2} \qquad \text{[Equation 37]}$$

Since the virtual distance from the nodal point of the lens to the processed image plane is s", an incident ray arriving at the third point by the rectilinear lens has a zenith angle given by Eq. 38.

$$\theta = \tan^{-1}\left(\frac{r''}{s''}\right) \qquad \text{[Equation 38]}$$

On the other hand, the azimuth angle of the said incident ray is given by Eq. 39.

$$\phi = \phi'' = \tan^{-1}\left(\frac{y''}{x''}\right) \qquad \text{[Equation 39]}$$

Therefore, when an incident ray having the said zenith angle and the azimuth angle forms an image point on the image sensor plane by the image forming properties of the lens, the coordinate of the image point is given by Eq. 40 and Eq. 41.

$$x' = gr(\theta)\cos\phi \qquad \text{[Equation 40]}$$

$$y' = gr(\theta)\sin\phi \qquad \text{[Equation 41]}$$

Therefore, it is only necessary to substitute the signal value of the third point on the processed image plane by the signal value of the image point on the uncorrected image plane having such rectangular coordinate.

Similar to the embodiment of a prior art previously described, considering the facts that all the image sensors and the display devices are digital devices, it is convenient to use the following set of equations in image processing procedure. First of all, the size ($I_{max}$, $J_{max}$) of the processed image plane and the horizontal FOV $\Delta\psi$ prior to any slide operation are determined. Then, the pixel distance s" between the nodal point of the lens and the processed image plane can be obtained using Eq. 42.

$$s'' = \frac{J_{max} - 1}{2\tan\left(\frac{\Delta\psi}{2}\right)} \qquad \text{[Equation 42]}$$

Furthermore, the center coordinate of the processed image plane is given by Eq. 43.

$$(I_o, J_o) = \left(\frac{1 + I_{max}}{2}, \frac{1 + J_{max}}{2}\right) \quad \text{[Equation 43]}$$

Here, Eq. 43 reflects the convention that the coordinate of the pixel on the upper left corner of a digital image is designated as (1, 1).

Next, according to the needs, the displacement (ΔI, ΔJ) of the said center from the third intersection point is determined. Once such preparatory stages have been finished, the zenith angle given in Eq. 44 and the azimuth angle given in Eq. 45 are calculated for every pixel on the processed image plane.

$$\theta_{I,J} = \tan^{-1}\left\{\frac{\sqrt{(I - I_o + \Delta I)^2 + (J - J_o + \Delta J)^2}}{s''}\right\} \quad \text{[Equation 44]}$$

$$\phi_{I,J} = \tan^{-1}\left(\frac{I - I_o + \Delta I}{J - J_o + \Delta J}\right) \quad \text{[Equation 45]}$$

Next, the image height $r_{I,J}$ on the image sensor plane is calculated using Eq. 46.

$$r_{I,J} = r(\theta_{I,J}) \quad \text{[Equation 46]}$$

Next, the position of the second point on the uncorrected image plane is calculated using the position $(K_o, L_o)$ of the second intersection point on the uncorrected image plane and the magnification ratio g.

$$x'_{I,J} = L_o + g r_{I,J} \cos(\phi_{I,J}) \quad \text{[Equation 47]}$$

$$y'_{I,J} = K_o + g r_{I,J} \sin(\phi_{I,J}) \quad \text{[Equation 48]}$$

Once the position of the corresponding second point has been found, the rectilinear image can be obtained using the previously described interpolation methods.

FIG. 21 is a rectilinear image extracted from the fisheye image given in FIG. 5, of which the lateral and the longitudinal dimensions are both 250 pixels, and there is no slide operation. As can be seen from FIG. 21, all the straight lines are captured as straight lines. On the other hand, FIG. 22 is a rectilinear image extracted from FIG. 17 with the width: height ratio of 4:3. The position of the third intersection point coincides with the center of the processed image plane, and the horizontal FOV is 60°. Here, it can be seen that all the straight lines in the world coordinate system are captured as straight lines in the processed image plane.

Panoramic imaging system in reference 8 requires a direction sensing means in order to provide natural-looking panoramic images at all times irrespective of the inclination of the device having the imaging system with respect to the ground plane. However, it may happen that additional installation of a direction sensing means may be difficult in terms of cost, weight, or volume for some devices such as motorcycle or unmanned aerial vehicle. FIG. 23 is a conceptual drawing illustrating the definition of a multiple viewpoint panoramic image that can be advantageously used in such cases.

An imaging system providing multiple viewpoint panoramic images is comprised of an image acquisition means for acquiring an uncorrected image plane which is equipped with a wide-angle lens rotationally symmetric about an optical axis, an image processing means for producing a processed image plane from the uncorrected image plane, and an image display means for displaying the processed image plane on a screen with a rectangular shape.

The processed image plane in FIG. 23 is composed of three sub rectilinear image planes, namely, the $1^{st}$ sub rectilinear image plane(2331-1), the $2^{nd}$ sub rectilinear image plane (2331-2) and the $3^{rd}$ sub rectilinear image plane(2331-3). The $1^{st}$ through the $3^{rd}$ sub rectilinear image planes are laid out horizontally on the processed image plane. More generally, the said processed image plane is a multiple viewpoint panoramic image, wherein the said multiple viewpoint panoramic image is comprised of the $1^{st}$ through the $n^{th}$ sub rectilinear image planes laid out horizontally on the said screen, n is a natural number larger than 2, an arbitrary straight line in the world coordinate system having the nodal point of the wide-angle lens as the origin appears as a straight line(2381A) on any of the $1^{st}$ through the $n^{th}$ sub rectilinear image plane, and any straight line in the world coordinate system appearing on more than two adjacent sub rectilinear image planes appears as a connected line segments(2381B-1, 2381B-2, 2381B-3).

FIG. 24 is a conceptual drawing of an object plane providing a multiple viewpoint panoramic image. Object plane of the current embodiment has a structure where more than two planar sub object planes are joined together. Although FIG. 24 is illustrated as a case where three sub object planes, namely 2431-1, 2431-2 and 2431-3 are used, a more general case of using n sub object planes can be easily understood as well. In order to easily understand the current embodiment, a sphere with a radius T centered at the nodal point N of the lens is assumed. If a folding screen is set-up around the sphere while keeping the folding screen to touch the sphere, then this folding screen corresponds to the object plane of the current embodiment. Therefore, the n sub object planes are all at the same distance T from the nodal point of the lens. As a consequence, all the sub object planes have an identical zoom ratio or a magnification ratio.

In FIG. 24 using three sub object planes, the principal direction of vision(2401-1) of the $1^{st}$ sub object plane(2431-1) makes an angle of $\psi_{1-2}$ with the principal direction of vision(2401-2) of the $2^{nd}$ sub object plane(2431-2), and the principal direction of vision(2401-3) of the $3^{rd}$ sub object plane(2431-3) makes an angle of $\psi_{3-4}$ with the principal direction of vision(2401-2) of the $2^{nd}$ sub object plane(2431-2). The range of the horizontal FOV of the $1^{st}$ sub object plane is from a minimum value $\psi_1$ to a maximum value $\psi_2$, and the range of the horizontal FOV of the $2^{nd}$ sub object plane is from a minimum value $\psi_2$ to a maximum value $\psi_3$. By having the horizontal FOVs of adjacent sub object planes be seamlessly continued, a natural looking multiple viewpoint panoramic image can be obtained. The $1^{st}$ sub object plane and the $3^{rd}$ object plane are obtained by panning the $2^{nd}$ sub object plane by appropriate angles.

FIG. 25 is another example of a fisheye image, and it shows the effect of installing a fisheye lens with 190° FOV on the ceiling of an interior. On the other hand, FIG. 26 is a multiple viewpoint panoramic image extracted from FIG. 25. Each sub object plane has a horizontal FOV of 190°/3. From FIG. 26, it can be seen that such an imaging system will be useful as an indoor security camera.

FIG. 27 is a schematic diagram of an imaging system embodying the conception of the present invention and the invention of prior arts, and it is comprised of an image acquisition means(2710), an image processing means(2716), and an image display means(2717). The image processing means (2716) of the present invention has an input frame buffer (2771) storing one frame of image acquired from the image acquisition means(2710). The input frame buffer(2771)

stores a digital image acquired from the image acquisition means(2710) in the form of a two-dimensional array. This image is the uncorrected image plane. On the other hand, the output frame buffer(2773) stores an output signal in the form of a two-dimensional array, which corresponds to a processed image plane(2735) that can be displayed on the image display means(2717). A central processing unit(2775) further exists, which generates a processed image plane from the uncorrected image plane existing in the input frame buffer and stores the processed image plane in the output frame buffer. The mapping relation between the output frame buffer and the input frame buffer is stored in a non-volatile memory(2779) such as a SDRAM in the form of a lookup table (LUT). In other words, using the algorithms from the embodiments of the current invention, a long list of pixel addresses for the input frame buffer corresponding to particular pixels in the output frame buffer is generated and stored. Central processing unit(2775) refers to this list stored in the nonvolatile memory in order to process the image.

On the other hand, an image selection device(2777) receives signals coming from various sensors and image selection means and sends them to the central processing unit. Also, by recognizing the button pressed by the user, the image selection device can dictate whether the original distorted fisheye image is displayed without any processing, or a panoramic image with a cylindrical or a Mercator projection scheme is displayed, or a rectilinear image is displayed. Said nonvolatile memory stores a number of list corresponding to the number of possible options a user can choose.

In these various cases, the wide-angle lens rotationally symmetric about an axis that is mounted on the said image acquisition means can be a refractive fisheye lens with a FOV larger than 180°, but sometimes a catadioptric fisheye lens may be needed. For the projection scheme, equidistance projection scheme can be used, but stereographic projection scheme can be used, also. Although, fisheye lenses with stereographic projection schemes are preferable in many aspects in general, fisheye lenses with stereographic projection schemes are much harder both in design and in manufacturing. Therefore, fisheye lenses with equidistance projection schemes can be realistic alternatives.

Depending on the application areas, the image display means(2717) can be a computer screen, a CCTV monitor, a CRT monitor, a digital television, an LCD projector, a network monitor, the display screen of a cellular phone, a navigation module for an automobile, and other various devices.

Such imaging systems have two drawbacks. Firstly, since image processing means needs additional components such as DSP chip or SDRAM, the manufacturing cost of the imaging system is increased. Secondly, image processing takes more than several tens of milliseconds, and a time gap exist between the image displayed on the image display means and the current state of the actual objects. Several tens of milliseconds is not a long time, but it can correspond to several meters for an automobile driving at a high speed. Therefore, application areas exist where even such a short time gap is not allowed. The gap will be greater in other application areas such as airplanes and missiles.

Reference 10 discloses a technical conception for providing panoramic images without image processing by deliberately matching the pixel locations within an image sensor to desired panoramic images. Shown in FIG. 28 is a schematic diagram of a general catadioptric panoramic imaging system. As schematically shown in FIG. 28, a catadioptric panoramic imaging system of prior arts includes as constituent elements a rotationally symmetric panoramic mirror(2811), of which the cross-sectional profile is close to an hyperbola, a lens (2812) that is located on the rotational-symmetry axis(2801) of the mirror(2811) and oriented toward the said mirror (2811), and a camera body(2814) having an image sensor (2813) inside. Then, an incident ray(2805) having a zenith angle θ, which originates from every 360° directions around the mirror and propagates toward the rotational-symmetry axis(2801), is reflected at a point M on the mirror surface (2811), and captured by the image sensor(2813). The image height is given as r=r(θ).

FIG. 29 is a conceptual drawing of an exemplary rural landscape obtainable using the catadioptric panoramic imaging system of prior art schematically shown in FIG. 28. As illustrated in FIG. 29, a photographic film or an image sensor (2813) has a square or a rectangular shape, while a panoramic image obtained using a panoramic imaging system has an annular shape. Non-hatched region in FIG. 29 constitutes a panoramic image, and the hatched circle in the center corresponds to the area at the backside of the camera, which is not captured because the camera body occludes its view. An image of the camera itself reflected by the mirror(2811) lies within this circle. On the other hand, the hatched regions at the four corners originate from the fact that the diagonal field of view of the camera lens(2812) is larger than the field of view of the panoramic mirror(2811). The image of the scene in front of the camera that is observable in absence of the panoramic mirror lies in these regions. FIG. 30 is an exemplary unwrapped panoramic image obtained from the ring-shaped panoramic image in FIG. 29 by cutting along the cutting-line and converting into a perspectively normal view using image processing software.

FIG. 31 shows geometrical relations necessary to transform the ring-shaped panoramic image illustrated in FIG. 29 into a perspectively normal unwrapped panoramic image shown in FIG. 30. Origin O of the rectangular coordinate system lies at the center of the image sensor plane(3113), the x-coordinate increases from the left side of the image sensor plane to the right side of the image sensor plane, and the y-coordinate increases from the top end of the image sensor plane to the bottom end of the image sensor plane. Image plane(3133) on the image sensor plane(3113) has a ring shape defined by a concentric inner rim(3133a) and an outer rim (3133b). The radius of the inner rim(3133a) is $r_1$ and the radius of the outer rim(3133b) is $r_2$. The center coordinate of the panoramic image plane(3133) in a rectangular coordinate system is (0, 0), and the coordinate of a point P on the panoramic image plane defined by the inner rim(3133a) and the outer rim(3133b) is given as (x, y). On the other hand, the coordinate of the said point P in a polar coordinate is given as (r, θ). Variables in the rectangular coordinate system and the polar coordinate system satisfy simple geometrical relations given in Eq. 49 through Eq. 52. Using these relations, variables in the two coordinate systems can be readily transformed into each other.

$$x = r\cos\phi \qquad \text{[Equation 49]}$$

$$y = r\sin\phi \qquad \text{[Equation 50]}$$

$$r = \sqrt{x^2 + y^2} \qquad \text{[Equation 51]}$$

$$\phi = \tan^{-1}\left(\frac{y}{x}\right) \qquad \text{[Equation 52]}$$

Here, the lateral coordinate on the unwrapped panoramic image is proportional to the azimuth angle φ, and the longitudinal coordinate is proportional to radius r.

As described previously, reference 10 discloses a CMOS image sensor which does not require image processing in order to transform ring-shaped panoramic image into a rectangular unwrapped panoramic image.

As schematically shown in FIG. 32, ordinary CMOS image sensor plane(3213) is comprised of multitude of pixels(3281) arranged in a matrix form, a vertical shift register(3285), and a horizontal shift register(3284). Each pixel(3281) is comprised of a photodiode(3282) converting the received light into electrical charges proportional to its light intensity, and a photoelectrical amplifier(3283) converting the electrical charges (i.e., the number of electrons) into an electrical voltage. The light captured by a pixel is converted into an electrical voltage at the pixel level, and outputted into a signal line by the vertical and the horizontal shift registers. Here, the vertical shift register can selectively choose among the pixels belonging to different rows, and the horizontal shift register can selectively choose among the pixels belonging to different columns. A CMOS image sensor having such a structure operates in a single low voltage, and consumes less electrical power.

A photoelectrical amplifier(3283) existing in each pixel (3281) occupies a certain area which does not contribute to light capturing. The ratio of the light receiving area (i.e., the photodiode) over the pixel area is called the Fill Factor, and if the Fill Factor is large, then the light detection efficiency is high.

A CMOS image sensor having such structural characteristics has a higher level of freedom in design and pixel arrangement compared to a CCD image sensor. FIG. 33 is a floor plan showing pixel arrangement in a CMOS image sensor for panoramic imaging system according to an embodiment of the invention of a prior art. The CMOS image sensor has an imaging plane(3313) whereon pixels(3381) are arranged. Although pixels(3381) in FIG. 33 have been represented as dots, these dots are merely the center positions representing the positions of the pixels, and actual pixels(3381) occupy finite areas around the said dots. Each pixel(3381) is positioned on intersections between M radial lines(3305) having a position O on the image sensor plane as a starting point and N concentric circles(3306) having the said one point O as the common center. M and N are both natural numbers, and the radius $r_n$ of the $n^{th}$ concentric circle from the center position O is given by Eq. 53.

$$r_n = \frac{n-1}{N-1}(r_N - r_1) + r_1 \qquad \text{[Equation 53]}$$

In Eq. 53, n is a natural number ranging from 1 to N, $r_1$ is the radius of the first concentric circle from the center position O, and $r_n$ is the radius of the $n^{th}$ concentric circle from the center position O. All the M radial lines maintain an identical angular distance. In other words, pixels on a given concentric circle are positioned along the perimeter of the concentric circle maintaining an identical interval. Furthermore, by Eq. 53, each pixel is positioned along a radial line maintaining an identical interval.

Considering the characteristics of panoramic images, it is better if the image sensor plane(3313) has a square shape. Preferably, each side of an image sensor plane(3313) is not smaller than $2r_N$, and the center O of the concentric circles is located at the center of the image sensor plane(3313).

A CMOS image sensor for panoramic imaging system illustrated in FIG. 33 have pixels(3381) arranged at regular interval along the perimeters of concentric circles(3306), wherein the concentric circles have a regular interval along the radial direction, in turn. Although not schematically illustrated in FIG. 33, such a CMOS image sensor further has a radial shift register or r-register and a circumferential shift register or θ-register. Pixels belonging to different concentric circles can be selected using the radial shift register, and pixels belonging to different radial lines on a concentric circle can be selected using the circumferential shift register.

Every pixel on the previously described CMOS image sensor according to an embodiment of the invention of a prior art has a photodiode with an identical size. On the other hand, pixel's illuminance decreases from the center of the CMOS image sensor plane(3313) toward the boundary according to the well-known cosine fourth law. Cosine fourth law becomes an important factor when an exposure time has to be determined for a camera lens with a wide field-of-view, or the image brightness ratio between the pixel located at the center of the image sensor plane and the pixel at the boundary has to be determined. FIG. 34 shows the structure of a CMOS image sensor for panoramic imaging system for resolving the illuminance difference between the center and the boundary of an image sensor plane according to another embodiment of the invention of a prior art. Identical to the embodiment previously described, each pixel is positioned at a regular interval on radial lines, wherein the radial lines in turn have an identical angular distance on a CMOS image sensor plane(3413). In other words, each pixel is positioned along the perimeter of a concentric circle at a regular interval, and the concentric circles on the image sensor plane have an identical interval along the radial lines. Although pixels in FIG. 34 have been represented as dots, these dots merely represent the center positions of pixels, and actual pixels occupy finite areas around these dots.

Since all the pixels on the image sensor plane have an identical angular distance along the perimeter, the maximum area on the image sensor plane which a particular pixel can occupy increases proportionally to the radius. In other words, a pixel(3430$j$) existing on a circle on the image sensor plane with a radius $r_j$ can occupy a larger area than a pixel(3430$i$) existing on a circle with a radius $r_i$ (wherein, $r_i < r_j$). Since pixels located far from the center of the image sensor plane can occupy large areas than pixels located near the center, if each pixel's photoelectrical amplifier is identical in size, then pixels near the boundary of the image sensor plane far from the center can have relatively larger photodiodes. By having a larger light receiving area, the fill factor can be increased, and the decrease in illuminance by the cosine fourth law can be compensated. In this case, the size of the photodiode can be proportional to the radius of the concentric circle.

On the other hand, reference 11 discloses a structure of a CMOS image sensor for compensating the lens brightness decreasing as it moves away from the optical axis by making the photodiode area becomes larger as it moves away from the optical axis.

[reference 1] J. F. Blinn and M. E. Newell, "Texture and reflection in computer generated images", Communications of the ACM, 19, 542-547 (1976).

[reference 2] N. Greene, "Environment mapping and other applications of world projections", IEEE Computer Graphics and Applications, 6, 21-29 (1986).

[reference 3] E. W. Weisstein, "Cylindrical Projection", http://mathworld.wolfram.com/CylindricalProjection.html.

[reference 4] W. D. G. Cox, "An introduction to the theory of perspective—part 1", The British Journal of Photography, 4, 628-634 (1969).

[reference 5] G. Kweon and M. Laikin, "Fisheye lens", Korean patent 10-0888922, date of patent Mar. 10, 2009.

[reference 6] G. Kweon, Y. Choi, and M. Laikin, "Fisheye lens for image processing applications", J. of the Optical Society of Korea, 12, 79-87 (2008).

[reference 7] G. Kweon and M. Laikin, "Wide-angle lenses", Korean patent 10-0826571, date of patent Apr. 24, 2008.

[reference 8] G. Kweon, "Methods of obtaining panoramic images using rotationally symmetric wide-angle lenses and devices thereof", Korean patent 10-0882011, date of patent Jan. 29, 2009.

[reference 9] G. Kweon, "Method and apparatus for obtaining panoramic and rectilinear images using rotationally symmetric wide-angle lens", Korean patent 10-0898824, date of patent May 14, 2009.

[reference 10] G. Kweon, "CMOS image sensor and panoramic imaging system having the same", Korean patent 10-0624051, date of patent Sep. 7, 2006.

[reference 11] A. Silverstein, "Method, apparatus, and system providing a rectilinear pixel grid with radially scaled pixels", international application number PCT/US2008/060185, date of international application Apr. 14, 2008.

DISCLOSURE

Technical Problem

The purpose of the present invention is to provide image processing algorithms and imaging systems for extracting industrially useful complex images from digitized images acquired using a camera equipped with a wide-angle lens that is rotationally symmetric about an optical axis and hard-wired CMOS image sensors that can be used in imaging systems which do not require software image processing in order to provide such images.

Technical Solution

The present invention provides image processing algorithms that are accurate in principle based on the geometrical optics principle regarding image formation by wide-angle lenses with distortion and mathematical definitions of industrially useful images, and this invention also provide CMOS image sensors which physically implement such algorithms.

Advantageous Effects

Since image processing is executed within the CMOS image sensor by means of the physical structure, there is no delay of video signal, and panoramic or wide-angle imaging systems can be realized with considerably lower costs compared to imaging systems relying on software image processing.

MODE FOR INVENTION

Referring to FIG. 35 through FIG. 68, the preferable embodiments of the present invention will be described in detail.

First Embodiment

Figure 35:
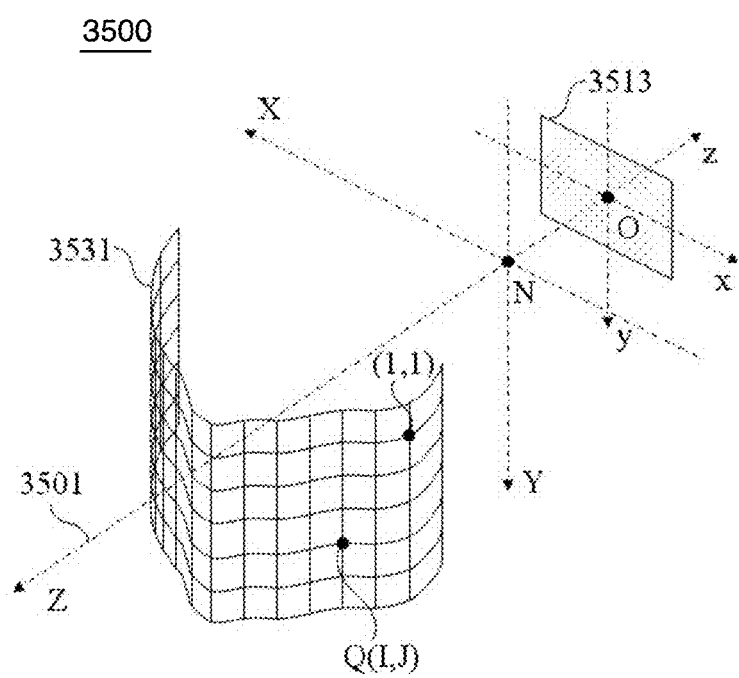
FIG. 35 is a conceptual diagram of an object plane according to the first embodiment of the current invention.

FIG. 35 is a conceptual diagram of an object plane(3531) having a shape of a generalized cylinder according to the first embodiment of the current invention. Such an imaginary object plane can be easily understood by assuming that it can be easily bended or folded but it cannot be stretched or shrunken. On the other hand, if this object plane is not bended or folded, then the shape of the object plane is identical to that of the processed image plane. In other words, when an object plane is flattened out, this object plane becomes identical to a processed image plane.

As has been previously described, an object plane exists in the world coordinate system in an arbitrarily bended or folded state. The three coordinates in the world coordinate system describing an imaginary object point Q on an object plane are given as X, Y, Z, and there are minor differences with the world coordinate system described in references 8 or 9. In other words, the origin of the world coordinate system of the current invention lies at the nodal point N of a wide-angle lens, the Z-axis coincides with the optical axis(3501) of the wide-angle lens, and the Y-axis passes through the said origin and is parallel to the sides of the image sensor plane within the camera body along the longitudinal direction, where the direction from the top end to the bottom end of the image sensor plane is the positive(+) direction. Or, when the object plane is seen from the origin, the positive direction is from top to bottom. On the other hands, the X-axis is parallel to the sides of the image sensor plane(3513) along the lateral direction, and when the object plane(3531) is seen from the origin N, the positive direction is from left to right. The said world coordinate system is a right-handed coordinate system. Therefore, if the directions of the Z-axis and the Y-axis are determined, then the direction of the X-axis is automatically determined.

On the other hands, the reference point O in the first rectangular coordinate system describing image points on the image sensor plane lies at the intersection point between the optical axis(3501) and the image sensor plane(3513). The x-axis is parallel to the sides of the image sensor plane along the lateral direction, and when the image sensor plane is seen from the nodal point of the wide-angle lens, the positive(+) direction runs from the left side of the image sensor plane to the right side. The y-axis is parallel to the sides of the image sensor plane along the longitudinal direction, and when the image sensor plane is seen from the nodal point of the wide-angle lens, the positive(+) direction runs from the top end of the image sensor plane to the bottom end. On the other hand, the direction of the x'-axis in the second rectangular coordinate system describing the uncorrected image plane and the direction of the x''-axis in the third rectangular coordinate system describing the processed image plane are the same as the direction of the x-axis in the first rectangular coordinate system. Furthermore, the direction of the y'-axis in the second rectangular coordinate system and the direction of the y''-axis in the third rectangular coordinate system are the same as the direction of the y-axis in the first rectangular coordinate system.

Since flattened-out object plane is identical to the processed image plane, each pixel (I, J) on the processed image plane has a corresponding imaginary object point on the imaginary object plane. Therefore, it is possible to allocate a two-dimensional coordinate (I, J) on the object plane. An object point Q=Q(I, J) having a two-dimensional coordinate (I, J) on the object plane has a corresponding image point P=P(I, J) on the processed image plane. On the other hand, an object point Q=Q(I, J) having a coordinate (I, J) on the object plane has a three-dimensional space coordinate $X_{I,J}, Y_{I,J}, Z_{I,J}$) in the world coordinate system. Each coordinate $X_{I,J}, Y_{I,J}, Z_{I,J}$ is a function of both I and J. In other words, $X_{I,J}=X(I, J)$, $Y_{I,J}=Y(I, J)$, and $Z_{I,J}=Z(I, J)$.

If the lateral pixel coordinate on the object plane changes by 1 from (I, J) to (I, J+1), then the three-dimensional space coordinates also change from $(X_{I,J}, Y_{I,J}, Z_{I,J})$ to $(X_{I,J+1}, Y_{I,J+1}, Z_{I,J+1})$. As has been stated, the object plane is assumed neither stretchable nor shrinkable. Therefore, provided the object plane is not folded and the degree of bending is relatively minute, if the two-dimensional pixel coordinates in the object plane changes by 1, then the three-dimensional space coordinates also change about by 1 in distance. More precisely, the space coordinate in the world coordinate system can change about by a constant C. Since it does not affect the image processing method, however, it is assumed that the position is changed by 1 in distance for simplicity of argument. Therefore, the relation in Eq. 54 holds true.

$$(X_{I,J+1}-X_{I,J})^2+(Y_{I,J+1}-Y_{I,J})^2+(X_{I,J+1}-X_{I,J})^2 \cong 1 \quad \text{[Equation 54]}$$

Similarly, if the longitudinal pixel coordinate changes by 1 from (I, J) to (I+1, J), then the three-dimensional space coordinates in the world coordinate system change about by 1 in distance. Therefore, the relation in Eq. 55 holds true.

$$(X_{I+1,J}-X_{I,J})^2+(Y_{I+1,J}-Y_{I,J})^2+(X_{I+1,J}-X_{I,J})^2 \cong 1 \quad \text{[Equation 55]}$$

The pixel coordinate on the processed image plane and on the object plane is given as (I, J), where I and J are natural numbers. Mathematically, however, it can be assumed that the pixel coordinate can take real numbers. The size of the processed image plane is given as a two-dimensional matrix having $I_{max}$ rows and $J_{max}$ columns. Each pixel is a square pixel having a shape of a right-rectangle. If we assume the pixel coordinate given as natural numbers are the center position of a square pixel, then the range of the longitudinal coordinate I of the two-dimensional coordinate on the object plane is given as $(0.5 \leq I \leq I_{max}+0.5)$, and the range of the lateral coordinate J is given as $(0.5 \leq J \leq J_{max}+0.5)$. Using the fact that the object plane is neither stretchable nor shrinkable, and the assumption that the two-dimensional coordinate I and J are real-numbered variables, Eq. 54 is reduced to Eq. 56, and Eq. 55 is reduced to Eq. 57.

$$\left(\frac{\partial X_{I,J}}{\partial J}\right)^2 + \left(\frac{\partial Y_{I,J}}{\partial J}\right)^2 + \left(\frac{\partial Z_{I,J}}{\partial J}\right)^2 = 1 \quad \text{[Equation 56]}$$

$$\left(\frac{\partial X_{I,J}}{\partial I}\right)^2 + \left(\frac{\partial Y_{I,J}}{\partial I}\right)^2 + \left(\frac{\partial Z_{I,J}}{\partial I}\right)^2 = 1 \quad \text{[Equation 57]}$$

Such a shape of the object plane automatically determines the projection scheme of the imaging system. The coordinate of an object point Q=Q(X, Y, Z) in the three-dimensional space is given as Q=Q(R, θ, φ) in a spherical polar coordinate system. The rectangular coordinate given as (X, Y, Z) and the spherical polar coordinate given as (R, θ, φ) satisfy the following equations.

$$X = R \sin\theta \cos\phi \quad \text{[Equation 58]}$$

$$Y = R \sin\theta \sin\phi \quad \text{[Equation 59]}$$

$$Z = R \cos\theta \quad \text{[Equation 60]}$$

$$R = \sqrt{X^2+Y^2+Z^2} \quad \text{[Equation 61]}$$

Therefore, from the three-dimensional rectangular coordinate, the azimuth angle φ of an incident ray originating from the said object point Q is given by Eq. 62 and the zenith angle θ is given by Eq. 63.

$$\phi = \tan^{-1}\left(\frac{Y}{X}\right) \quad \text{[Equation 62]}$$

$$\theta = \cos^{-1}\left(\frac{Z}{\sqrt{X^2+Y^2+Z^2}}\right) \quad \text{[Equation 63]}$$

Therefore, it is only necessary to substitute the signal value of an imaginary image point on the uncorrected image plane having the coordinates given by Eq. 64 and Eq. 65 for the signal value of an image point having a pixel coordinate (I, J) on the processed image plane.

$$x' = gr(\theta)\cos\phi \quad \text{[Equation 64]}$$

$$y' = gr(\theta)\sin\phi \quad \text{[Equation 65]}$$

Using Eq. 62 through Eq. 65, a complex image having an ideal projection scheme can be obtained from a fisheye image having a distortion. First, according to the user's need, the size (W, H) and the curved or bended shape of a desirable object plane, and its location within the world coordinate system are determined. As has been stated previously, determining the shape and the location of an object plane is equivalent to designing a projection scheme of a complex image. Then, the azimuth angle $\phi$ and the zenith angle $\theta$ of an incident ray corresponding to a three-dimensional rectangular coordinate $(X(I, J), Y(I, J), Z(I, J))$ on the object plane having a two-dimensional coordinate $(I, J)$ can be obtained using Eq. 62 and Eq. 63. Next, an image height r corresponding to the zenith angle $\theta$ of this incident ray is obtained. The rectangular coordinate $(x', y')$ of the image point on the uncorrected image plane corresponding to this image height r, the magnification ratio g, and the azimuth angle $\phi$ of the incident ray is obtained using Eq. 64 and Eq. 65. Finally, the video signal (i.e., RGB signal) value of the image point by the fisheye lens having this rectangular coordinate is substituted for the video signal value of the image point on the said complex image having a pixel coordinate $(I, J)$. A complex image having a designed projection scheme can be obtained by image processing for all the pixels in the complex image by this method.

Considering the fact that an image sensor plane, an uncorrected image plane and a processed image plane are all digitized, a complex image acquisition device of the first embodiment of the current invention is comprised of an image acquisition means for acquiring an uncorrected image plane using a camera equipped with a wide-angle lens rotationally symmetric about an optical axis, an image processing means for generating a processed image plane based on the said uncorrected image plane, and an image display means for displaying the said processed image plane. The said uncorrected image plane is a two-dimension array with $K_{max}$ rows and $L_{max}$ columns, the pixel coordinate of the optical axis on the said uncorrected image plane is $(K_o, L_o)$, and the real projection scheme of the said wide-angle lens is given by a function such as given in Eq. 66.

$$r=r(\theta) \quad \text{[Equation 66]}$$

Here, the real projection scheme of a lens is the image height r obtained as a function of the zenith angle $\theta$ of the corresponding incident ray. The magnification ratio g of the said camera is given by Eq. 67, where r' is a pixel distance on the uncorrected image plane corresponding to the image height r.

$$g = \frac{r'}{r} \quad \text{[Equation 67]}$$

The said processed image plane and the object plane are two-dimensional arrays with $I_{max}$ rows and $J_{max}$ columns. The shape of an object plane corresponding to a desirable complex image is determined using Eq. 68 through Eq. 70.

$$X_{I,J}=X(I,J) \quad \text{[Equation 68]}$$

$$Y_{I,J}=Y(I,J) \quad \text{[Equation 69]}$$

$$Z_{I,J}=Z(I,J) \quad \text{[Equation 70]}$$

The rectangular coordinates given by Eq. 68 through Eq. 70 must satisfy Eq. 71 and Eq. 72.

$$\left(\frac{\partial X_{I,J}}{\partial J}\right)^2 + \left(\frac{\partial Y_{I,J}}{\partial J}\right)^2 + \left(\frac{\partial Z_{I,J}}{\partial J}\right)^2 = 1 \quad \text{[Equation 71]}$$

$$\left(\frac{\partial X_{I,J}}{\partial I}\right)^2 + \left(\frac{\partial Y_{I,J}}{\partial I}\right)^2 + \left(\frac{\partial Z_{I,J}}{\partial I}\right)^2 = 1 \quad \text{[Equation 72]}$$

However, in a case where the object plane is folded, derivatives do not exist on folded points, and Eq. 71 or Eq. 72 cannot be applied at such points. Therefore, the shape of such an object plane can be summarized as follows. The shape of an object plane according to the first embodiment of the present invention, i.e., $X=X(I, J)$, $Y=Y(I, J)$ and $Z=Z(I, J)$, are continuous functions of I and J, and satisfy Eq. 71 and Eq. 72 on differentiable points.

Once the shape of the object plane is determined, azimuth angles given by Eq. 73 and zenith angles given by Eq. 74 are obtained for all object points $Q=Q(I, J)$ on the object plane having coordinates with natural numbers.

$$\phi_{I,J} = \tan^{-1}\left(\frac{Y_{I,J}}{X_{I,J}}\right) \quad \text{[Equation 73]}$$

$$\theta_{I,J} = \cos^{-1}\left(\frac{Z_{I,J}}{\sqrt{X_{I,J}^2 + Y_{I,J}^2 + Z_{I,J}^2}}\right) \quad \text{[Equation 74]}$$

The image height on the image sensor plane is obtained using Eq. 75.

$$r_{I,J}=r(\theta_{I,J}) \quad \text{[Equation 75]}$$

Using the second intersection point on the uncorrected image plane, in other words, the pixel coordinate $(K_o, L_o)$ of the optical axis and the magnification ratio g, the location of the second point on the uncorrected image plane, in other words, the location of the imaginary image point is determined.

$$x'_{I,J}=L_o+gr_{I,J}\cos\phi_{I,J} \quad \text{[Equation 76]}$$

$$y'_{I,J}=K_o+gr_{I,J}\sin\phi_{I,J} \quad \text{[Equation 77]}$$

Once the position of the corresponding second point is found, panoramic images can be obtained using various interpolation methods such as nearest-neighbor, bilinear interpolation, or bicubic interpolation method.

The shape of the object plane for obtaining a rectilinear image such as the one given in the first embodiment in reference 9 is given by Eq. 78 through Eq. 80. Here, the size of the processed image plane is $(I_{max}, J_{max})=(250, 250)$, and $(I_o, J_o)$ is the center position of the processed image plane. The processed image plane is set-up so that it is parallel to the X-Y plane and perpendicular to the optical axis. Furthermore, the horizontal field of view of the processed image plane is designed as $\Delta\psi=120°$, and for this purpose, the distance s'' from the origin N of the world coordinate system to the object plane is given by Eq. 80.

$$X_{I,J} = J - J_o \quad \text{[Equation 78]}$$

$$Y_{I,J} = I - I_o \quad \text{[Equation 79]}$$

$$Z_{I,J} = s'' = \frac{J_{max} - 1}{2\tan\left(\frac{\Delta\psi}{2}\right)} \quad \text{[Equation 80]}$$

Figure 21:
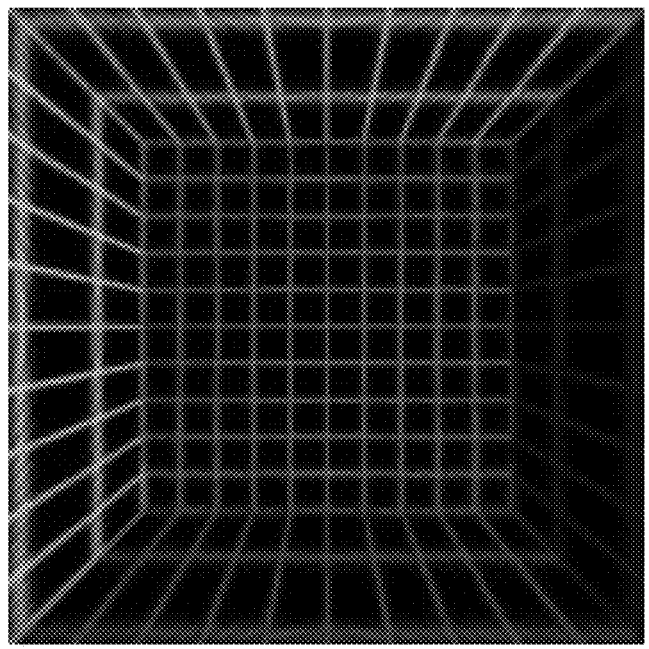
FIG. 21 is an exemplary rectilinear image with a horizontal FOV of 120° extracted from FIG. 5.
Figure 22:
FIG. 22 is a rectilinear image with a horizontal FOV of 60° extracted from the fisheye image given in FIG. 17.
Figure 23:
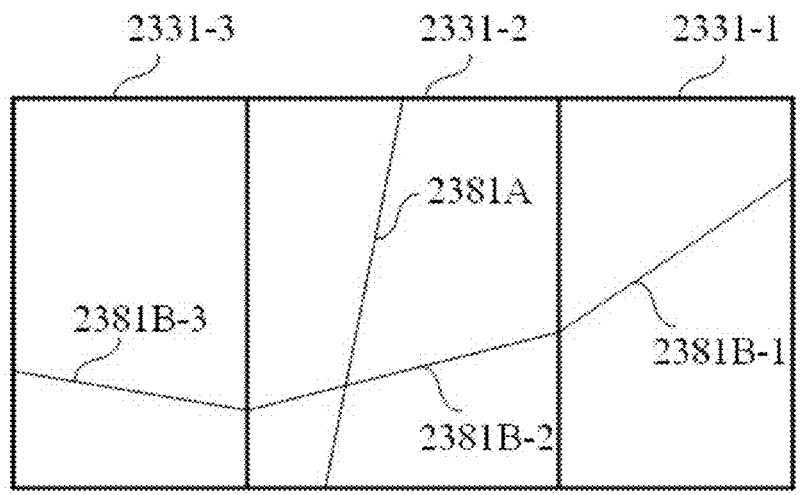
FIG. 23 is a conceptual drawing illustrating the definition of a multiple viewpoint panoramic image.

It can be easily confirmed that the shape of the object plane given by Eq. 78 through Eq. 80 satisfy Eq. 71 and Eq. 72. Furthermore, a rectilinear image extracted using an algorithm according to the first embodiment of the present invention coincides with FIG. 21. Therefore, it can be seen that a rectilinear image is merely one example of the first embodiment of the present invention.

Figure 36:
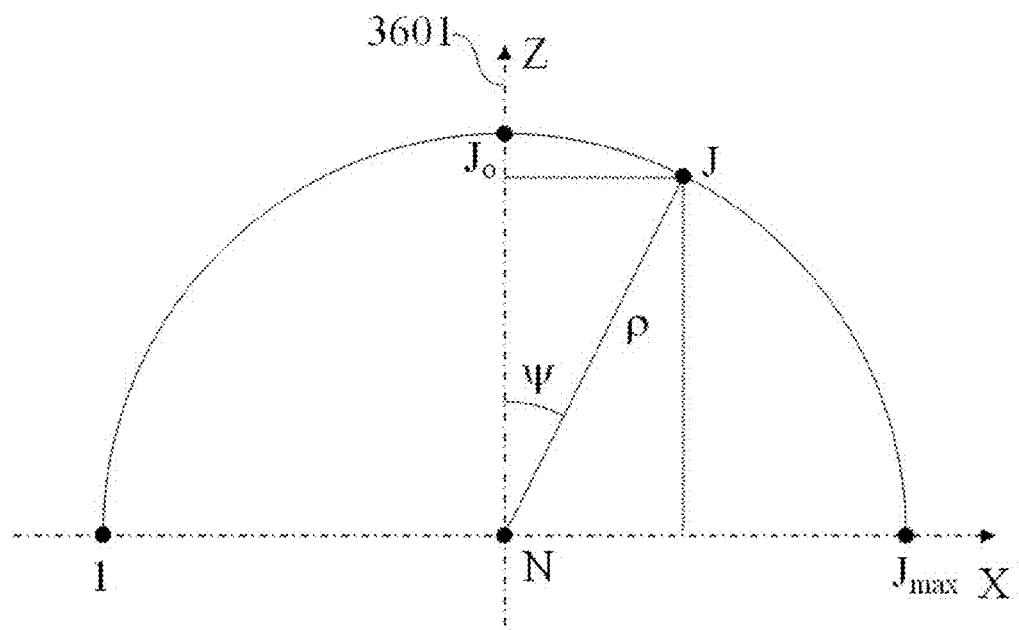
FIG. 36 is a conceptual diagram of an object plane corresponding to a cylindrical panoramic image plane according to the first embodiment of the current invention.

On the other hand, FIG. 36 is a cross-sectional diagram of an imaginary object plane in the X-Z plane corresponding to the cylindrical panoramic image plane given in the first embodiment in reference 8, and for convenience, the horizontal FOV ΔV is assumed as 180°. Since the lateral size of the processed image plane and the object plane is given as $J_{max}-1$, the axial radius ρ of the object plane is given by Eq. 81.

$$\rho = \frac{J_{max} - 1}{\Delta \psi} \quad [\text{Equation 81}]$$

On the other hand, the center coordinate of the object plane is given by $(I_o, J_o)$, and the Z-axis passes through the center of the object plane. Therefore, the horizontal field of view $\psi_{I,J}$ an object point having a lateral pixel coordinate J and a longitudinal pixel coordinate I makes with the Y-Z plane is given by Eq. 82.

$$\psi_{I,J} = \frac{J - J_o}{\rho} \quad [\text{Equation 82}]$$

Therefore, the coordinate $X_{I,J}$ in the X-axis direction is given by Eq. 83, and the coordinate $Z_{I,J}$ in the Z-axis direction is given by Eq. 84.

$$X_{I,J} = \rho \sin\left(\frac{J - J_o}{\rho}\right) \quad [\text{Equation 83}]$$

$$Z_{I,J} = \rho \cos\left(\frac{J - J_o}{\rho}\right) \quad [\text{Equation 84}]$$

On the other hand, since the shape of the object plane is a cylinder, the coordinate $Y_{I,J}$ in the Y-axis direction is given by Eq. 85.

$$Y_{I,J} = I - I_o \quad [\text{Equation 85}]$$

Figure 16:
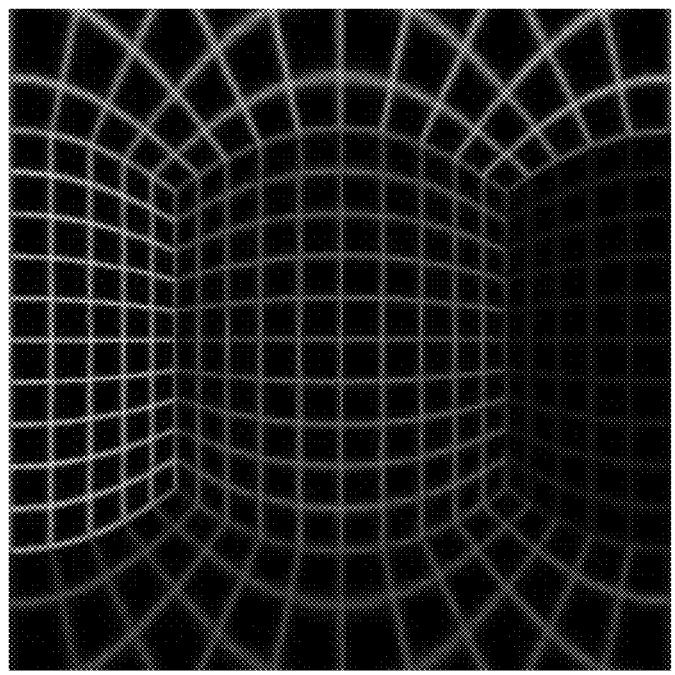
FIG. 16 is an exemplary panoramic image following a cylindrical projection scheme extracted from FIG. 5.

A processed image plane corresponding to such an object plane is identical to FIG. 16. Therefore, a cylindrical panoramic image is also an example of the first embodiment of the present invention. An object plane corresponding to a cylindrical panoramic image takes a shape that is bended around the Z-axis with an axial radius ρ.

Figure 24:
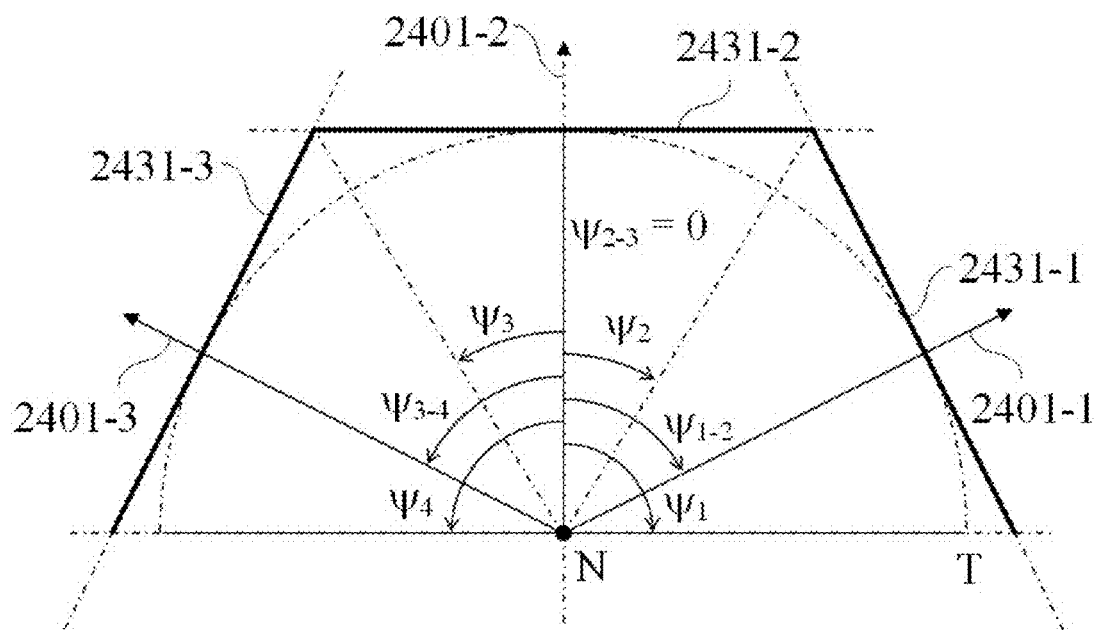
FIG. 24 is a conceptual drawing of an object plane corresponding to a multiple viewpoint panoramic image.
Figure 25:
FIG. 25 is another exemplary image of an interior scene captured using a fisheye lens from the invention of a prior art.
Figure 37:
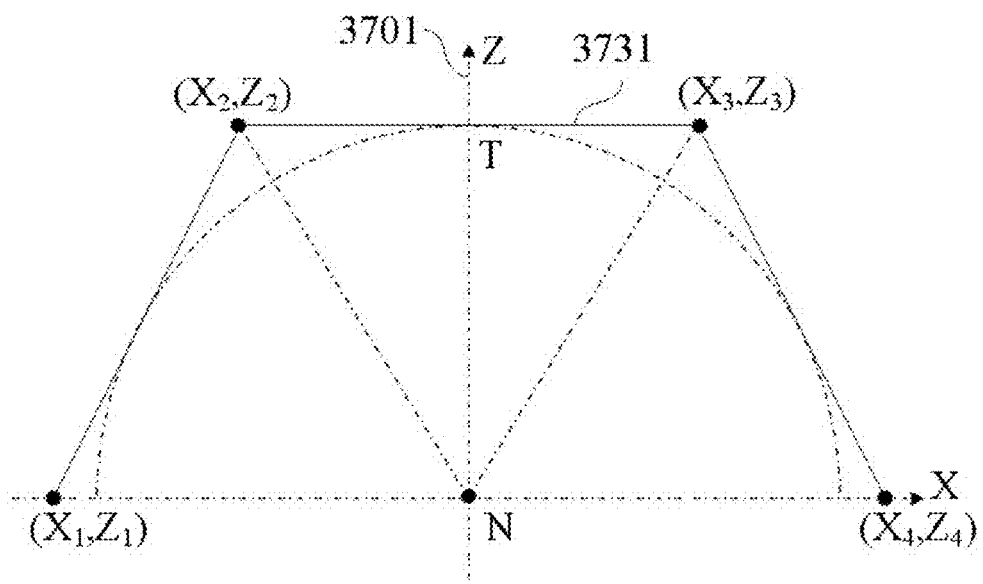
FIG. 37 is a conceptual diagram of an object plane corresponding to a multiple viewpoint panoramic image plane according to the first embodiment of the current invention.

FIG. 37 depicts a multiple viewpoint panoramic image plane in FIG. 24. While the object plane in FIG. 36 is bended in curves, the object plane(3731) in FIG. 37 is folded and is identical to the multiple viewpoint panoramic object plane in FIG. 24. The coordinates of the folding points are given as in the following Eq. 86 through Eq. 90.

$$T = \frac{J_{max} - 1}{6 \tan\frac{\pi}{6}} \quad [\text{Equation 86}]$$

$$X_4 = -X_1 = \frac{T}{\cos\frac{\pi}{6}} \quad [\text{Equation 87}]$$

$$Z_1 = Z_4 = 0 \quad [\text{Equation 88}]$$

$$X_3 = -X_2 = \frac{J_{max} - 1}{6} \quad [\text{Equation 89}]$$

$$Z_2 = Z_3 = T \quad [\text{Equation 90}]$$

On the other hand, referring to FIG. 37, the coordinate of an object point on the object plane(3731) corresponding to a pixel (I, J) on the processed image plane is given by Eq. 91 through Eq. 93.

$$X_{I,J} = \begin{cases} X_1 + 3(X_2 - X_1)\frac{(J-1)}{(J_{max}-1)} & \text{when } 1 \leq J \leq 1 + \frac{(J_{max}-1)}{3} \\ X_2 + (X_3 - X_2)\frac{\{3(J-1) - (J_{max}-1)\}}{(J_{max}-1)} & \text{when } 1 + \frac{(J_{max}-1)}{3} \leq J \leq 1 + \frac{2(J_{max}-1)}{3} \\ X_3 + (X_4 - X_3)\frac{\{3(J-1) - 2(J_{max}-1)\}}{(J_{max}-1)} & \text{when } 1 + \frac{2(J_{max}-1)}{3} \leq J \leq J_{max} \end{cases} \quad [\text{Equation 91}]$$

$$Z_{I,J} = \begin{cases} Z_1 + 3(Z_2 - Z_1)\frac{(J-1)}{(J_{max}-1)} & \text{when } 1 \leq J \leq 1 + \frac{(J_{max}-1)}{3} \\ Z_2 & \text{when } 1 + \frac{(J_{max}-1)}{3} \leq J \leq 1 + \frac{2(J_{max}-1)}{3} \\ Z_3 - Z_3 \frac{\{3(J-1) - 2(J_{max}-1)\}}{(J_{max}-1)} & \text{when } 1 + \frac{2(J_{max}-1)}{3} \leq J \leq J_{max} \end{cases} \quad [\text{Equation 92}]$$

$$Y_{I,J} = I - I_o \quad [\text{Equation 93}]$$

Figure 1:
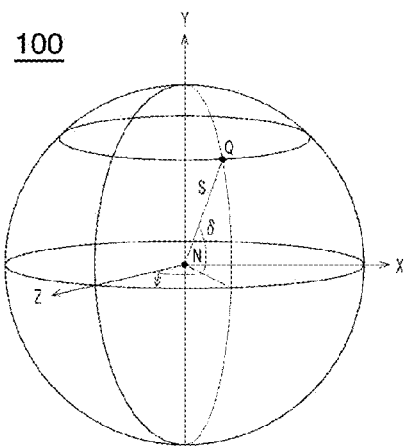
FIG. 1 is a conceptual drawing of the latitude and the longitude.
Figure 2:
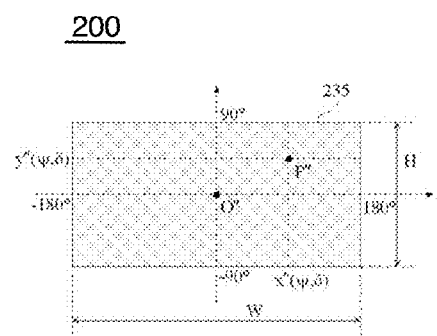
FIG. 2 is a conceptual drawing of a map with an equirectangular projection scheme.
Figure 3:
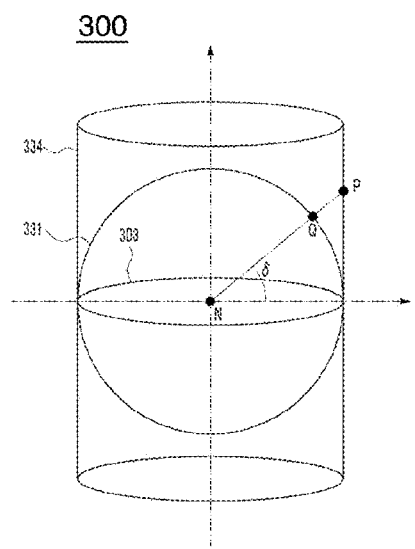
FIG. 3 is a conceptual drawing illustrating a cylindrical projection scheme.
Figure 4:
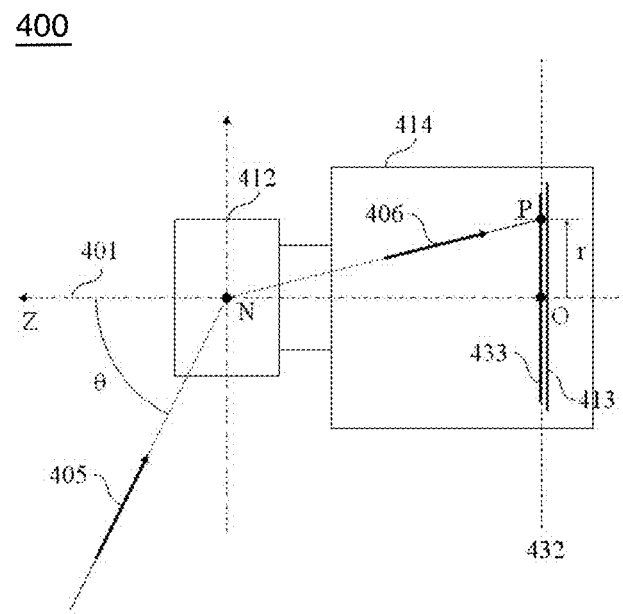
FIG. 4 is a conceptual drawing illustrating the real projection scheme of a general rotationally symmetric lens.
Figure 5:
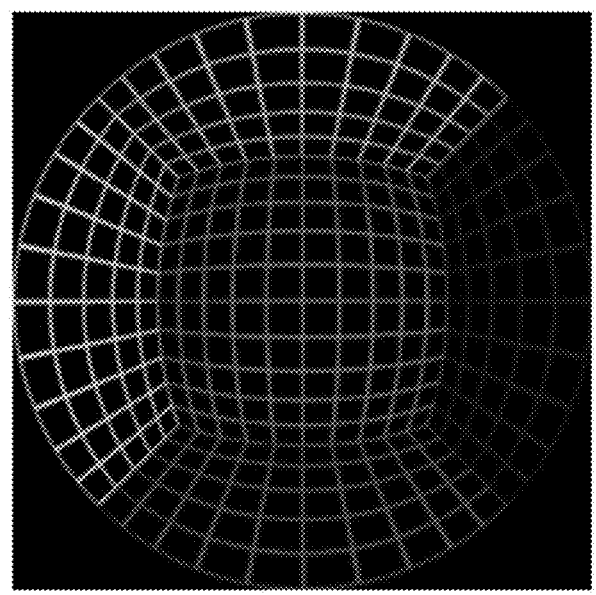
FIG. 5 is an exemplary image produced by a computer assuming that a fisheye lens with an equidistance projection scheme has been used to take the picture of an imaginary scene.
Figure 6:
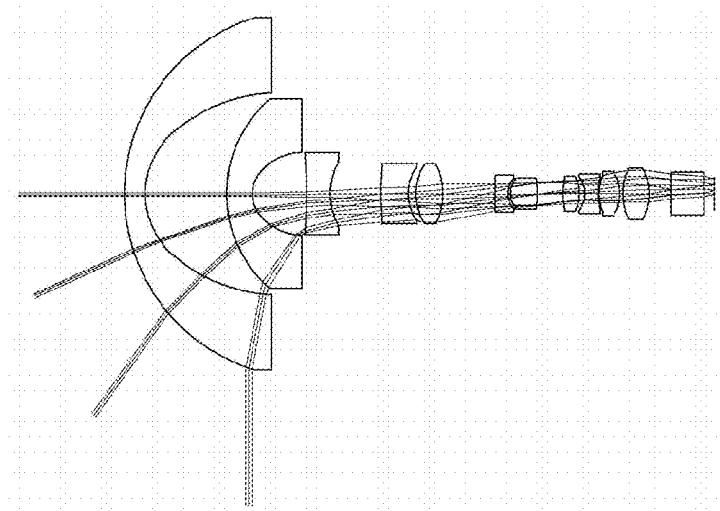
FIG. 6 is a diagram showing the optical structure of a refractive fisheye lens with a stereographic projection scheme along with the traces of rays.
Figure 7:
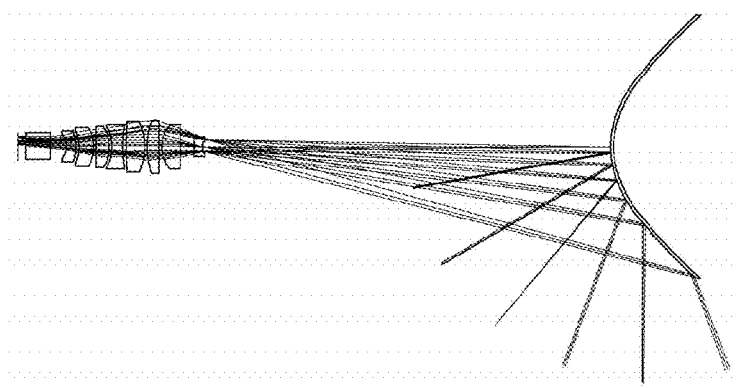
FIG. 7 is a diagram showing the optical structure of a catadioptric fisheye lens with a stereographic projection scheme along with the traces of rays.
Figure 8:
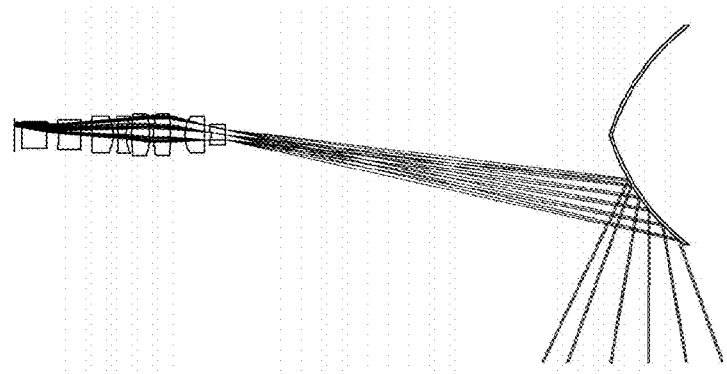
FIG. 8 is a diagram showing the optical structure of a catadioptric panoramic lens with a rectilinear projection scheme along with the traces of rays.
Figure 9:
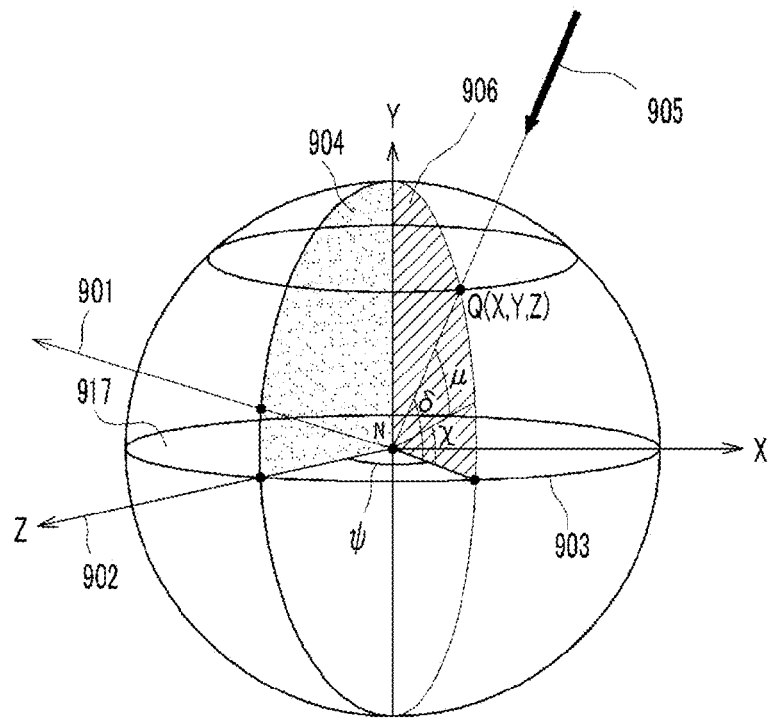
FIG. 9 is a conceptual drawing of the world coordinate system of the invention of a prior art.
Figure 10:
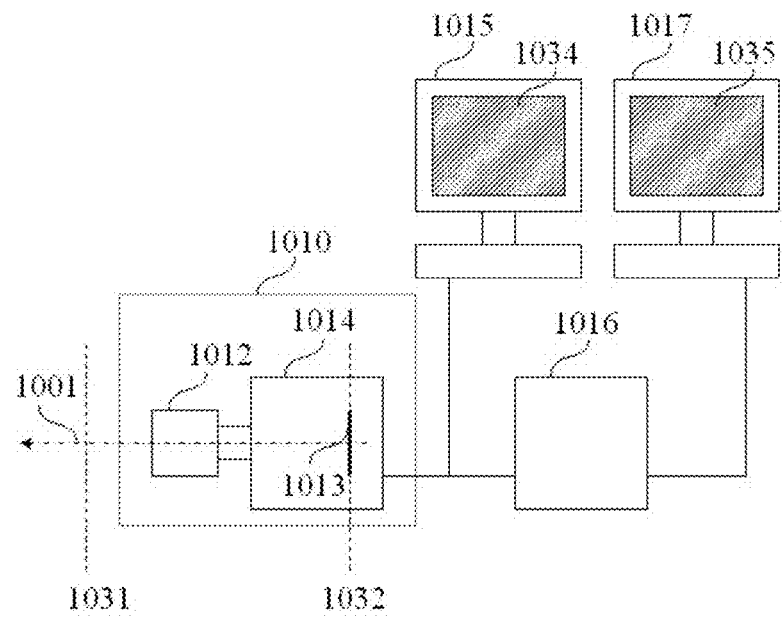
FIG. 10 is a schematic diagram of an imaging system of the invention of a prior art relying on software image processing.
Figure 11:
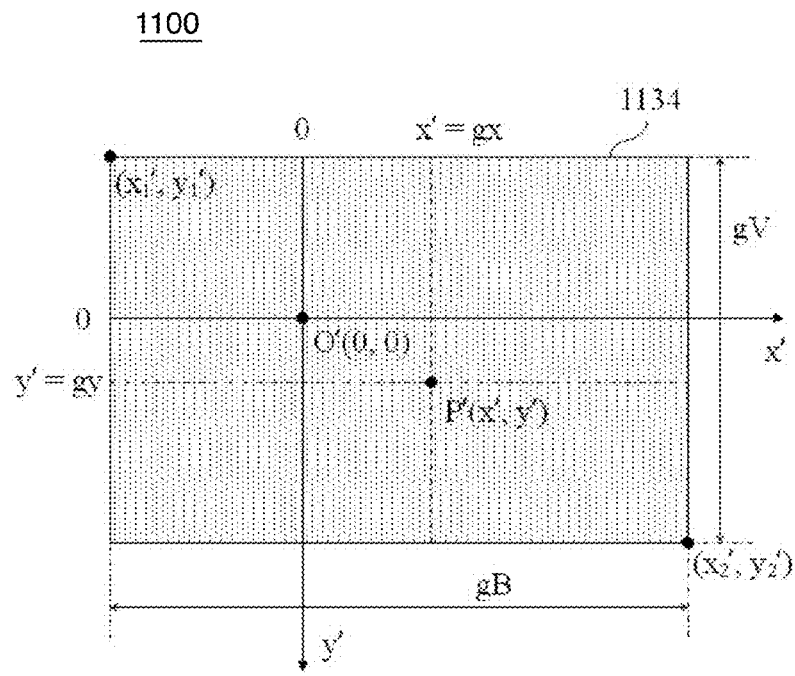
FIG. 11 is a conceptual drawing of an uncorrected image plane.
Figure 12:
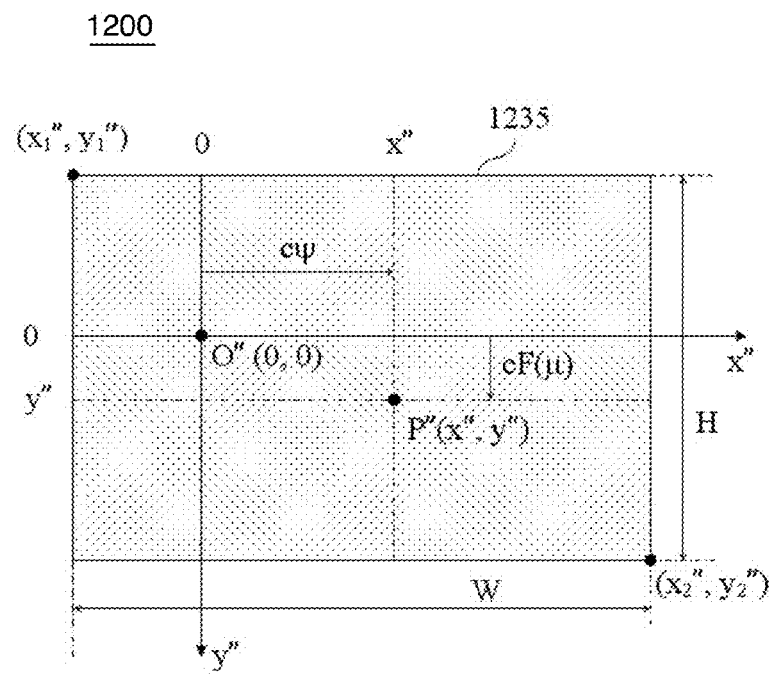
FIG. 12 is a conceptual drawing of a processed image plane that can be shown on an image display means.
Figure 13:
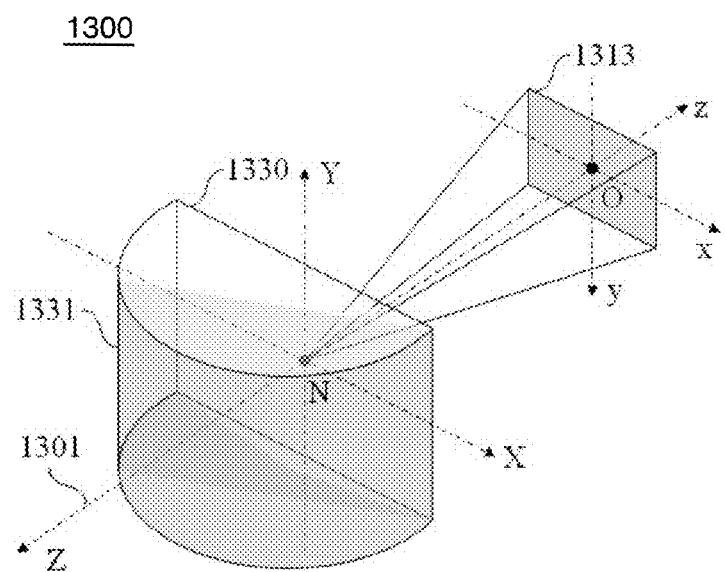
FIG. 13 is a conceptual drawing of an object plane assumed by a panoramic imaging system having a cylindrical projection scheme according to an embodiment of the invention of a prior art.
Figure 14:
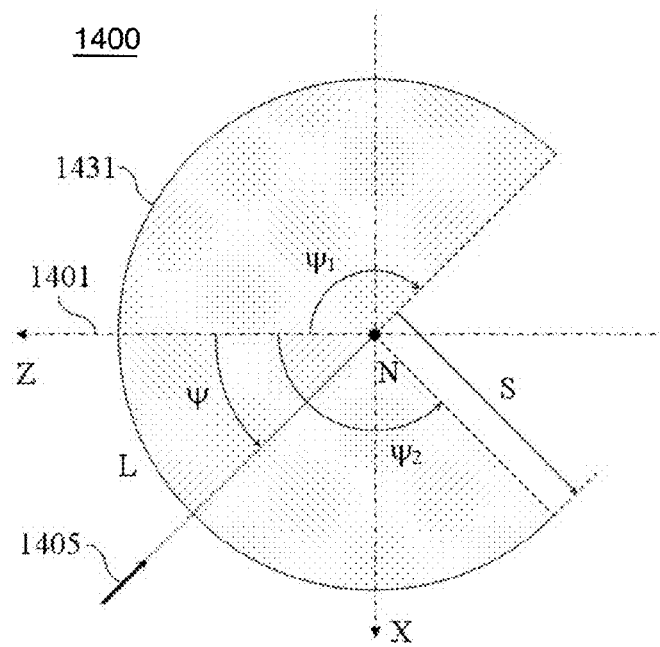
FIG. 14 is a cross-sectional diagram of the object plane shown in FIG. 13 in X-Z plane.
Figure 15:
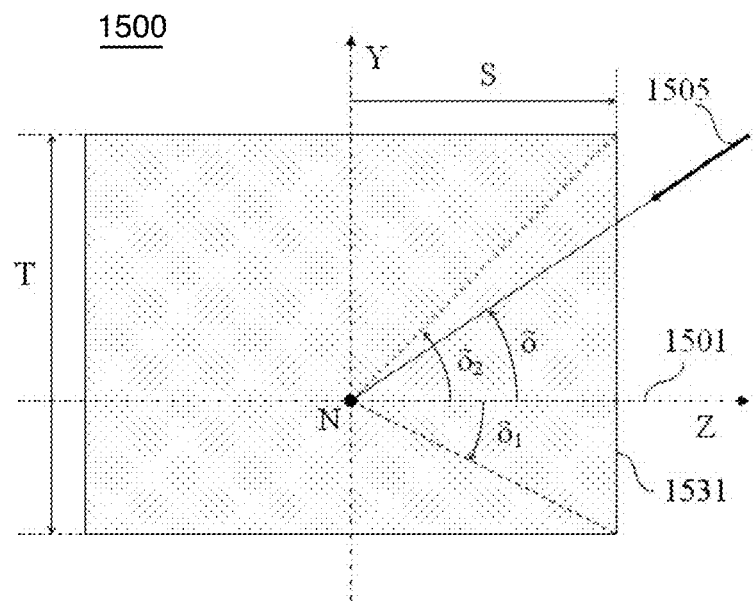
FIG. 15 is a cross-sectional diagram of the object plane shown in FIG. 13 in Y-Z plane.
Figure 38:
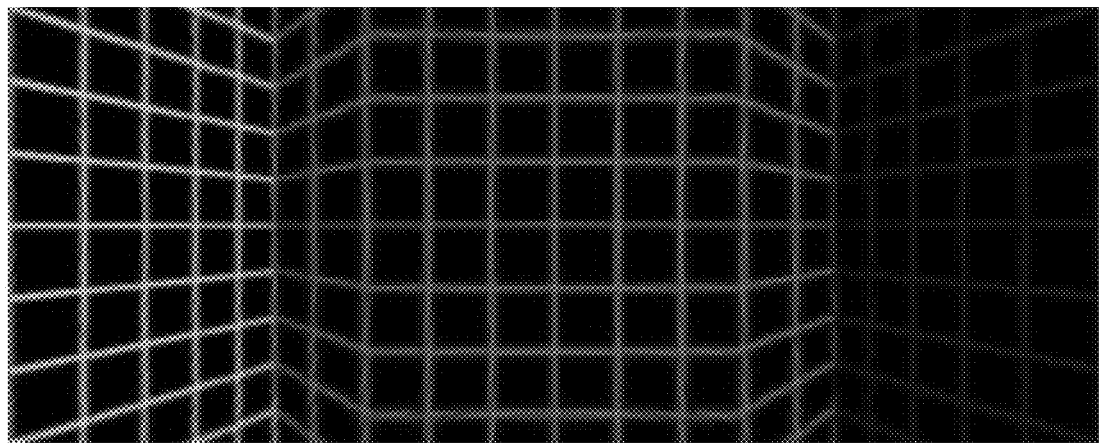
FIG. 38 is an example of a multiple viewpoint panoramic image plane corresponding to FIG. 37.

FIG. 38 is a processed image plane extracted from the fisheye image in FIG. 5 using such an object plane, and it has been set-up so that $J_{max}=601$ and $I_{max}=240$. Therefore, it is certain that the object plane of a multiple viewpoint panoramic image such as given in FIG. 51 in reference 9 is an example of an object plane according to the first embodiment of the present invention.

Figure 39:
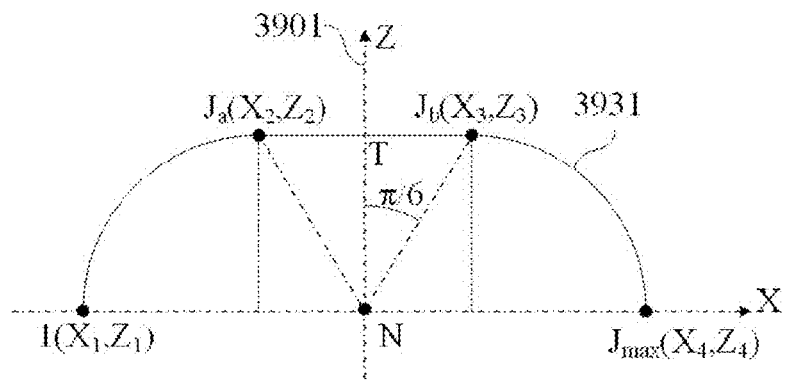
FIG. 39 is a conceptual diagram of an object plane corresponding to a complex image plane according to the first embodiment of the current invention.

On the other hand, FIG. 39 is a cross-sectional diagram of a complex object plane(3931) in the X-Z plane according to the first embodiment of the present invention. For this object plane, an area centered at the optical axis and having a horizontal FOV of 60° is made to follow a rectilinear projection scheme, so that a distortion-free normal image can be obtained. Simultaneously, two side areas each having a horizontal FOV of 60° are set-up to follow a projection scheme which is somewhat similar to a cylindrical projection scheme. Between these two boundaries, the object planes are smoothly joined and not are folded. On the other hand, the left and the right images cannot be considered as genuine panoramic images. This is because horizontal intervals in the object plane corresponding to an identical horizontal FOV are not equal.

The shape of the object plane depicted in FIG. 39 can be described by the following Eq. 94 through Eq. 103.

$$T = \frac{J_{max} - 1}{\pi + 2\tan\frac{\pi}{6}}$$ [Equation 94]

$$X_3 = -X_2 = T\tan\frac{\pi}{6}$$ [Equation 95]

$$X_4 = -X_1 = X_3 + T$$ [Equation 96]

$$Z_1 = Z_4 = 0$$ [Equation 97]

$$Z_2 = Z_3 = T$$ [Equation 98]

$$J_a = 1 + T\frac{\pi}{2}$$ [Equation 99]

$$J_b = 1 + T\frac{\pi}{2} + 2T\tan\frac{\pi}{6}$$ [Equation 100]

$$X_{I,J} = \begin{cases} X_2 - T\cos\left(\frac{J-1}{T}\right) & \text{when } 1 \le J \le J_a \\ X_2 + (X_3 - X_2)\left(\frac{J - J_a}{J_b - J_a}\right) & \text{when } J_a \le J \le J_b \\ X_3 + T\sin\left(\frac{J - J_b}{T}\right) & \text{when } J_b \le J \le J_{max} \end{cases}$$ [Equation 101]

$$Z_{I,J} = \begin{cases} T\sin\left(\frac{J-1}{T}\right) & \text{when } 1 \le J \le J_a \\ Z_2 & \text{when } J_a \le J \le J_b \\ T\cos\left(\frac{J - J_b}{T}\right) & \text{when } J_b \le J \le J_{max} \end{cases}$$ [Equation 102]

$$Y_{I,J} = I - I_o$$ [Equation 103]

Figure 17:
FIG. 17 is an exemplary image of an interior scene captured using a fisheye lens from the invention of a prior art.
Figure 18:
FIG. 18 is a panoramic image with a horizontal FOV of 190° and following a cylindrical projection scheme extracted from the fisheye image given in FIG. 17.
Figure 19:
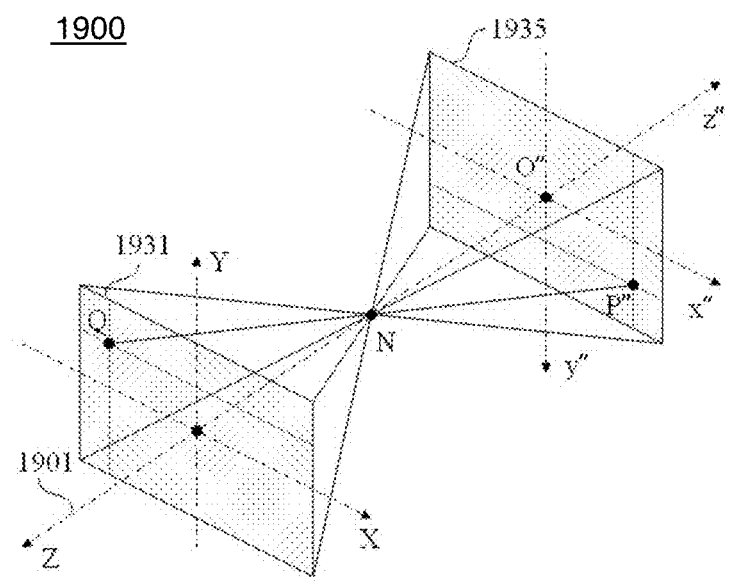
FIG. 19 is a conceptual drawing illustrating a rectilinear projection scheme according to the invention of a prior art.
Figure 20:
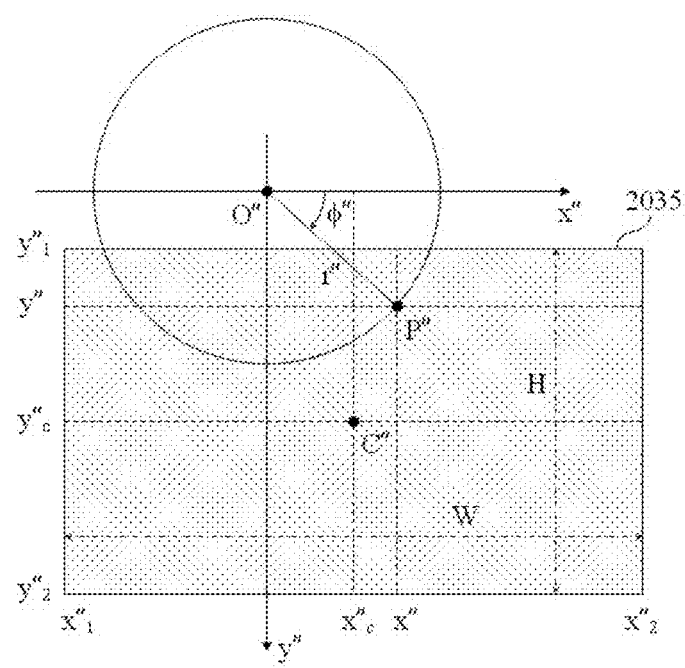
FIG. 20 is a conceptual drawing illustrating the change in field of view as the relative position of the processed image plane is changed.
Figure 40:
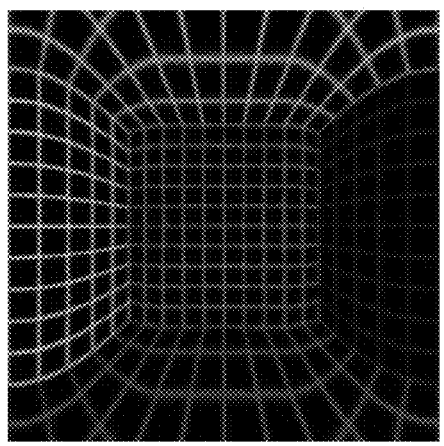
FIG. 40 is an example of a complex image plane extracted from FIG. 5 corresponding to the object plane in FIG. 39.
Figure 41:
FIG. 41 is another example of a complex image plane extracted from FIG. 17 corresponding to the object plane in FIG. 39.

FIG. 40 is a complex image extracted from the image in FIG. 5. As can be seen in FIG. 40, all the straight lines are represented as straight lines in the middle area. On the other hand, vertical lines are represented as vertical lines on two side areas. Similar to a panoramic image, an image having a FOV of 180° is shown. On the other hand, FIG. 41 is an image extracted from FIG. 17. Comparing with FIG. 18, it can be seen that middle region corresponds to a rectilinear image showing straight lines as straight lines.

X and Z coordinates of object points on an object plane according to the first embodiment of the present invention are given as sole functions of the lateral pixel coordinate J on the processed image plane as can be seen in Eq. 104 and Eq. 105.

$$X_{I,J} = X(I,J) = X(J) \equiv X_J$$ [Equation 104]

$$Z_{I,J} = Z(I,J) = Z(J) \equiv Z_J$$ [Equation 105]

Furthermore, the Y coordinate of the object point is given as a sole function of the longitudinal pixel coordinate I on the processed image plane as can be seen in Eq. 106.

$$Y_{I,J} = Y(I,J) = Y(I) \equiv Y_I$$ [Equation 106]

On the other hand, in correspondence with the longitude V and the latitude δ in reference 8, a horizontal azimuth angle ψ and a vertical elevation angle δ can be defined for all pixels in the processed image plane having video signals as in Eq. 107 and Eq. 108.

$$\psi_{I,J} \equiv \psi(I, J) = \tan^{-1}\left(\frac{X_{I,J}}{Z_{I,J}}\right)$$ [Equation 107]

$$\delta_{I,J} \equiv \delta(I, J) = \tan^{-1}\left(\frac{Y_{I,J}}{\sqrt{X_{I,J}^2 + Z_{I,J}^2}}\right)$$ [Equation 108]

Here, when the Y-axis direction coincides with the vertical direction, the horizontal azimuth angle coincides with the longitude, and the vertical elevation angle coincides with the latitude. Furthermore, considering Eq. 104 through Eq. 106, the horizontal azimuth angle ψ is characterized as being a sole function of the lateral pixel coordinates J.

$$\psi_{I,J} = \psi_J = \tan^{-1}\left(\frac{X_J}{Z_J}\right)$$ [Equation 109]

However, in general, the vertical elevation angle is not given as a sole function of the longitudinal pixel coordinate I.

$$\delta_{I,J} = \tan^{-1}\left(\frac{Y_I}{\sqrt{X_J^2 + Z_J^2}}\right)$$ [Equation 110]

Imaging systems corresponding to the first embodiment of the present invention are characterized in that the horizontal azimuth angle $\psi_{I,J}$ is given as a monotonic function of the lateral pixel coordinate J, and the vertical elevation angle $\delta_{I,J}$ is given as a monotonic function of the longitudinal pixel coordinate I. This can be defined as a generalized panoramic image.

Furthermore, imaging systems corresponding to the first embodiment of the present invention are characterized in that straight lines parallel to the Y-axis are captured as straight lines parallel to the sides of the image sensor plane along the longitudinal direction.

Furthermore, object planes in imaging systems corresponding to the first embodiment of the present invention satisfy the following Eq. 111 and Eq. 112 on differentiable regions.

$$\left(\frac{\partial X_J}{\partial J}\right)^2 + \left(\frac{\partial Z_J}{\partial J}\right)^2 = 1$$ [Equation 111]

$$\left(\frac{\partial Y_I}{\partial I}\right)^2 = 1$$ [Equation 112]

Second Embodiment

FIG. 35 is a conceptual diagram of an object plane according to the first embodiment of the present invention having a shape of a generalized cylinder, and the resulting complex images can be considered as generalized horizontal panoramic images. In contrast to this, complex imaging systems according to the second embodiment of the present invention are imaging systems for obtaining generalized vertical panoramic images.

Figure 42:
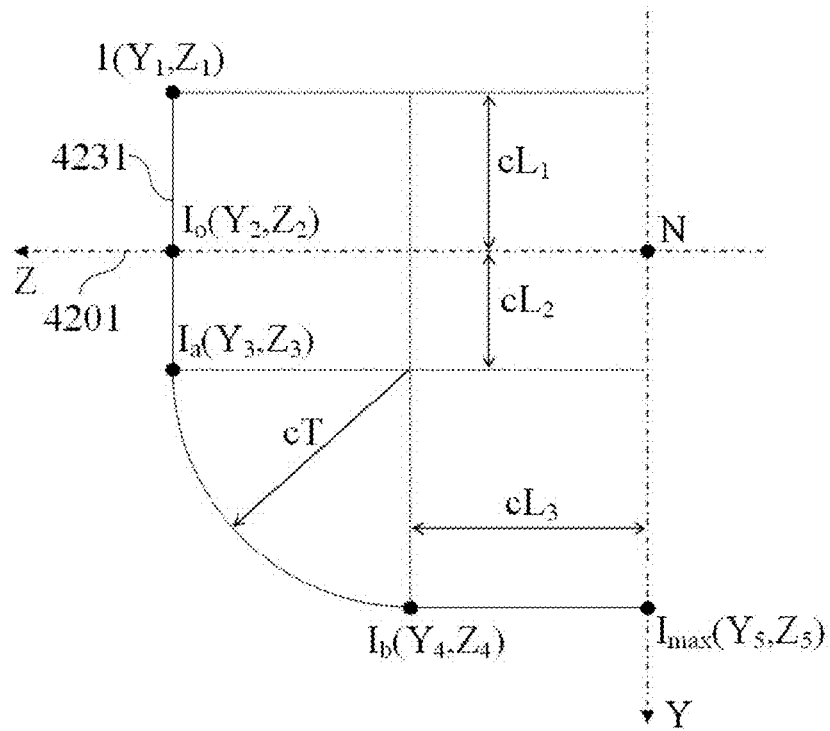
FIG. 42 is a cross-sectional diagram of a complex object plane in the Y-Z plane according to the second embodiment of the current invention.

FIG. 42 shows the cross-sectional diagram of an exemplary object plane in the Y-Z plane for obtaining such a generalized vertical panoramic image. This object plane is comprised of a region($1 \leq I \leq I_a$) centered about an optical axis(4201) for obtaining a distortion-free rectilinear image, a region ($I_a \leq I \leq I_b$) for obtaining an image similar to a cylindrical panoramic image, and a region($I_b \leq I \leq I_{max}$) for obtaining a tilted rectilinear image. The shape of such an object plane is given by Eq. 113 through Eq. 126.

$$c = \frac{I_{max} - 1}{L_1 + L_2 + T\frac{\pi}{2} + L_3}$$ [Equation 113]

$$I_o = 1 + cL_1$$ [Equation 114]

$$I_a = I_o + cL_2$$ [Equation 115]

$$I_b = I_a + cT\frac{\pi}{2}$$ [Equation 116]

$$Y_1 = -cL_1$$ [Equation 117]

$$Y_2 = 0$$ [Equation 118]

$$Y_3 = cL_2$$ [Equation 119]

$$Y_4 = Y_5 = Y_3 + cT$$ [Equation 120]

$$Z_1 = Z_2 = Z_3 = cT + cL_3$$ [Equation 121]

$$Z_4 = cL_3$$ [Equation 122]

$$Z_5 = 0$$ [Equation 123]

$$Y_{I,J} = \begin{cases} Y_1 + (Y_3 - Y_1)\frac{(I-1)}{(I_a - 1)} & \text{when } 1 \leq I \leq I_a \\ Y_3 + cT\sin\left(\frac{I - I_a}{cT}\right) & \text{when } I_a \leq I \leq I_b \\ Y_4 & \text{when } I_b \leq I \leq I_{max} \end{cases}$$ [Equation 124]

$$Z_{I,J} = \begin{cases} Z_1 & \text{when } 1 \leq I \leq I_a \\ Z_4 + cT\cos\left(\frac{I - I_a}{cT}\right) & \text{when } I_a \leq I \leq I_b \\ Z_4 + (Z_5 - Z_4)\frac{(I - I_b)}{(I_{max} - I_b)} & \text{when } I_b \leq I \leq I_{max} \end{cases}$$ [Equation 125]

$$X_{I,J} = J - J_o$$ [Equation 126]

Figure 43:
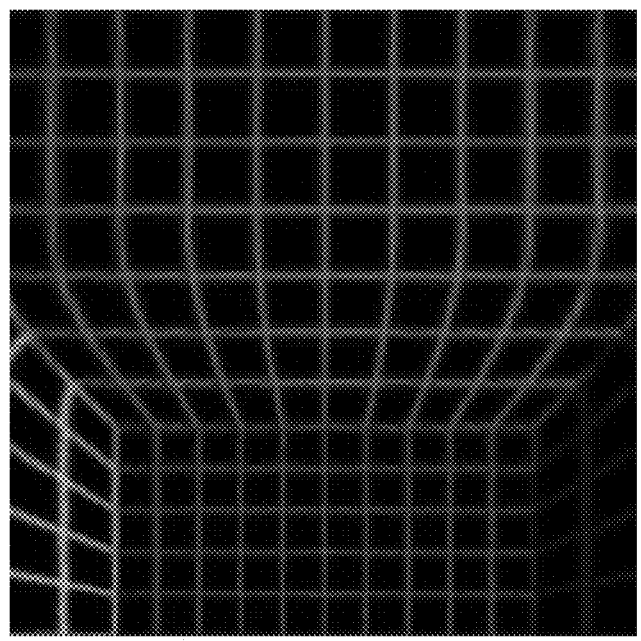
FIG. 43 is an example of a complex image plane extracted from FIG. 5 according to the second embodiment of the current invention.

FIG. 43 is a complex image extracted from FIG. 5 using the object plane in FIG. 42, and the parameters are given as $I_{max}$=240, $J_{max}$=240, $L_1$=50, $L_2$=30, T=50 and $L_3$=80. In FIG. 43, it can be seen that all the straight lines are represented as straight lines in the upper and the lower regions. In the middle region, it continuously changes much like a panoramic image.

Figure 44:
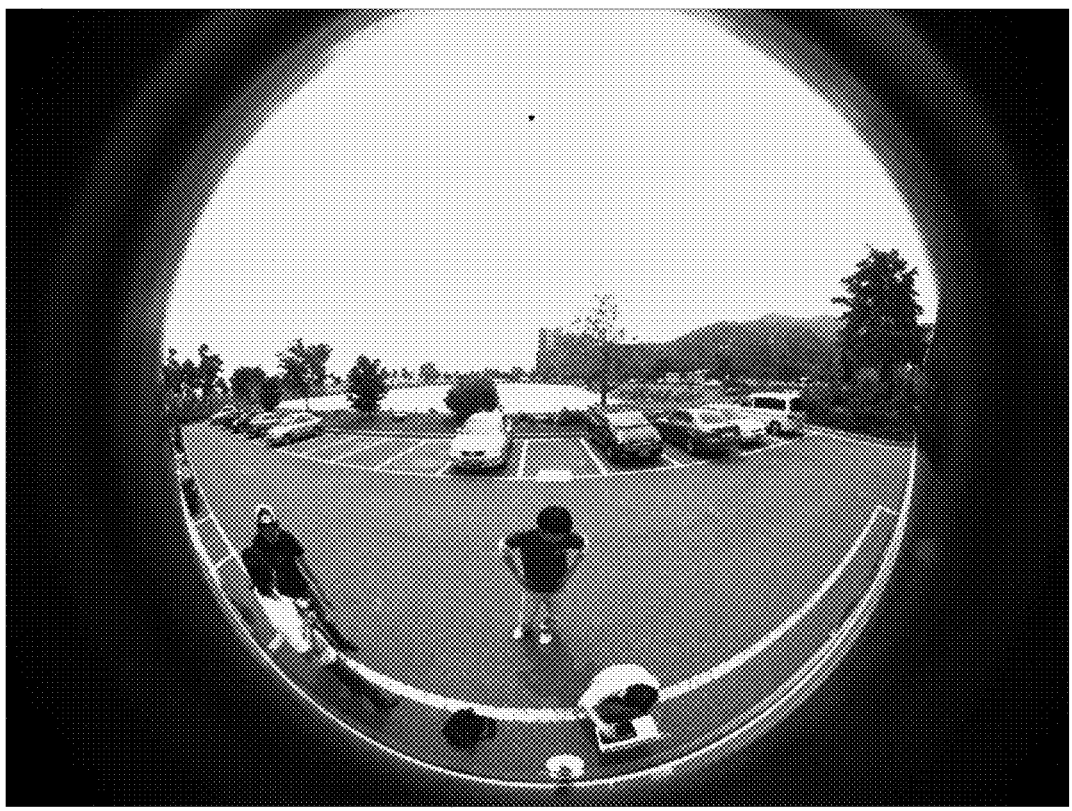
FIG. 44 is an image of an exterior scene captured using a fisheye lens from the invention of a prior art.
Figure 45:
FIG. 45 is an example of a complex image plane extracted from FIG. 44 according to the second embodiment of the current invention.

On the other hand, FIG. 44 is another example of a fisheye image given in reference 9, and FIG. 45 is a complex image extracted from FIG. 44 using the object plane in FIG. 42. Parameters are given as $I_{max}$=800, $J_{max}$=600, $L_1$=200, $L_2$=100, T=100 and $L_3$=200. In FIG. 45, the upper part of the image shows a distortion-free image much like the image from an ordinary camera. Since the lower part of the image shows an image as if a camera is heading downward to the ground, it is convenient to identify the parking lanes. A complex image of this type can be used for a front or a rear view camera for automobiles as in this example. When applied to a video door phone, newspapers or milks lying in front of the door as well as visitors can be advantageously identified.

The shape of an object plane according to the second embodiment of the present invention can be defined more generally as follows. As is clear from Eq. 127, the X coordinate of object points on an object plane according to the second embodiment of the present invention is given as a sole function of the lateral pixel coordinate J on the processed image plane.

$$X_{I,J} \equiv X(I,J) = X(J) \equiv X_J$$ [Equation 127]

On the other hand, as shown in Eq. 128 and Eq. 129, the Y and the Z coordinates of the object points are given as sole functions of the longitudinal pixel coordinate I on the processed image plane.

$$Y_{I,J} \equiv Y(I,J) = Y(I) \equiv Y_I$$ [Equation 128]

$$Z_{I,J} \equiv Z(I,J) = Z(I) \equiv Z_I$$ [Equation 129]

On the other hand, an azimuth angle ψ along the lateral direction and an elevation angle δ along the longitudinal direction can be defined for all pixels on the processed image plane using Eq. 107 and Eq. 108. Considering Eq. 128 and Eq. 129, these can be given as Eq. 130 and Eq. 131.

$$\psi_{I,J} = \tan^{-1}\left(\frac{X_J}{Z_I}\right)$$ [Equation 130]

$$\delta_{I,J} = \tan^{-1}\left(\frac{Y_I}{\sqrt{X_J^2 + Z_I^2}}\right)$$ [Equation 131]

Therefore, in the current embodiment, both the azimuth angle in the lateral direction and the elevation angle in the longitudinal direction are given as functions of the lateral pixel coordinate J and the longitudinal pixel coordinate I. However, as in the first embodiment of the present invention, the azimuth angle $\psi_{I,J}$ in the lateral direction is given as a monotonic function of the lateral pixel coordinate J, and the elevation angle $\delta_{I,J}$ in the longitudinal direction is given as a monotonic function of the longitudinal pixel coordinate I.

In imaging systems according to the second embodiment of the present invention, straight lines parallel to the X-axis are captured on the processed image plane as straight lines parallel to the sides of the image sensor plane along the lateral direction. Furthermore, object plane of an imaging system according to the second embodiment of the present invention satisfy Eq. 132 and Eq. 133 on differentiable regions.

$$\left(\frac{\partial X_J}{\partial J}\right)^2 = 1$$ [Equation 132]

$$\left(\frac{\partial Y_I}{\partial I}\right)^2 + \left(\frac{\partial Z_I}{\partial I}\right)^2 = 1$$ [Equation 133]

On the other hand, the equations describing the coordinate of the imaginary image point on the uncorrected image plane corresponding to a pixel coordinate (I, J) on the processed image plane of the imaging system are identical to those given in the first embodiment.

Third Embodiment

Imaging systems according to the first embodiment of the present invention provide generalized horizontal panoramic images, and imaging systems according to the second embodiment of the present invention provide generalized vertical panoramic images. However, a processed image plane and an object plane can be designed so that a single image contains both a generalized horizontal panoramic image and a vertical panoramic image.

Figure 46:
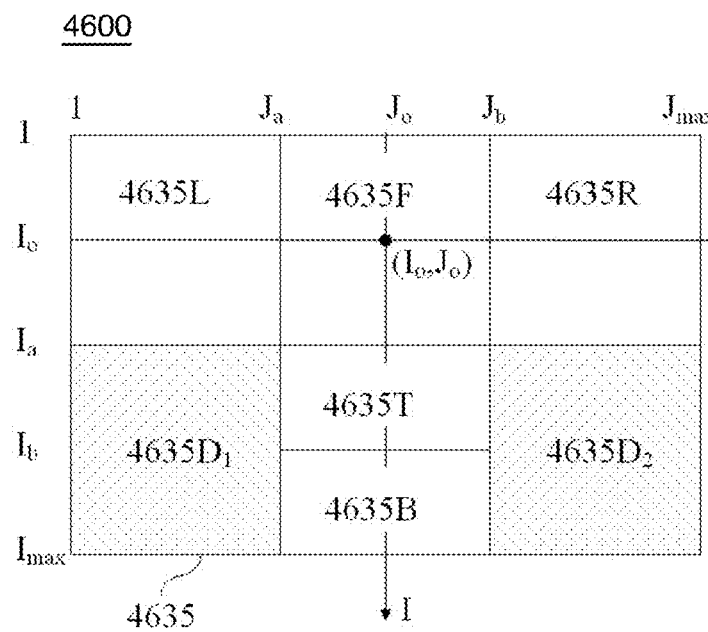
FIG. 46 is a conceptual diagram of a complex image plane according to the third embodiment of the current invention.

FIG. 46 shows an exemplary structure of a processed image plane(4635) according to the third embodiment of the present invention. The processed image plane(4635) has pixels arranged in a form of a two-dimensional array with $I_{max}$ rows and $J_{max}$ columns. These pixels on the processed image plane are composed of live pixels having video signals and dormant pixels not having video signals. In FIG. 46, pixels belong to sub-regions(4635L, 4635F, 4635R, 3635T, 4635B) on the processed image plane(4635) are live pixels, and pixels belong to the rest of the region(4635D) are dormant pixels.

In FIG. 46, the location of the optical axis is given as ($I_o$, $J_o$), and the sub-region(4635F) containing the optical axis displays a rectilinear image showing the scene right in front of the camera without any distortion. Furthermore, sub-regions having identification numbers 4635L, 4635F and 4635R show a generalized horizontal panoramic image, and the structure can take a relatively arbitrary shape including the shapes of object planes shown in FIG. 37 or in FIG. 39. Furthermore, sub-regions having identification numbers 4635F, 4635T, and 4635B show a generalized vertical panoramic image, and the structure can take a relatively arbitrary shape including the shape of the object plane shown in FIG. 42. On the other hand, the sub-region having an identification number 4635D does not display any image.

Figure 47:
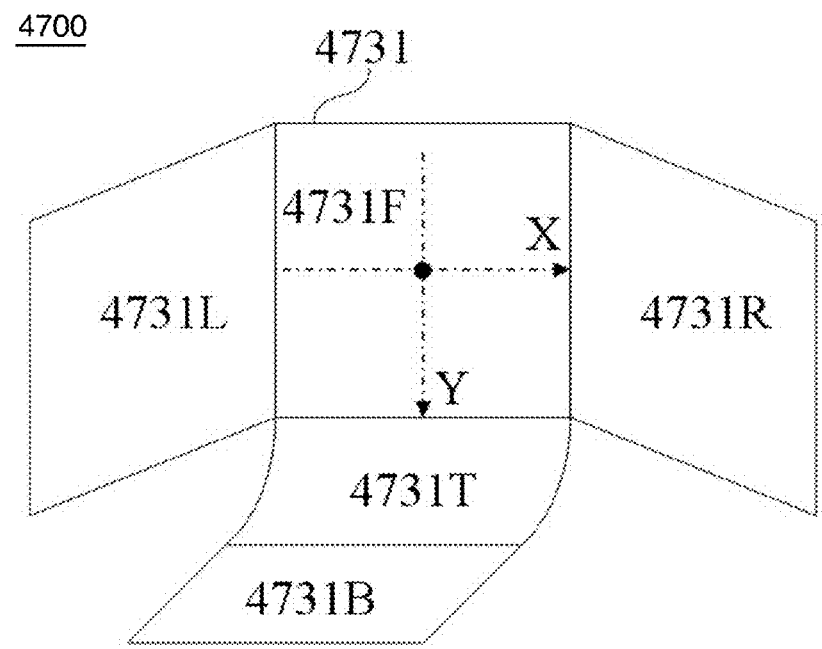
FIG. 47 is a conceptual diagram of a complex object plane corresponding to the complex image plane in FIG. 46.
Figure 48:
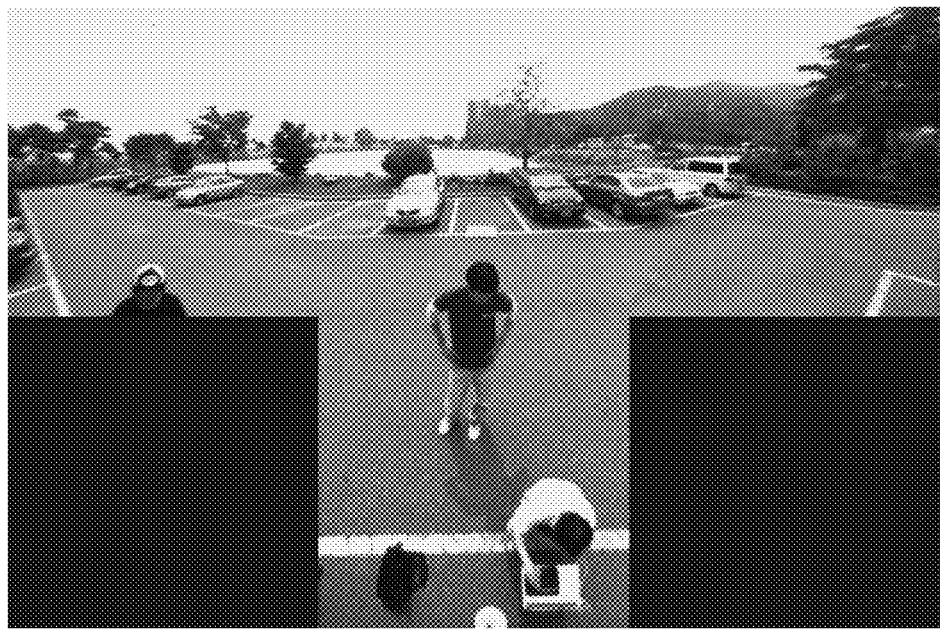
FIG. 48 is an example of a complex image plane extracted from the fisheye image in FIG. 44.

FIG. 47 shows a specific structure of an imaginary object plane(4731). Along the lateral direction, it has an object plane (4731L, 4731F, 4731R) in a form of three viewpoint panoramic image as displayed in FIG. 37, and along the longitudinal direction, it has an object plane(4731F, 4731T, 4731B) as displayed in FIG. 42. FIG. 48 shows a complex image extracted from FIG. 44 using such an object plane. In the region corresponding to the identification number 4731F, a distortion-free rectilinear image of the scene in front of the camera is shown. If this kind of camera is employed as a front view or a rearview camera for automobiles, then using images of this region, the front side or the rear side of an automobile can be checked out while driving the automobile. On the other hand, since images with identification numbers 4731L, 4731F and 4731R constitute a multiple viewpoint panoramic image, obstacles on either side of a car can be conveniently checked out while parking the car or when coming out of a narrow alley. On the other hand, using the image corresponding to the sub-region with an identification number 4731B, parking lanes can be easily identified while parking the car. On the other hand, since images corresponding to identification numbers 4731F, 4731T and 4731B constitute a generalized vertical panoramic image, obstacles such as passer-bys on either the front or the rear side of a car can be easily identified as demonstrated in FIG. 48.

Figure 49:
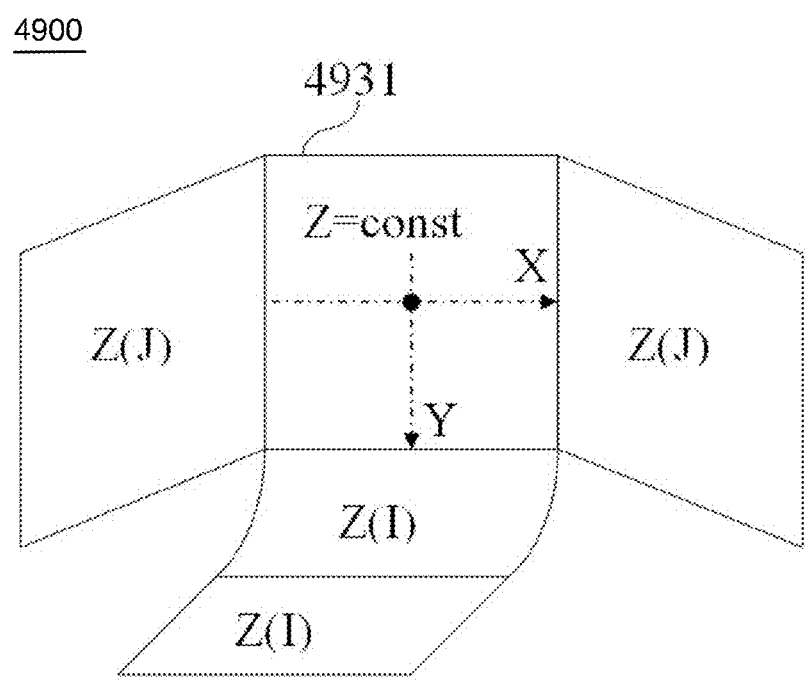
FIG. 49 is a conceptual diagram showing the dependence of the object plane in FIG. 47 on the Z-axis.

FIG. 49 shows the dependence of the Z coordinate of the said object point on the pixel coordinate. Referring to FIG. 47 and FIG. 49, in the sub-region having an identification number 4731F, the Z coordinate is given as a constant. This can be considered as the simplest function (i.e., a constant function) of the lateral pixel coordinate J, and it can also be considered as the simplest function of the longitudinal pixel coordinate I. In sub-regions having pixel coordinates 4731L and 4731R, the Z coordinate of the said object points is given as a sole function of the lateral pixel coordinate J. Furthermore, in sub-regions having identification numbers 4731T and 4731B, the Z coordinate of the said object points is given as a sole function of the longitudinal pixel coordinate I. In other words, the Z coordinate of any one object point among the object points corresponding to the said live pixels depends on either the lateral pixel coordinate J or the longitudinal pixel coordinate I, but not simultaneously on both pixel coordinates. On the other hands, the X coordinate of all the object points corresponding to the said live pixels is given as a sole function of the lateral pixel coordinate J, and the Y coordinate is given as a sole function of the longitudinal pixel coordinate I.

A complex image acquisition device according to the third embodiment of the present invention simultaneously providing a generalized horizontal panoramic image and a generalized vertical panoramic image such as this has the following characteristics. Such a complex image acquisition device is comprised of an image acquisition means for acquiring an uncorrected image plane using a camera equipped with a wide-angle lens rotationally symmetric about an optical axis, an image processing means for generating a processed image plane based on the said uncorrected image plane, and an image display means for displaying the said processed image plane. The said uncorrected image plane is a two-dimension array with $K_{max}$ rows and $L_{max}$ columns, and the said processed image plane is a two-dimension array with $I_{max}$ rows and $J_{max}$ columns. The video signal value of a live pixel on the processed image plane having a pixel coordinate (I, J) is given by the video signal value of an imaginary image point on the uncorrected image plane originating from an incident ray coming from an imaginary object point on an imaginary object plane in the world coordinate system having a coordinate $(X_{I,J}, Y_{I,J}, Z_{I,J}) \equiv (X(I, J), Y(I, J), Z(I, J))$. The X coordinate of the said object point in the world coordinate system is given as a sole function of the lateral pixel coordinate J as in Eq. 134, and the Y coordinate of the said object point is given as a sole function of the longitudinal pixel coordinate I as in Eq. 135.

$$X_{I,J} = X(I,J) = X(J) \equiv X_J \quad \text{[Equation 134]}$$

$$Y_{I,J} = Y(I,J) = Y(I) \equiv Y_I \quad \text{[Equation 135]}$$

Furthermore, the Z coordinate of any one object point among the said object points is given as a sole function of the lateral pixel coordinate J as in Eq. 136, or it is given as a sole function of the longitudinal pixel coordinate I as in Eq. 137.

$$Z_{I,J} = Z(I,J) = Z(J) \equiv Z_J \quad \text{[Equation 136]}$$

$$Z_{I,J} = Z(I,J) = Z(I) \equiv Z_I \quad \text{[Equation 137]}$$

Furthermore, the azimuth angle of the said object point in the lateral direction given by the following Eq. 138 is a monotonic function of the lateral pixel coordinate J, and the elevation angle of the said object point in the longitudinal direction given by the following Eq. 139 is a monotonic function of the longitudinal pixel coordinate I.

$$\psi_{I,J} = \tan^{-1}\left(\frac{X_J}{Z_{I,J}}\right) \quad \text{[Equation 138]}$$

$$\delta_{I,J} = \tan^{-1}\left(\frac{Y_I}{\sqrt{X_J^2 + Z_{I,J}^2}}\right) \quad \text{[Equation 139]}$$

Furthermore, the said object plane satisfies Eq. 140 and Eq. 141 on differentiable regions.

$$\left(\frac{\partial X_J}{\partial J}\right)^2 + \left(\frac{\partial Z_{I,J}}{\partial J}\right)^2 = 1 \quad \text{[Equation 140]}$$

$$\left(\frac{\partial Y_I}{\partial I}\right)^2 + \left(\frac{\partial Z_{I,J}}{\partial I}\right)^2 = 1 \quad \text{[Equation 141]}$$

Fourth Embodiment

The shape of an imaginary object plane employed in a panoramic imaging system following a cylindrical projection scheme is given by the following Eq. 142 through Eq. 146. Here, $\psi_1$ is a horizontal incidence angle (i.e., the longitude) of an incident ray originating from an object point having a lateral pixel coordinate J=1, and $\psi_{J_{max}}$ is a horizontal incidence angle of an incident ray originating from an object point having a lateral pixel coordinate $J=J_{max}$.

$$\rho = \frac{J_{max} - 1}{\psi_{J_{max}} - \psi_1} \equiv \frac{J_{max} - 1}{\Delta\psi} \quad \text{[Equation 142]}$$

$$\psi_{I,J} = \frac{J - J_o}{\rho} \quad \text{[Equation 143]}$$

$$X_{I,J} = \rho\sin\left(\frac{J - J_o}{\rho}\right) \quad \text{[Equation 144]}$$

$$Z_{I,J} = \rho\cos\left(\frac{J - J_o}{\rho}\right) \quad \text{[Equation 145]}$$

$$Y_{I,J} = I - I_o \quad \text{[Equation 146]}$$

Such a shape of the object plane satisfies mathematical equations given in Eq. 111 and Eq. 112. On the other hand, an object plane employed in a panoramic imaging system following an equi-rectangular projection scheme satisfies Eq. 142 through Eq. 145 and the following Eq. 147.

$$Y_{I,J} = \rho\tan\left(\frac{I - I_o}{\rho}\right) \quad \text{[Equation 147]}$$

Furthermore, an object plane employed in a panoramic imaging system following a Mercator projection scheme satisfies Eq. 142 through Eq. 145 and the following Eq. 148.

$$Y_{I,J} = \rho\sinh\left(\frac{I - I_o}{\rho}\right) \quad \text{[Equation 148]}$$

The X and the Z coordinates of object points on object planes following these cylindrical projection scheme, equi-rectangular projection scheme, or Mercator projection scheme are given as sole functions of the lateral pixel coordinate J, and the Y coordinate is given as a sole function of the longitudinal pixel coordinate I. Furthermore, object planes following these Mercator projection scheme or equi-rectangular projection scheme do not have simple geometrical meanings such as the one given in the first embodiment of the present invention. In other words, Eq. 111 or Eq. 149 is satisfied along the lateral direction, but there is no corresponding equation for the longitudinal direction.

$$\left(\frac{\partial X_J}{\partial J}\right)^2 + \left(\frac{\partial Z_J}{\partial J}\right)^2 = 1 \quad \text{[Equation 149]}$$

$$\left(\frac{\partial Y_I}{\partial I}\right)^2 \neq 1 \quad \text{[Equation 150]}$$

Shapes of object planes employed in panoramic imaging systems providing the most general horizontal panoramic images including the one given in the first embodiment of the present invention are obtained by removing the constraints given by Eq. 111 and Eq. 112. In other words, the shape of the object plane in the fourth embodiment is obtained by setting-up the three-dimensional coordinate (X(I, J), Y(I, J), Z(I, J)) of the object point Q in the world coordinate system corresponding to each pixel (I, J) on the processed image plane. A generalized horizontal panoramic image can be obtained using Eq. 66 through Eq. 77 except for Eq. 71 and Eq. 72, or Eq. 111 and Eq. 112, for each and every object point.

In the same manner, for an imaging system providing a generalized vertical panoramic image, or a complex image simultaneously containing a generalized horizontal panoramic image and a generalized vertical panoramic image, the most general imaging system can be realized by removing the constraints given by Eq. 140 and Eq. 141 in the third embodiment. However, for the provided image to be a desirable one, several conditions such as provided in the third embodiment of the present invention must be satisfied.

Fifth Embodiment

In the first through the fourth embodiments, image processing methods for obtaining processed image planes corresponding to general shapes of object planes are provided. However, in a case where the object plane does not have a simple geometrical meaning as in the fourth embodiment, an image processing method which does not require an imaginary object plane can be simpler. In this case, a zenith angle $\theta$ and an azimuth angle $\phi$ of an incident ray can be directly set-up for every live pixel (I, J) on the processed image plane. Therefore, as in Eq. 151 and Eq. 152, a zenith angle $\theta$ and an azimuth angle $\phi$ of an incident ray can be directly set-up for every live pixel (I, J) on the processed image plane.

$$\theta_{I,J} = \theta(I,J) \quad \text{[Equation 151]}$$

$$\phi_{I,J} = \phi(I,J) \quad \text{[Equation 152]}$$

Using the real projection scheme of the fisheye lens given by Eq. 66 and the magnification ratio g of the image given by Eq. 67, the pixel coordinate of an imaginary image point on the uncorrected image plane corresponding to such zenith and azimuth angles of an incident ray can be obtained using Eq. 153 through Eq. 154.

$$x'_{I,J} = L_o + gr(\theta_{I,J})\cos\phi_{I,J} \quad \text{[Equation 153]}$$

$$y'_{I,J} = K_o + gr(\theta_{I,J})\sin\phi_{I,J} \quad \text{[Equation 154]}$$

A fisheye image following a stereographic projection scheme can be considered as a useful example of the fifth embodiment. Most of the fisheye lenses are manufactured as to follow equidistance projection schemes. However, the real projection scheme of a fisheye lens shows a certain amount of error with an ideal equidistance projection scheme. On the other hand, a fisheye image that appears most natural to the naked eye is a fisheye image following a stereographic projection scheme, and the image height of a fisheye image following a stereographic projection scheme is given by Eq. 155.

$$r''(\theta) = \frac{r''_2}{\tan\left(\frac{\theta_2}{2}\right)}\tan\left(\frac{\theta}{2}\right) \quad \text{[Equation 155]}$$

Here, $r''(\theta)$ is an image height on the processed image plane corresponding to the zenith angle $\theta$ measured in pixel distances. From now on, to distinguish between the physical image height on an image sensor plane and the image height measured in pixel distances, the former will be referred to as an image height and the latter will be referred to as a pixel distance. On the other hand, $\theta_2$ is a reference zenith angle in a fisheye image, and $r''_2$ is a pixel distance corresponding to this reference zenith angle. In general, the maximum zenith angle in a fisheye image can be set-up as a reference zenith angle, but it is not a mandatory requirement. On the other hand, a pixel distance $r''_{I,J}$ corresponding to a pixel (I, J) is given by Eq. 156.

$$r''_{I,J} = r''(\theta_{I,J}) = \sqrt{(I-I_o)^2 + (J-J_o)^2} \quad \text{[Equation 156]}$$

Therefore, the zenith angle of an incident ray corresponding to a pixel distance $r''_{I,J}$ on a fisheye image following a stereographic projection scheme is given by Eq. 157.

$$\theta(I, J) = 2\tan^{-1}\left[\frac{\tan\left(\frac{\theta_2}{2}\right)}{r''_2} r''_{I,J}\right] \quad \text{[Equation 157]}$$

On the other hand, the azimuth angle of the incident ray is given by Eq. 158.

$$\phi(I, J) = \tan^{-1}\left(\frac{I - I_o}{J - J_o}\right) \quad \text{[Equation 158]}$$

Figure 50:
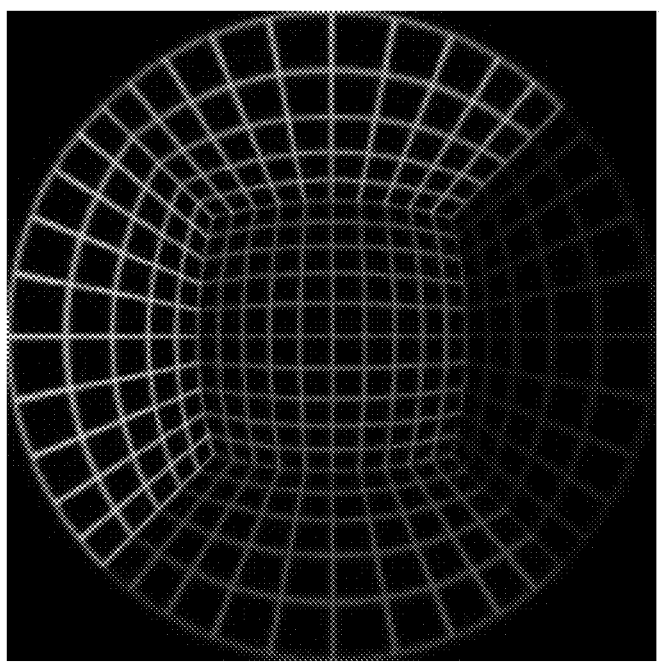
FIG. 50 is an example of a fisheye image following a stereographic projection scheme which has been extracted from FIG. 51 according to the fifth embodiment of the current invention.
Figure 51:
FIG. 51 is an exemplary image of an interior scene captured using a fisheye lens of the invention of a prior art.
Figure 52:
FIG. 52 is an example of a fisheye image following a stereographic projection scheme which has been extracted from FIG. 51 according to the fifth embodiment of the current invention.

FIG. 50 is a stereographic fisheye image extracted from the fisheye image in FIG. 5. Such an imaging system provides desirable fisheye images when fisheye images have to be observed with bare eyes. On the other hand, FIG. 51 is another interior scene captured using a fisheye lens having a FOV of 190° installed on an interior ceiling, and FIG. 52 is a stereographic fisheye image extracted from FIG. 51. The parameters are given as $I_{max} = J_{max} = 800$, $r''_2 = J_{max} - J_o$, and $\theta_2 = 90°$.

On the other hand, an ideal equidistance projection scheme is given by Eq. 159.

$$r''(\theta) = \frac{r''_2}{\theta_2}\theta \quad \text{[Equation 159]}$$

Therefore, in order to obtain a fisheye image following a mathematically precise equidistance projection scheme from a fisheye image exhibiting a certain amount of error with an ideal equidistance projection scheme, the zenith angle of an incident ray corresponding to a pixel coordinate (I, J) on the processed image plane can be obtained using Eq. 160, and the azimuth angle can be obtained using Eq. 158.

$$\theta(I, J) = \frac{\theta_2}{r''_2} r''_{I,J} \quad \text{[Equation 160]}$$

Figure 53:
FIG. 53 is an example of a fisheye image following an equidistance projection scheme which has been extracted from FIG. 5 according to the fifth embodiment of the current invention.

FIG. 53 is a fisheye image following an equidistance projection scheme extracted from the fisheye image in FIG. 51. Such an imaging system can be used to obtain precise all sky images in special areas such as stellar observatory or air traffic control.

Sixth Embodiment

In the fifth embodiment, a zenith angle θ and an azimuth angle φ have been directly set-up for every live pixel (I, J) on the processed image plane. However, setting-up the zenith angles and the azimuth angles of incident rays corresponding to a desirable complex image including a panoramic image can be considerably difficult. In a complex image similar to a panoramic image, the zenith angle and the azimuth angle of an incident rays corresponding to such a complex image may not be intuitively obvious, but the horizontal incident angle (i.e., the azimuth angle) ψ and the vertical incident angle (i.e., the elevation angle) δ may be definable in an obvious manner. Therefore, an image processing algorithm given in Eq. 161 and Eq. 162 can be more desirable which sets up the horizontal incidence angle ψ and the vertical incidence angle δ of an incident ray corresponding to each and every pixel (I, J) on the processed image plane.

$$\psi_{I,J} = \psi(I,J) \quad \text{[Equation 161]}$$

$$\delta_{I,J} = \delta(I,J) \quad \text{[Equation 162]}$$

From the horizontal incidence angle ψ and the vertical incidence angle δ of an incident ray, the azimuth angle of the incident ray can be obtained from Eq. 163 and the zenith angle of the incident ray can be obtained from Eq. 164.

$$\phi_{I,J} = \tan^{-1}\left(\frac{\tan\delta_{I,J}}{\sin\psi_{I,J}}\right) \quad \text{[Equation 163]}$$

$$\theta_{I,J} = \cos^{-1}(\cos\delta_{I,J}\cos\psi_{I,J}) \quad \text{[Equation 164]}$$

The coordinate of the image point on the uncorrected image plane corresponding to these azimuth angle and zenith angle of an incident ray can be obtained using Eq. 165 and Eq. 166.

$$x'_{I,J} = L_o + gr(\theta_{I,J})\cos\phi_{I,J} \quad \text{[Equation 165]}$$

$$y'_{I,J} = K_o + gr(\theta_{I,J})\sin\phi_{I,J} \quad \text{[Equation 166]}$$

Figure 54:
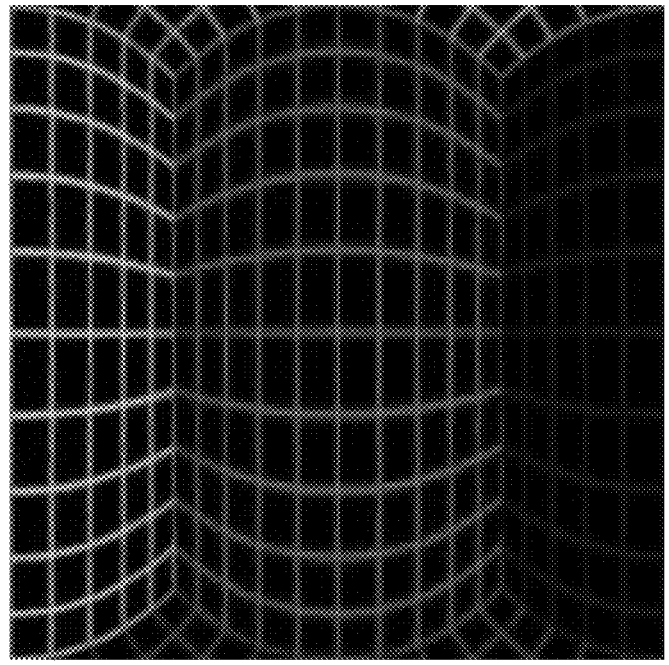
FIG. 54 is another example of a complex image which has been extracted from FIG. 5 according to the sixth embodiment of the current invention.

FIG. 54 is a complex image having a horizontal incidence angle ψ given by Eq. 167 and a vertical incidence angle δ given by Eq. 168 extracted from the fisheye image in FIG. 5.

$$\psi(J) = \pi\left\{\frac{J-1}{J_{max}-1} - \frac{1}{2}\right\} \quad \text{[Equation 167]}$$

$$\delta(I) = \frac{\pi}{2}\left\{\frac{I-1}{I_{max}-1} - \frac{1}{2}\right\} \quad \text{[Equation 168]}$$

For such an imaging system, the desired purpose can be accomplished by forcing the field of view of the image displayed on the monitor screen, or in other words, the angular range of the incident rays corresponding to live pixels on the processed image plane. For example, although the lateral size of the processed image plane is the same as the longitudinal size in FIG. 54, the represented FOV is 180° along the lateral direction, and 90° along the longitudinal direction.

In these algorithms, the horizontal incidence angle and the vertical incidence angle can be given as arbitrary functions of the lateral pixel coordinate J and the longitudinal pixel coordinate I. However, complex images obtained under these conditions may not be desirable. To obtain desirable images along the line of panoramic images, it will be desirable that the horizontal incidence angle is given as a sole function of the lateral pixel coordinate J as in Eq. 167, and the vertical incidence angle is given as a sole function of the longitudinal pixel coordinate I as in Eq. 168.

Seventh Embodiment

The first through the sixth embodiments of the present invention provide complex image acquisition devices using image processing algorithms for obtaining desirable complex images. However, if it is not necessary to change the projection scheme of the processed image plane as in digital pan•tilt technology, and the demand for the imaging system is large, then pixel disposition in a CMOS image sensor plane can be changed so that a desirable complex image can be obtained without additional image processing. This case can be considered as a hard-wired image processing. In this case, the CMOS image sensor must be manufactured as a set with the wide-angle lens that will be used together.

The center coordinate $(x_{I,J}, y_{I,J})$ of each pixel on an image sensor plane of a CMOS image sensor for obtaining horizontal panoramic images without additional software image processing can be obtained as follows. First, if the CMOS image sensor has $I_{max}$ rows and $J_{max}$ columns, and if it is desired to obtain a panoramic image having a horizontal FOV of $\Delta\psi$, then the radius of the imaginary object plane is given by Eq. 169.

$$\rho = \frac{J_{max} - 1}{\Delta\psi} \quad \text{[Equation 169]}$$

Here, the horizontal FOV $\Delta\psi$ of the said panoramic image must be larger than 0 and smaller than $2\pi$.

A CMOS image sensor can exist as a commodity independent from a fisheye lens. In a CMOS image sensor separated from a fisheye lens, the location of the optical axis is a reference point on the image sensor plane of the CMOS image sensor, and this reference point is used as the origin of the first rectangular coordinate system describing the center positions of pixels. Furthermore, the real projection scheme of a fisheye lens or a wide-angle lens can be considered as a monotonically increasing function $r=r(\theta)$ of an angle $\theta$ passing through the origin.

If the location of the optical axis of a fisheye lens, that is used along with the CMOS image sensor, on the image sensor plane of the CMOS image sensor corresponds to a lateral pixel coordinate $J_o$ and a longitudinal pixel coordinate $I_o$, then the horizontal incidence angle of an incident ray impinging on the pixel P(I, J) having a lateral pixel coordinate J and a longitudinal pixel coordinate I must be given by Eq. 170.

$$\psi_J = \frac{J - J_o}{\rho} \quad \text{[Equation 170]}$$

Furthermore, the coordinate of an object point on the imaginary object plane corresponding to this pixel is given by Eq. 171 through Eq. 173.

$$X_J = \rho \sin\left(\frac{J - J_o}{\rho}\right) \quad \text{[Equation 171]}$$

$$Z_J = \rho \cos\left(\frac{J - J_o}{\rho}\right) \quad \text{[Equation 172]}$$

$$Y_I = F(I) \quad \text{[Equation 173]}$$

Here, F(I) is a monotonically increasing function of the longitudinal pixel coordinate I passing through the origin, and it must satisfy Eq. 174 and Eq. 175.

$$F(I) = 0 \quad \text{[Equation 174]}$$

$$\frac{\partial F(I)}{\partial I} > 0 \quad \text{[Equation 175]}$$

If the panoramic image follows a cylindrical projection scheme, then the said function F(I) is given by Eq. 176.

$$F(I) = I - I_o \quad \text{[Equation 176]}$$

On the other hand, if the panoramic image follows an equi-rectangular projection scheme, then the said function F(I) is given by Eq. 177, and if the panoramic image follows a Mercator projection scheme, then the said function F(I) is given by Eq. 178.

$$F(I) = \rho \tan\left(\frac{I - I_o}{\rho}\right) \quad \text{[Equation 177]}$$

$$F(I) = \rho \sinh\left(\frac{I - I_o}{\rho}\right) \quad \text{[Equation 178]}$$

On the other hand, the center coordinate of a pixel on the said image sensor plane is given as $(x_{I,J}, y_{I,J})$ in the first rectangular coordinate system. The said first rectangular coordinate system takes the said location of the optical axis as the reference point, and takes an axis that passes through the said reference point and is parallel to the sides of the image sensor plane along the lateral direction as the x-axis. The positive(+) x-axis runs from the left side of the said image sensor plane to the right side. Furthermore, an axis that passes through the said reference point and is parallel to the sides of the image sensor plane along the longitudinal direction is taken as the y-axis. The positive(+) y-axis runs from the top end of the said image sensor plane to the bottom end. The relations among the image sensor plane, the object plane, the world coordinate system, and the first rectangular coordinate system can be easily understood with reference to FIG. 35.

However, there is one point that has to be kept in mind. When an object in the world coordinate system forms an image on the CMOS image sensor plane by the image forming properties of the wide-angle lens, the resulting image is an upside-down image. Since an upside-down image is difficult to be recognized, the image is deliberately inverted again so that the direction of the image appears normal. Therefore, it has to be understood that a process for inverting the top and the bottom of an image has been implicitly taken in the coordinate systems of FIG. 35.

The coordinate of the said reference point in this first rectangular coordinate system is (0, 0), and the center coordinate of the said pixel is given by the following Eq. 179 through Eq. 183.

$$\phi_{I,J} = \tan^{-1}\left(\frac{Y_I}{X_J}\right) \quad \text{[Equation 179]}$$

$$\theta_{I,J} = \cos^{-1}\left(\frac{Z_J}{\sqrt{X_J^2 + Y_I^2 + Z_J^2}}\right) \quad \text{[Equation 180]}$$

$$r_{I,J} = r(\theta_{I,J}) \quad \text{[Equation 181]}$$

-continued $$x_{I,J} = r_{I,J}\cos\phi_{I,J} \quad \text{[Equation 182]}$$

$$y_{I,J} = r_{I,J}\sin\phi_{I,J} \quad \text{[Equation 183]}$$

Here, r(θ) is a monotonically increasing function of an angle θ passing through the origin and it must satisfy Eq. 184 and Eq. 185.

$$r(0) = 0 \quad \text{[Equation 184]}$$

$$\frac{\partial r(\theta)}{\partial \theta} > 0 \quad \text{[Equation 185]}$$

Specifically, r(θ) is the real projection scheme of a wide-angle lens that is used along with the CMOS image sensor, and is an image height r given as a function of the zenith angle θ of an incident ray.

Figure 55:
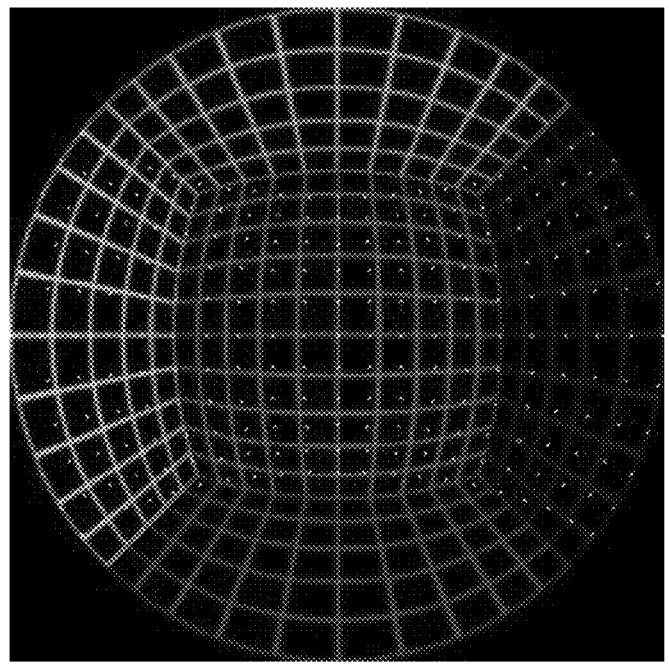
FIG. 55 is an exemplary disposition of pixel centers on a CMOS image sensor plane according to the seventh embodiment of the current invention.
Figure 56:
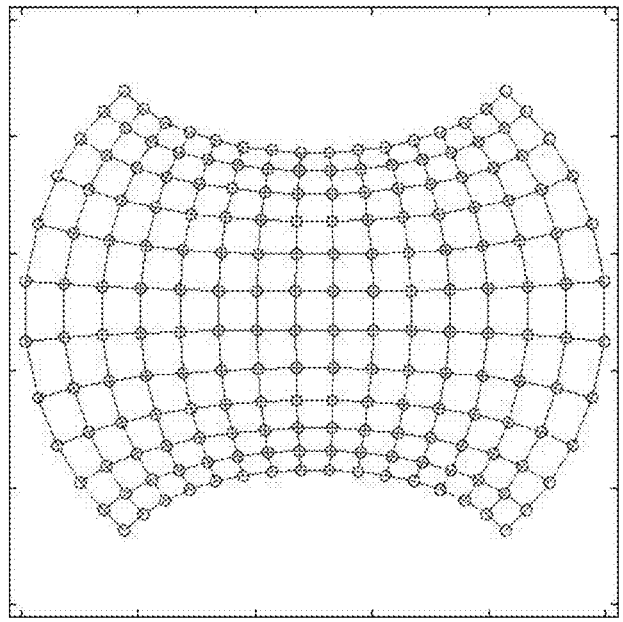
FIG. 56 is a drawing showing the pixels in FIG. 55 only.

FIG. 55 is the fisheye image in FIG. 5 overlapped with the locations of pixels necessary to obtain a panoramic image having a horizontal FOV of 180° and following a cylindrical projection scheme from the fisheye image in FIG. 5 following an equidistance projection scheme. Here, it has been assumed that $J_{max}$=16 and $I_{max}$=12, which correspond to a VGA-grade image having 480 rows and 640 columns with a width:height ratio of 4:3 reduced to 1/40 of the original size. On the other hands, FIG. 56 is a diagram where only pixels are drawn. Here, all pixels having identical column number J are lying on a curve which is stretched along the longitudinal direction, and likewise, all pixels having identical row number I are lying on a curve which is stretched along the lateral direction.

Figure 57:
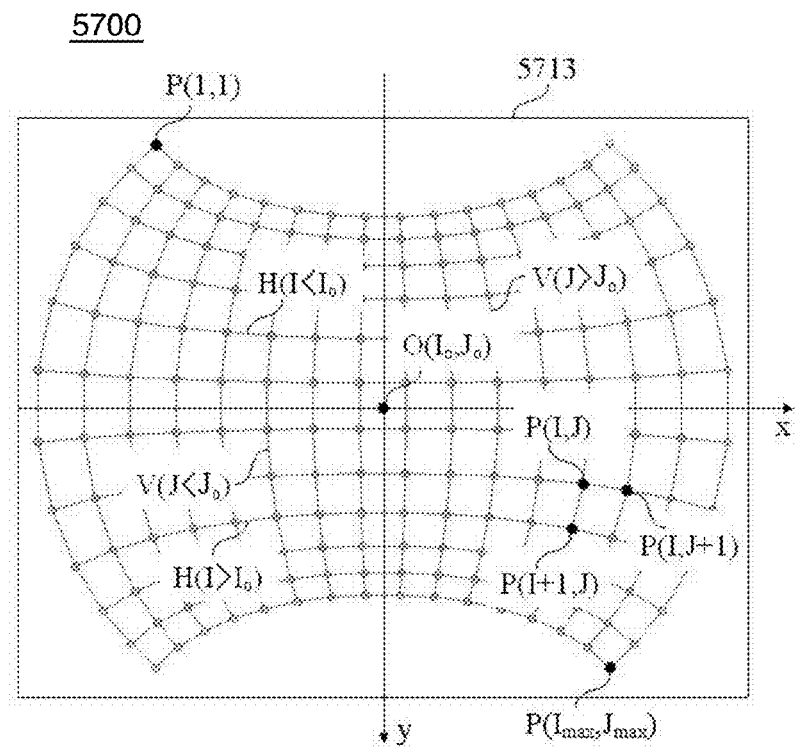
FIG. 57 is a diagram for understanding the pixel distribution on the image sensor plane in a CMOS image sensor according to the seventh embodiment of the current invention.

FIG. 57 is a diagram for understanding the pixel arrangements in FIG. 56 in more details. Such a CMOS image sensor for panoramic imaging system includes within its sensor plane(5713) a multitude of pixels given in a form of an array having $I_{max}$ rows and $J_{max}$ columns. Said CMOS image sensor has a reference point having a row number $I_o$ and a column number $J_o$, and this reference point is the location of the optical axis of a fisheye lens that is used along with the CMOS image sensor. Since the location of the optical axis does not have to coincide with the position of any one pixel, the said row number $I_o$ is a real number larger than 1 and smaller than $I_{max}$, and the said column number $J_o$ is a real number larger than 1 and smaller than $J_{max}$. However, the row number I and the column number J of any one pixel P(I, J) are both natural numbers.

The location of any one pixel is described by the first rectangular coordinate system, wherein an axis that passes through the said reference point O and is parallel to the sides of the image sensor plane along the lateral direction is taken as the x-axis. The positive(+) x-axis runs from the left side of the said image sensor plane to the right side. Likewise, an axis that passes through the said reference point and is parallel to the sides of the image sensor plane along the longitudinal direction is taken as the y-axis. The positive(+) y-axis runs from the top end of the image sensor plane to the bottom end. Therefore, the coordinate of the said reference point is given by (0, 0), and the center coordinate of a pixel P(I, J) having a row number I and a column J are given as $(x_{I,J}, y_{I,J})$. It has to be kept in mind that two kinds of coordinates are used here. One is a pixel coordinate measured in pixel units in a digitized digital image, and another is a physical coordinate describing the location of a real pixel in the image sensor plane. A photodiode in an actual pixel has a finite area, and a position corresponding to the center of mass of this photodiode is considered as the center coordinate of the pixel. For convenience, the center coordinate of a pixel can be described in unit of millimeters. However, it has to be reminded that a pixel coordinate has no unit. Furthermore, although the arrangement of the center positions of the real pixels in FIG. 57 looks like a spool, it is a nicely ordered matrix in the viewpoint of a digital image much like a chess board.

Recently, technology developments are actively underway in order to increase the dynamic range of CMOS image sensors, and such image sensors are referred by various names such as HDR(High Dynamic Range) or WDR (Wide Dynamic Range) sensors. Various methods are used to realize such technologies. As one method, for example, every pixel is comprised of a larger photodiode and a smaller photodiode, and dynamic range can be increased by proper image processing. In other words, an image solely obtained from photodiodes with smaller areas will be adequately exposed to bright objects, and an image solely obtained from photodiodes with larger areas will be adequately exposed to dark objects. Therefore, by mixing these two images, an image can be obtained that is adequately exposed simultaneously to bright objects and to dark objects. In a case using such technologies, the center coordinate of a pixel according to the current invention must be interpreted as the center of mass of entire photodiode including the photodiode with a larger area and the photodiode with a smaller area.

When pixels having an identical row number I are all joined together by connecting adjacent pixels with line segments, the overall shape becomes a curve H(I) passing all the said pixels that is substantially stretched along the lateral direction. Likewise, when pixels having an identical column number J are all joined together by connecting adjacent pixels with line segments, the overall shape becomes a curve V(J) passing all the said pixels that is substantially stretched along the longitudinal direction. Pixels having an identical row number are simultaneously accessed by the vertical shift register, and pixels having an identical column number are simultaneously accessed by the horizontal shift register.

In a CMOS image sensor for obtaining such horizontal panoramic images, pixels P(I, J<$J_o$) belonging to a column with the column number J smaller than $J_o$ form a curve V(J<$J_o$) open toward the positive x-axis, and pixels P(I, J>$J_o$) belonging to a column with the column number J larger than $J_o$ form a curve V(J>$J_o$) open toward the negative x-axis. If the column number $J_o$ of the optical axis is given as a natural number, then pixels P(I, $J_o$) belonging to a column with the column number J equal to $J_o$ form not a curve but a vertical line.

Likewise, pixels P(I<$I_o$, J) belonging to a row with the row number I smaller than $I_o$ form a curve H(I<$I_o$) open toward the negative y-axis, and pixels P(I>$I_o$, J) belonging to a row with the row number I larger than $I_o$ form a curve open toward the positive y-axis. If the row number $I_o$ of the optical axis is given as a natural number, then pixels P($I_o$, J) belonging to a row with 1 equal to $I_o$ form not a curve but a horizontal line.

Figure 58:
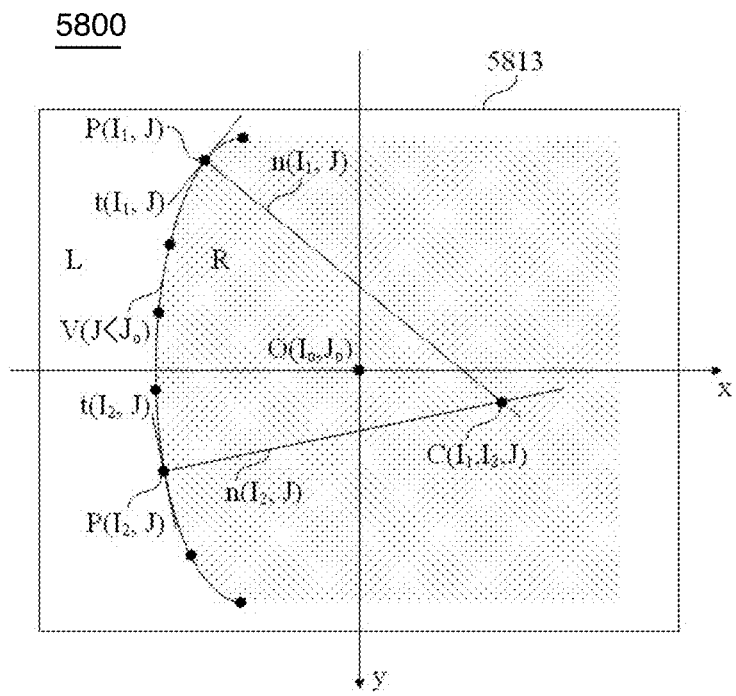
FIG. 58 is a conceptual diagram for understanding the direction of an open curved line in the current invention.

FIG. 58 is a schematic diagram for clearly understanding the notion of a curve open toward one direction in the current invention. On the image sensor plane in FIG. 58, the said reference point lies at the intersection point between the x-axis and the y-axis, and a hypothetical pixel coordinate for the reference point is ($I_o$, $J_o$). When pixels having a column number J smaller than $J_o$ are all joined together by connecting neighboring pixels with line segments, it takes the shape of a curve substantially stretched along the longitudinal direction. A smooth curve passing all the pixels, such as a Spline curve, will be called as V(J). Roughly speaking, the left side L of the curve can be differentiated from the right side R with reference to this curve.

In FIG. 58, since the column number J is smaller than $J_o$, the said reference point $(I_o, J_o)$ lies at the right side R of the said curve. The reference point can be equally described as to lie at the positive(+) x-axis direction. On the other hand, arbitrary two pixels $P(I_1, J)$ and $P(I_2, J)$ lying on the said curve V(J) are considered. The first tangent line $t(I_1, J)$ passing through the first pixel $P(I_1, J)$ and the tangent line $t(I_2, J)$ passing through the second pixel $P(I_2, J)$ are drawn in FIG. 58. Furthermore, the first normal $n(I_1, J)$ passing through the first pixel and perpendicular to the first tangent line, and the second normal $n(I_2, J)$ passing through the second pixel and perpendicular to the second tangent line are also drawn.

The first normal and the second normal may or may not have an intersection point. For example, in an ordinary CMOS image sensor, the said curve V(J) is a straight line along the longitudinal direction, and consequently the first tangent line and the second tangent line are parallel to said curve V(J), and the first normal and the second normal are also parallel to each other. Therefore, the first normal and the second normal do not have an intersection point no matter how far they are extended. On the other hand, in a case where said pixels are not lying on a straight line as in FIG. 58, the first normal and the second normal share one intersection point $C(I_1, I_2, J)$. In the example of FIG. 58, the said intersection point lies at the right side of the said curve much like the said reference point, and at the same time, it lies at the positive x-axis direction. The notion of forming a curve open toward the positive x-axis in the current invention refers to this case. A curve open toward the negative x-axis, or a curve open toward the positive y-axis can be understood in the same manner.

Figure 59:
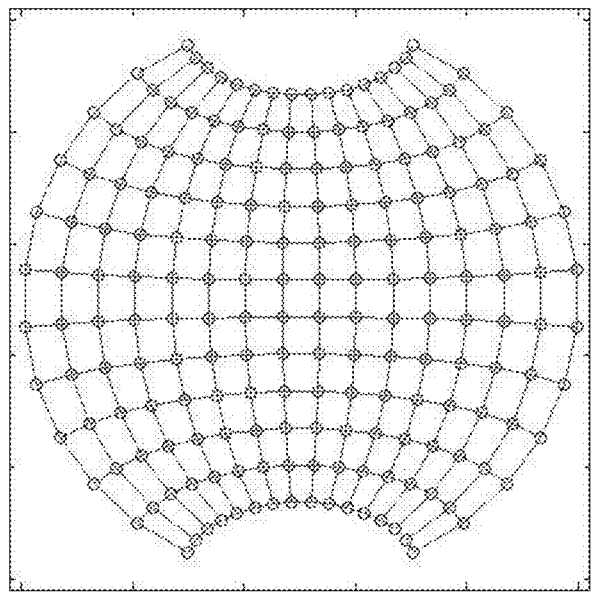
FIG. 59 is an example of pixel distribution on an image sensor plane in a CMOS image sensor following an equirectangular projection scheme according to the seventh embodiment of the current invention.
Figure 60:
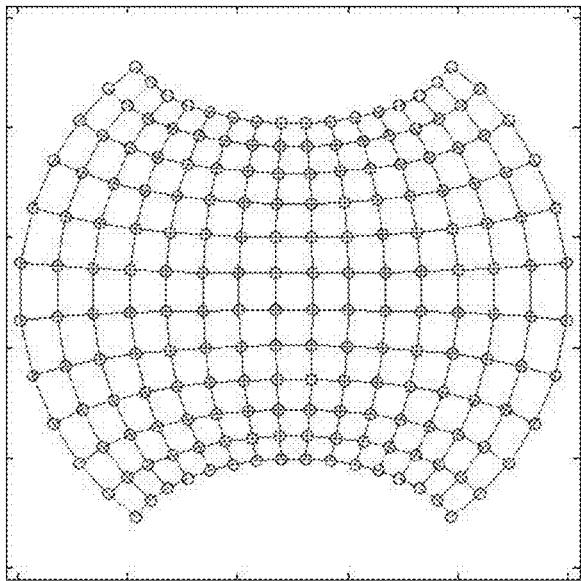
FIG. 60 is an example of pixel distribution on an image sensor plane in a CMOS image sensor following a Mercator projection scheme according to the seventh embodiment of the current invention.

On the other hand, FIG. 59 shows a pixel disposition in a CMOS image sensor for obtaining panoramic images having an equi-rectangular projection scheme, and FIG. 60 shows a pixel disposition in a CMOS image sensor for obtaining panoramic images having a Mercator projection scheme. Comparing FIG. 57, FIG. 59 and FIG. 60, it can be noticed that structures of CMOS image sensors for obtaining horizontal panoramic images are similar to each other.

Figure 61:
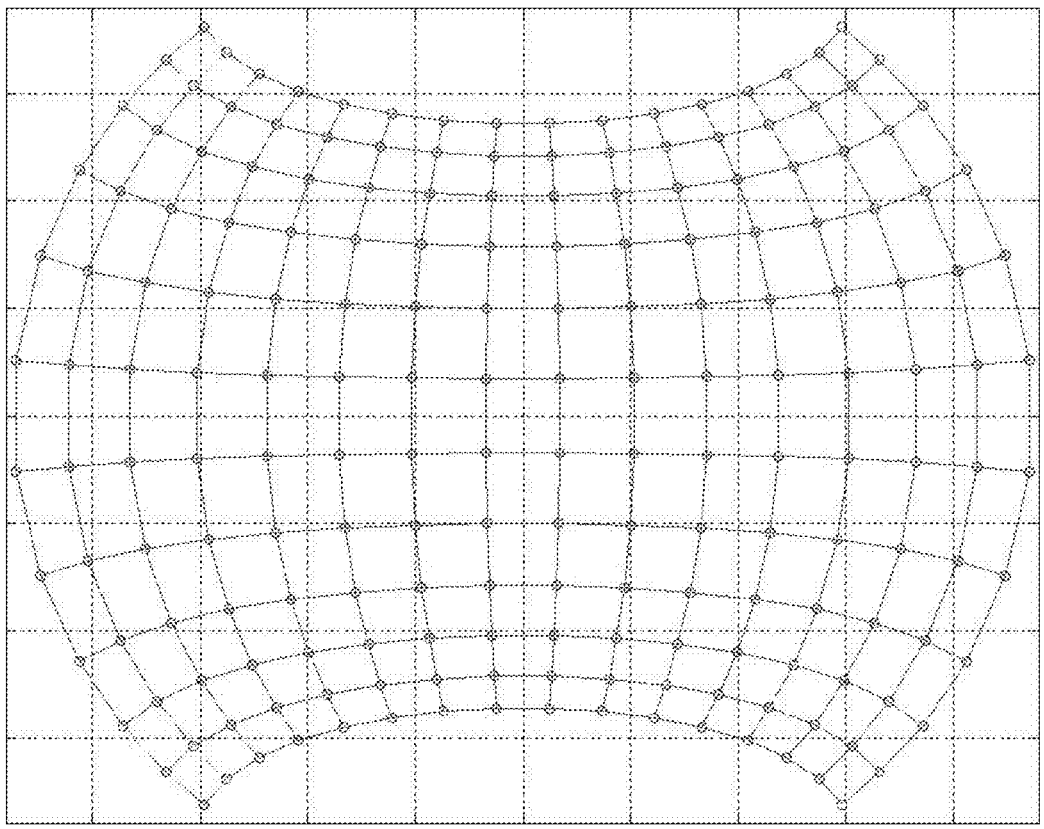
FIG. 61 is an example of pixel distribution on an image sensor plane in a CMOS image sensor following a cylindrical projection scheme according to the seventh embodiment of the current invention, where the real distortion characteristics of a lens are reflected in the pixel distribution.

On the other hand, FIG. 61 shows a pixel disposition in a CMOS image sensor for obtaining a panoramic image following a cylindrical projection scheme with 190° horizontal FOV using a fisheye lens from the invention of a prior art. The CMOS image sensor has been assumed that the length of the image sensor plane along the lateral direction is 4.8 mm, and the length along the longitudinal direction is 3.6 mm. From FIG. 61, it can be seen that the structure has not been significantly changed even though the calibrated distortion of the said fisheye lens has been taken into account.

Eighth Embodiment

Provided in the seventh embodiment of the current invention are CMOS image sensors for obtaining horizontal panoramic images without additional software image processing. Similar to this, the center coordinate $(x_{I,J}, y_{I,J})$ of each pixel in a CMOS image sensor for obtaining rectilinear images without additional software image processing can be obtained by the following methods. First, assume that the CMOS image sensor has $I_{max}$ rows and $J_{max}$ columns, and further assume that it is desired to obtain a rectilinear image with a horizontal FOV of $\Delta\psi$. Then, the distance s" from the origin of the world coordinate system to the hypothetical object plane is given by the following Eq. 186.

$$s'' = \frac{J_{max} - 1}{2\tan\left(\frac{\Delta\psi}{2}\right)} \qquad \text{[Equation 186]}$$

Here, due to the mathematical nature of rectilinear images, the horizontal FOV $\Delta\psi$ of the said rectilinear image must be larger than 0 and smaller than π.

Regarding the wide-angle lens that is used as a set with the CMOS image sensor, let's further assume that the location of the optical axis of the wide-angle lens on the image sensor plane corresponds to a lateral pixel coordinate $J_o$ and a longitudinal pixel coordinate $I_o$. Then, the zenith angle of an incident ray impinging on a pixel P(I, J) having a lateral pixel coordinate J and a longitudinal pixel coordinate I is given by Eq. 187, and the azimuth angle must be given by Eq. 188.

$$\theta_{I,J} = \tan^{-1}\left\{\frac{\sqrt{(I - I_o)^2 + (J - J_o)^2}}{s''}\right\} \qquad \text{[Equation 187]}$$

$$\phi_{I,J} = \tan^{-1}\left(\frac{I - I_o}{J - J_o}\right) \qquad \text{[Equation 188]}$$

From this, the center coordinate $(x_{I,J}, y_{I,J})$ of the said pixel is given by the following Eq. 189 through Eq. 191.

$$r_{I,J} = r(\theta_{I,J}) \qquad \text{[Equation 189]}$$

$$x_{I,J} = r_{I,J}\cos(\phi_{I,J}) \qquad \text{[Equation 190]}$$

$$y_{I,J} = r_{I,J}\sin(\phi_{I,J}) \qquad \text{[Equation 191]}$$

Here, $r(\theta)$ is a monotonically increasing function of the angle θ passing through the origin and must satisfy Eq. 192 and Eq. 193.

$$r(0) = 0 \qquad \text{[Equation 192]}$$

$$\frac{\partial r(\theta)}{\partial \theta} > 0 \qquad \text{[Equation 193]}$$

Specifically, $r(\theta)$ is the real projection scheme of the wide-angle lens that is used along with the CMOS image sensor, and is an image height r given as a function of the zenith angle θ of the incident ray.

Figure 62:
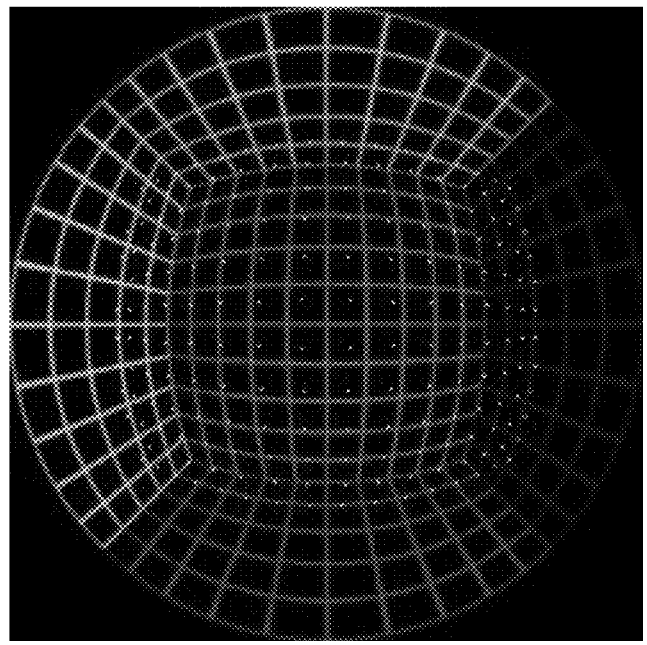
FIG. 62 is an example of pixel distribution on an image sensor plane in a CMOS image sensor following a rectilinear projection scheme according to the eight embodiment of the current invention.
Figure 63:
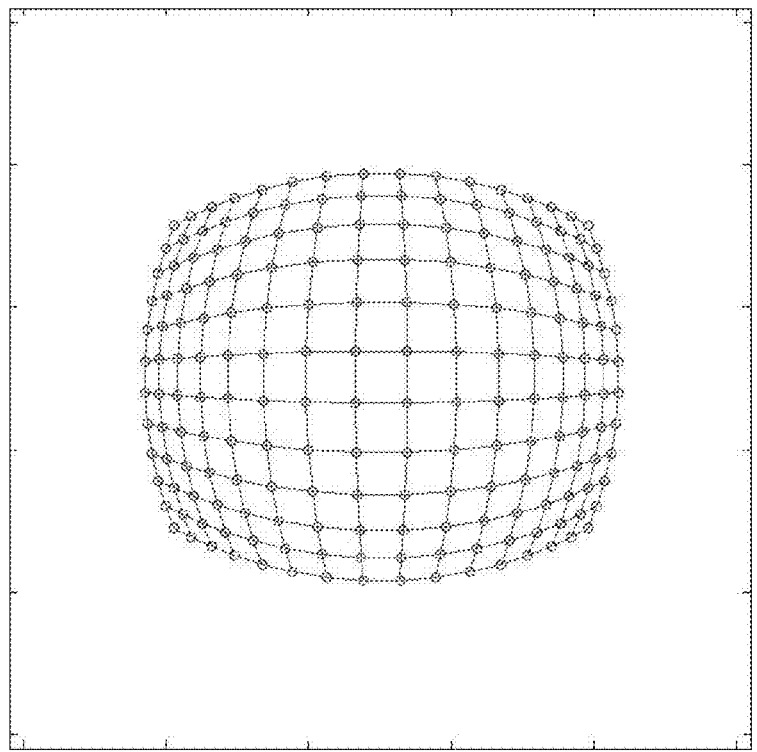
FIG. 63 is an example of pixel distribution on an image sensor plane in a CMOS image sensor following a rectilinear projection scheme according to the eight embodiment of the current invention.

FIG. 62 is a fisheye image in FIG. 5 overlapped with the pixel locations necessary to obtain wide-angle images following a rectilinear projection scheme and having a horizontal FOV of 120° from the fisheye image in FIG. 5 following an equidistance projection scheme. Here, it has been assumed that $J_{max}=16$ and $I_{max}=12$, and the reference point lies at the center of the image sensor plane. On the other hand, FIG. 63 is a diagram showing only the pixels P(I, J). Pixels having an identical column number J are lying on a curve along the longitudinal direction. Likewise, pixels having an identical row number I are lying on a curve along the lateral direction.

In such a CMOS image sensor for obtaining rectilinear images, pixels P(I, J<$J_o$) belonging to a column with the column number J smaller than $J_o$ form a curve open toward the positive x-axis, and pixels P(I, J>$J_o$) belonging to a column with the column number J larger than $J_o$ form a curve open toward the negative x-axis. Likewise, pixels P(I<$I_o$, J) belonging to a row with the row number I smaller than $I_o$ form a curve open toward the positive y-axis, and pixels $P(I>I_o, J)$ belong to a row with the row number I larger than $I_o$ form a curve open toward the negative y-axis.

Ninth Embodiment

The first through the sixth embodiments of the current invention provide complex image acquisition devices using image processing algorithms for obtaining desirable complex images. Also, in these cases, if there are large demands for imaging systems, pixel dispositions in CMOS image sensor planes can be altered to obtain desirable complex images without separate image processing stages.

In this case, the size of the processed image plane, in other words, the number of pixels ($I_{max}$, $J_{max}$) in the CMOS image sensor is determined, and then a projection scheme for all the pixels (I, J) on the said image sensor plane are determined. In other words, zenith angles and azimuth angles of incident rays given by Eq. 151 and Eq. 152 can be assigned or horizontal incident angles in the lateral direction and vertical incident angles in the longitudinal direction given by Eq. 161 and Eq. 162 can be assigned. Or, shapes of the object planes can be assigned as in the first through the fourth embodiments of the current invention.

For example, a CMOS image sensor corresponding to the first embodiment of the current invention is used as a set with a wide-angle imaging lens rotationally symmetric about an optical axis. The said CMOS image sensor has multitude of pixels in the image sensor plane given in a form of an array having $I_{max}$ rows and $J_{max}$ columns. The real projection scheme of the said lens is the image height on the image sensor plane obtained as a function of the zenith angle θ of the corresponding incident ray and given as r=r(θ).

The location of any one pixel in the CMOS image sensor plane is described by the first rectangular coordinate system previously described. Therefore, the center coordinate of a pixel P(I, J) having a row number I and a column number J is given as ($x_{I,J}$, $y_{I,J}$). This center coordinate is the coordinate of a hypothetical image point formed on the said image sensor plane by the said wide-angle lens from an incident ray originating from a hypothetical object point having a coordinate ($X_{I,J}$, $Y_{I,J}$, $Z_{I,J}$)≡(X(I, J), Y(I, J), Z(I, J)) on a hypothetical object plane, and it is given by Eq. 194 through Eq. 202.

$$r = r(\theta) \quad \text{[Equation 194]}$$

$$X_{I,J} = X(I, J) \quad \text{[Equation 195]}$$

$$Y_{I,J} = Y(I, J) \quad \text{[Equation 196]}$$

$$Z_{I,J} = Z(I, J) \quad \text{[Equation 197]}$$

$$\phi_{I,J} = \tan^{-1}\left(\frac{Y_{I,J}}{X_{I,J}}\right) \quad \text{[Equation 198]}$$

$$\theta_{I,J} = \cos^{-1}\left(\frac{Z_{I,J}}{\sqrt{X_{I,J}^2 + Y_{I,J}^2 + Z_{I,J}^2}}\right) \quad \text{[Equation 199]}$$

$$r_{I,J} = r(\theta_{I,J}) \quad \text{[Equation 200]}$$

$$x_{I,J} = r_{I,J}\cos\phi_{I,J} \quad \text{[Equation 201]}$$

$$y_{I,J} = r_{I,J}\sin\phi_{I,J} \quad \text{[Equation 202]}$$

Here, rectangular coordinates given by Eq. 195 through Eq. 197 must satisfy Eq. 203 and Eq. 204.

$$\left(\frac{\partial X_{I,J}}{\partial J}\right)^2 + \left(\frac{\partial Y_{I,J}}{\partial J}\right)^2 + \left(\frac{\partial Z_{I,J}}{\partial J}\right)^2 = 1 \quad \text{[Equation 203]}$$

$$\left(\frac{\partial X_{I,J}}{\partial I}\right)^2 + \left(\frac{\partial Y_{I,J}}{\partial I}\right)^2 + \left(\frac{\partial Z_{I,J}}{\partial I}\right)^2 = 1 \quad \text{[Equation 204]}$$

However, when an object plane is folded, derivatives do not exist on folded points, and Eq. 203 or Eq. 204 cannot hold true. Therefore, the shapes of such object planes can be summarized as follows. The shape of an object plane according to the ninth embodiment of the present invention, in other words, X=X(I, J), Y=Y(I, J) and Z=Z(I, J), are continuous functions of I and J, and satisfy Eq. 203 and Eq. 204 on differentiable points.

Figure 64:
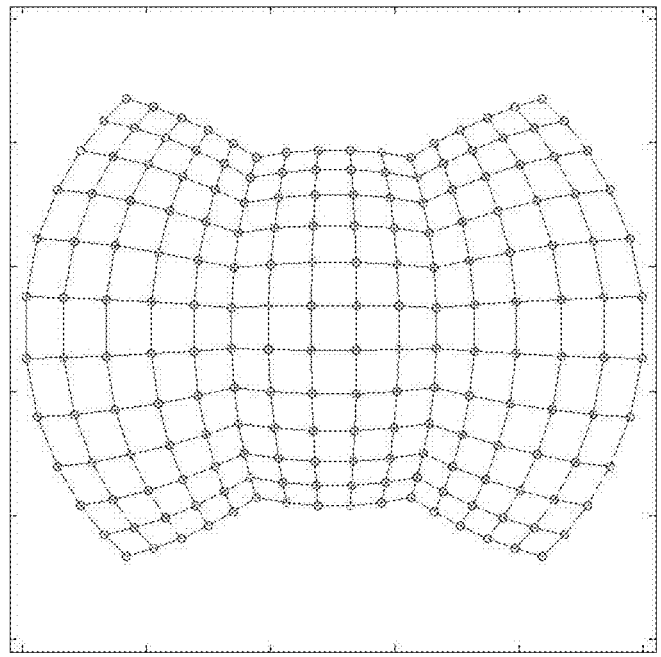
FIG. 64 is an example of pixel distribution on an image sensor plane in a CMOS image sensor following a multiple viewpoint panoramic projection scheme according to the ninth embodiment of the current invention.

Using such a method, a CMOS image sensor which does not require separate image processing can be provided corresponding to any image processing algorithm given in the first through the sixth embodiments. FIG. 64 shows a pixel disposition in a CMOS image sensor for obtaining multiple viewpoint panoramic images corresponding to FIG. 38, and FIG. 65 shows a pixel disposition in a CMOS image sensor for obtaining complex panoramic images corresponding to FIG. 46 through FIG. 49.

Tenth Embodiment

Figure 65:
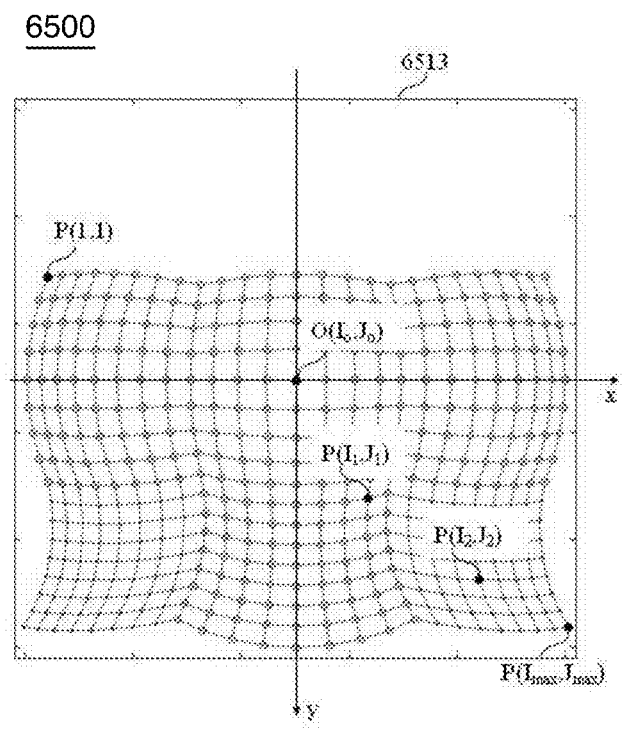
FIG. 65 is an example of pixel distribution on an image sensor plane in a CMOS image sensor following a complex projection scheme according to the ninth embodiment of the current invention.

There are two kinds of pixels in FIG. 65, namely sensitive pixels marked as circles and insensitive pixels marked as dots. The pixel $P(I_1, J_1)$ having a row number $I_1$ and a column number $J_1$ is an example of sensitive pixels, and the pixel $P(I_2, J_2)$ having a row number $I_2$ and a column number $J_2$ is an example of insensitive pixels. Sensitive pixels are pixels normally found in ordinary CMOS image sensors. A sensitive pixel becomes a live pixel in the current invention when there is video signal in the sensitive pixel, and becomes a dormant pixel when there is no video signal.

On the other hand, an insensitive pixel in the current invention refers to a pixel where there is no video signal coming out from the pixel, or when the video signal is relatively very weak. It is not referring to a bad pixel from where no video signal is coming out due to manufacturing errors in CMOS sensor fabrication process. It rather refers to a case where the CMOS sensor is intentionally fabricated so that video signals are not coming out from the selected pixels. Therefore, the part of an image corresponding to insensitive pixels appear dark black, and it has the same effect as can be seen in the lower left and the lower right corners in FIG. 48. Therefore, the lower left and the lower right corners in FIG. 48 may be due to dormant pixels originating from the lack of video signals in normal sensitive pixels. Or, it may be due to the fact that corresponding pixels in the CMOS image sensor are insensitive pixels. Whatever the reason is, there is no difference between the two digital images.

Figure 66:
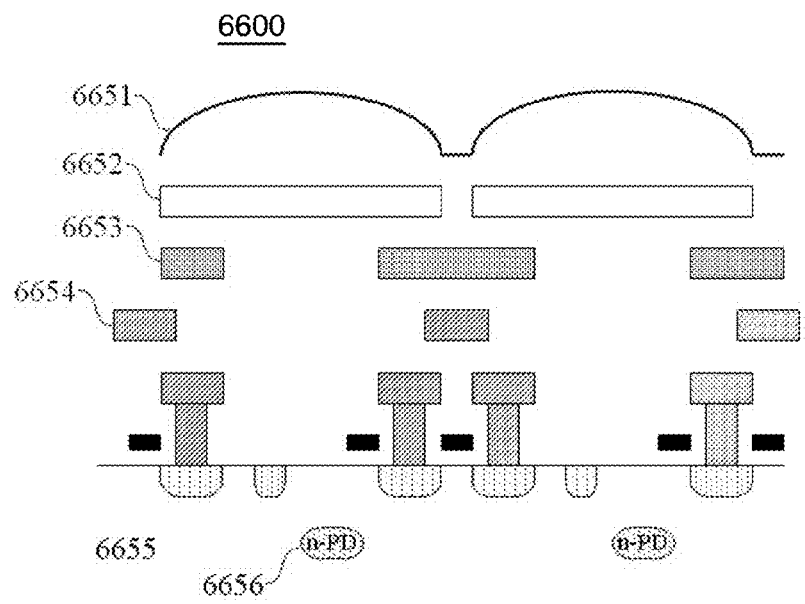
FIG. 66 is a conceptual diagram illustrating the pixel structure in an ordinary CMOS image sensor.

FIG. 66 schematically shows a pixel structure in an ordinary CMOS image sensor. CMOS image sensors are normally produced by forming n-type photodiodes(n-PD: 6656) on a p-type substrate(6655). On the surface of a CMOS image sensor, micro lens(6651) is formed for every pixel. Due to its lens properties, this micro lens takes the role of concentrating rays impinging on the CMOS image sensor toward the photodiode(6656). Under the micro lens lies a color filter(6652) which lets through only one color among the three primary colors. The color of the corresponding pixel is determined by this color filter. On the other hand, a shield(6653) is formed under the color filter in order to prevent cross talks between pixels. Rays that passed through the micro lens and the color filter reaches the photodiode by the open area in the shield and transformed into electrical charge. Furthermore, electrical wires(6654) are formed to draw out electrical current which has been produced by photoelectrical conversion process on the surface of the photodiode.

Considering the structures of ordinary CMOS image sensors, it can be seen that insensitive pixels can be produced by various methods. First, if the photodiode(PD) is not formed or the area of the photodiode is made very small, then photoelectrical conversion is not taking place, or its rate will be very small and practically there will be no video signals. Furthermore, the shield can completely cover the photodiode, or the open area can be made very tiny so that the amount of rays reaching the photodiode is very small. Furthermore, instead of forming a color filter, forming a dark absorbing filter or a reflecting filter can accomplish the same effect. Furthermore, instead of the micro lens which concentrates light rays, the micro lens can be formed into a concave lens so that it spreads light rays. Also, by not forming a micro lens, the amount of light rays reaching the photodiode can be reduced. Beside these, it can be realized that diverse methods can be used to form insensitive pixels in a CMOS image sensor.

In FIG. 65, the locations of sensitive pixels are determined in a mathematically precise manner considering the real projection scheme of the fisheye lens that is used as a set and the projection scheme of the desirable complex image. However, insensitive pixels do not have corresponding object points in the world coordinate system, and therefore, the locations of insensitive pixels can be arbitrarily determined. Practically, the locations of insensitive pixels can be determined considering the CMOS image sensor fabrication processes. In this case, the insensitive pixels must be close to the sensitive pixels sharing row or column numbers, and at the same time, insensitive pixels must not be too far apart or too close to each other among them.

Figure 26:
FIG. 26 is an exemplary multiple viewpoint panoramic image extracted from the fisheye image given in FIG. 25.
Figure 27:
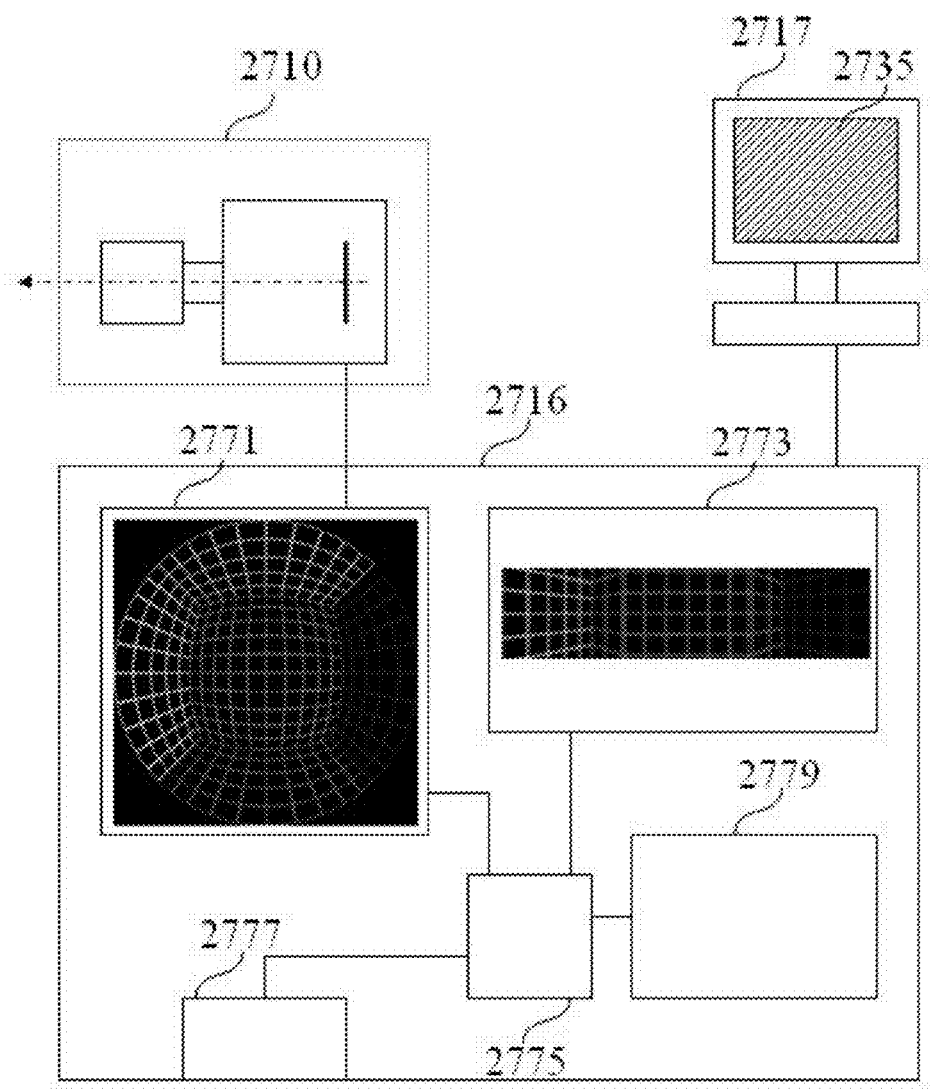
FIG. 27 is a schematic diagram of a preferable embodiment of an image processing means according to the invention of a prior art.
Figure 28:
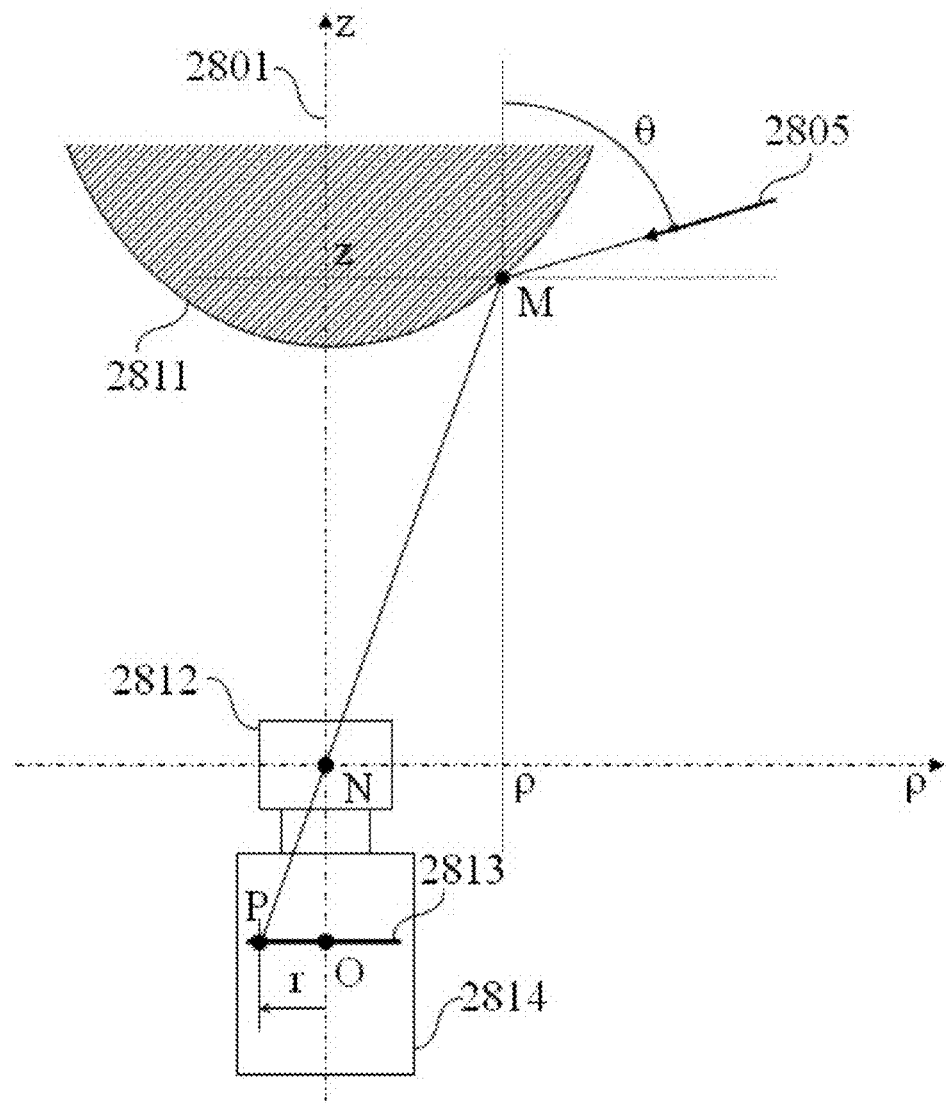
FIG. 28 is a schematic diagram of a catadioptric panoramic imaging system in prior arts.
Figure 29:
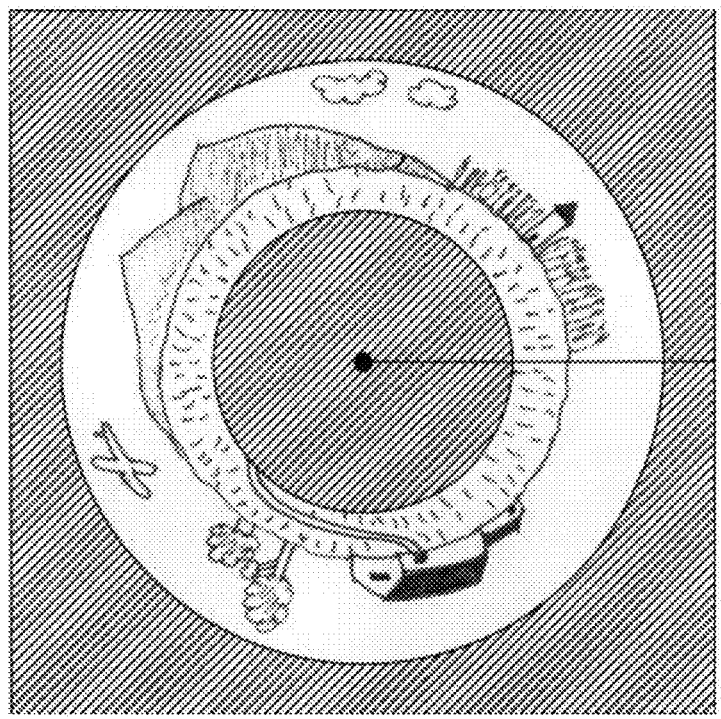
FIG. 29 is a conceptual drawing of an exemplary raw panoramic image acquired using the catadioptric panoramic imaging system schematically shown in FIG. 28.
Figure 30:
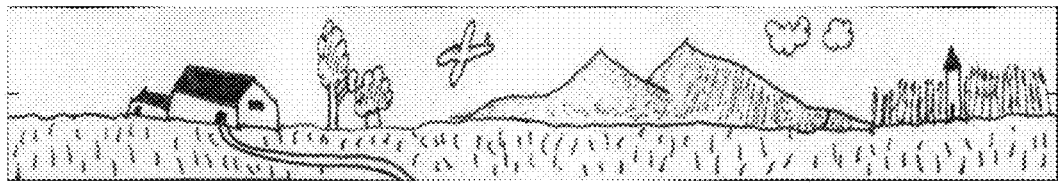
FIG. 30 is an unwrapped panoramic image corresponding to the raw panoramic image given in FIG. 29.
Figure 31:
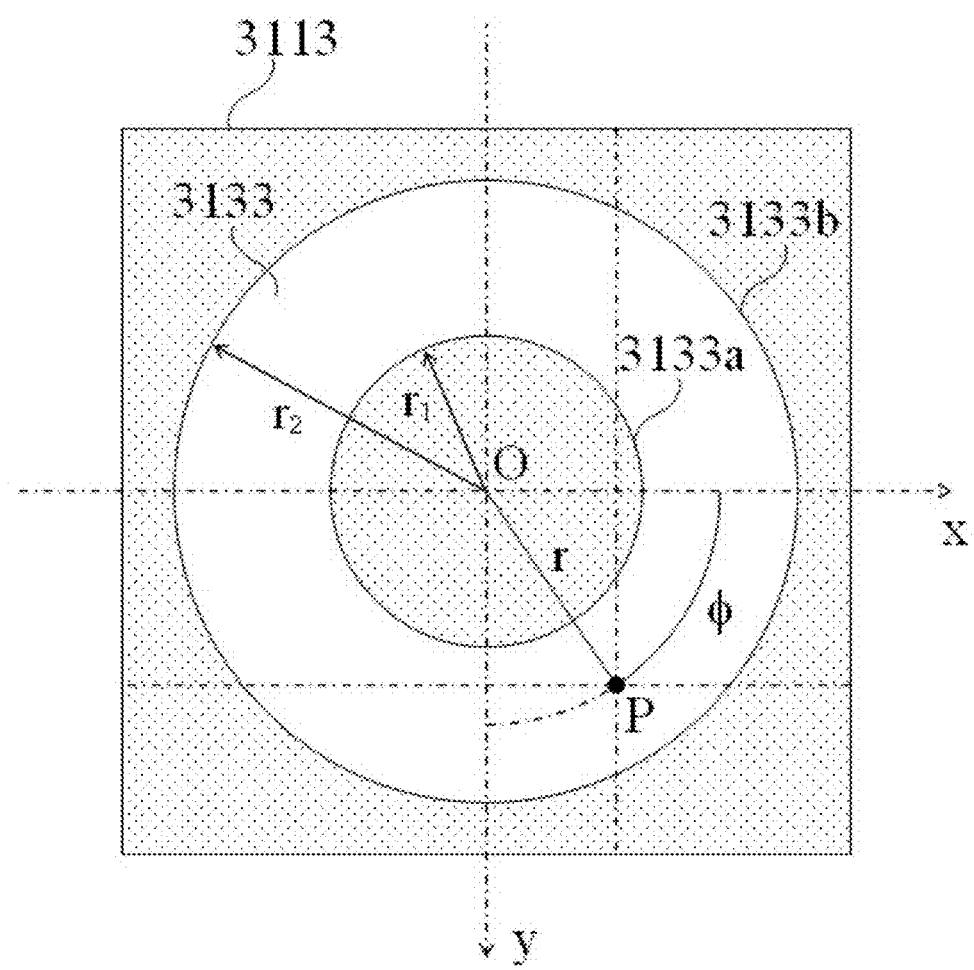
FIG. 31 is a schematic diagram for understanding the geometrical transformation of panoramic images.
Figure 32:
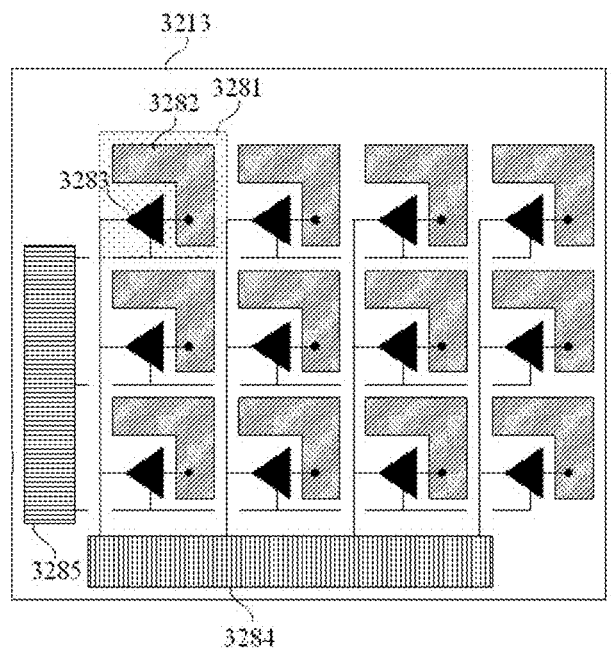
FIG. 32 is a schematic diagram illustrating the structure of an ordinary CMOS image sensor.
Figure 33:
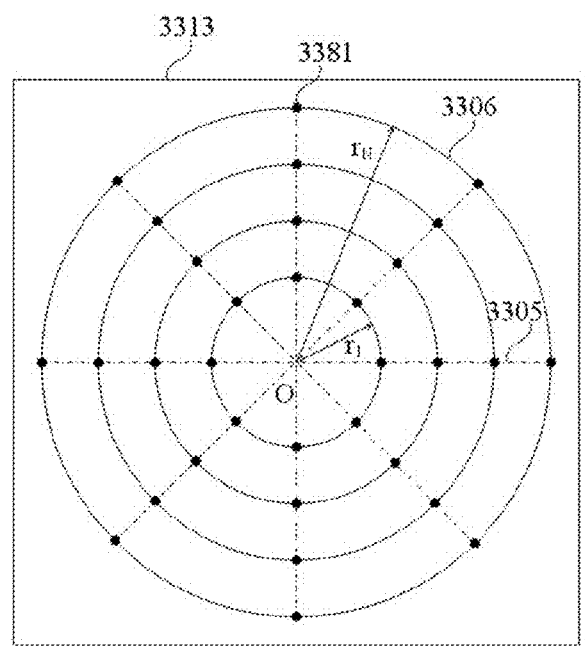
FIG. 33 is a conceptual diagram illustrating pixel arrangement in a CMOS image sensor for panoramic imaging system according to an embodiment of the invention of a prior art.
Figure 34:
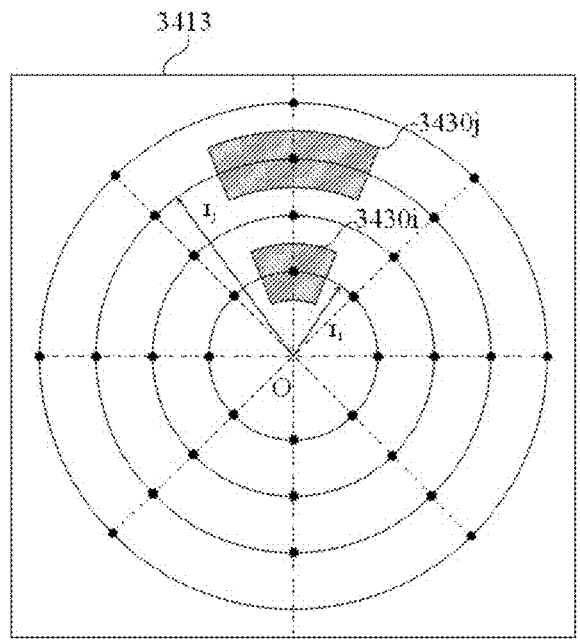
FIG. 34 is a conceptual diagram illustrating the structure of a CMOS image sensor for panoramic imaging system according to an embodiment of the invention of a prior art.
Figure 67:
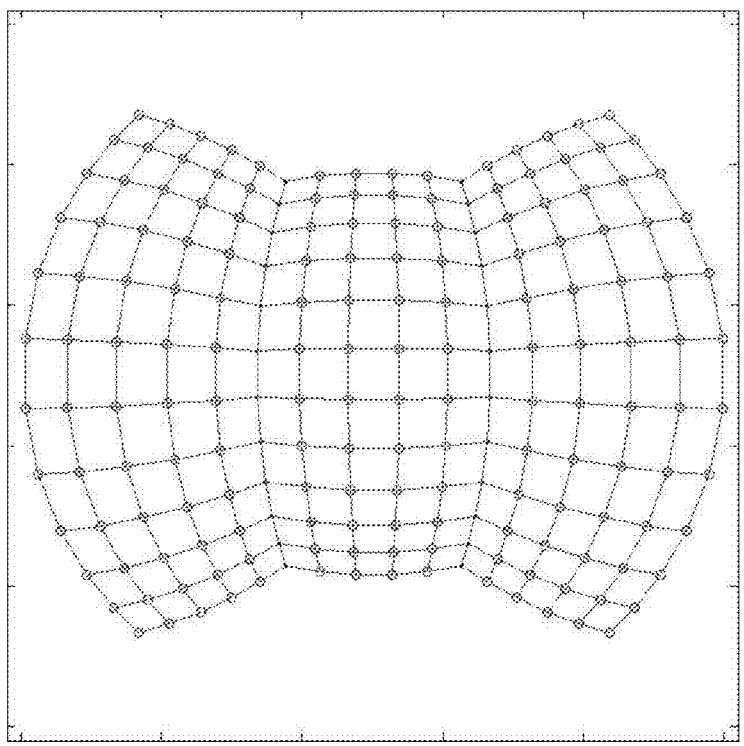
FIG. 67 is a schematic diagram illustrating a case of forming insensitive pixels in FIG. 64 in order to mark boundary lines between sub image planes.
Figure 68:
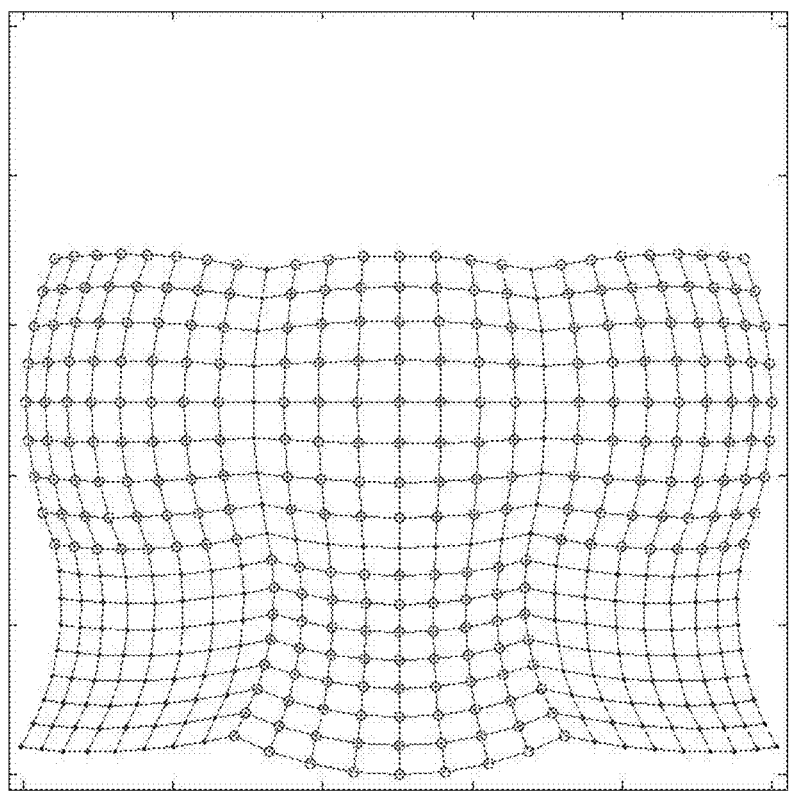
FIG. 68 is a schematic diagram illustrating a case of forming insensitive pixels in FIG. 65 in order to mark boundary lines between sub image planes.

Unlike bad pixels, such insensitive pixels are formed to have deliberately determined patterns on the image display means. While FIG. 48 illustrates a case where dormant pixels have been formed to form rectangular areas in the lower left and the lower right corners where images do not exist, FIG. 65 illustrates a case where insensitive pixels have been formed to form rectangular areas in the lower left and the lower right corners where images do not exist. On the other hand, FIG. 67 illustrates a case where insensitive pixels have been formed along the boundary planes between neighboring sub image planes in order to distinguish each sub image plane in multiple viewpoint panoramic images. In this case, multiple viewpoint panoramic images such as shown in FIG. 26 can be obtained without any separate image processing, and dark boundary lines along the longitudinal direction are formed by insensitive pixels. On the other hand, FIG. 68 is a case where additional insensitive pixels have been formed in order to distinguish each sub image plane as in FIG. 49.

INDUSTRIAL APPLICABILITY

Such CMOS image sensors can be used not only in security·surveillance applications for indoor and outdoor environments, but also in diverse areas such as video phone for apartment entrance door, rear view camera for automobiles, and visual sensors for robots.

The invention claimed is:

1. A complex image acquisition device comprising:
an image acquisition means for acquiring an uncorrected image plane using a camera equipped with a wide-angle imaging lens rotationally symmetric about an optical axis,
an image processing means for extracting a processed image plane from the uncorrected image plane; and
an image display means for displaying the processed image plane,
wherein;
the uncorrected image plane is a two-dimensional array with $K_{max}$ rows and $L_{max}$ columns,
the processed image plane is a two-dimensional array with $I_{max}$ rows and $J_{max}$ columns,
a signal value of a live pixel with a pixel coordinate (I, J) on the processed image plane and having a video signal is given as a signal value of an imaginary image point on the uncorrected image plane due to an incident ray originating from an object point on an imaginary object plane in a world coordinate system having a coordinate $(X_{I,J}, Y_{I,J}, Z_{I,J}) \equiv (X(I, J), Y(I, J), Z(I, J))$,
wherein;
the said world coordinate system takes a nodal point of the said wide-angle lens as an origin and takes the said optical axis as a Z-axis,
wherein a direction from the said origin to the object plane is the positive(+) direction,
an axis passing through the said origin and parallel to the sides of the image sensor plane of the said camera along the longitudinal direction is a Y-axis,
wherein a direction from a top end of the image sensor plane to a bottom end is a positive(+) Y-axis direction,
and the said world coordinate system is a right-handed coordinate system,
the X coordinate of the said object point is given as a sole function of the lateral pixel coordinate J as in the following equation, $$X_{I,J} = X(I,J) = X(J) \equiv X_J$$

and the Y coordinate of the said object point is given as a sole function of the longitudinal pixel coordinate I as in the following equation, $$Y_{I,J} | Y(I,J) = Y(I) \equiv Y_I.$$

2. The complex image acquisition device of claim 1, wherein;
a Z coordinate of any one object point among the said object points is given as a sole function of the lateral pixel coordinate J as in the following equation, $$Z_{I,J} = Z(I,J) = Z(J) \equiv Z_j$$

or,
a Z coordinate is given as a sole function of the longitudinal pixel coordinate I as in the following equation, $$Z_{I,J} = Z(I,J) = Z(I) \equiv Z_I.$$

3. The complex image acquisition device of claim 1, wherein;
a lateral incidence angle of the said incident ray given by the following equation is given as a monotonic function of the lateral pixel coordinate J, $$\psi_{I,J} = \tan^{-1}\left(\frac{X_J}{Z_{I,J}}\right)$$

and a longitudinal incidence angle of the said incident ray given by the following equation is given as a monotonic function of the longitudinal pixel coordinate I, $$\delta_{I,J} = \tan^{-1}\left(\frac{Y_I}{\sqrt{X_J^2 + Z_{I,J}^2}}\right).$$

4. The complex image acquisition device of claim 1, wherein;
a pixel coordinate of the optical axis on the said uncorrected image plane is $(K_o, L_o)$,
a pixel coordinate of the optical axis on the said processed image plane is $(I_o, J_o)$,
a pixel coordinate of the said imaginary image point is $(x'_{I,J}, y'_{I,J})$,
wherein;
the said pixel coordinate is given by the following equations, $$\phi_{I,J} = \tan^{-1}\left(\frac{Y_I}{X_J}\right)$$

$$\theta_{I,J} = \cos^{-1}\left(\frac{Z_{I,J}}{\sqrt{X_J^2 + Y_I^2 + Z_{I,J}^2}}\right)$$

$$r_{I,J} = r(\theta_{I,J})$$

$$x'_{I,J} = L_o + g r_{I,J} \cos\phi_{I,J}$$

$$y'_{I,J} = K_o + g r_{I,J} \sin\phi_{I,J}$$

a real projection scheme of the said lens is an image height r given as a function of the zenith angle θ of the corresponding incident ray and given as r=r(θ),
said g is a camera magnification ratio and given as $$g = \frac{r'}{r},$$

here, r' is a pixel distance on the uncorrected image plane corresponding to the image height r.

5. The complex image acquisition device of claim 1, wherein;
the said object plane satisfies the following equations on differentiable regions, $$\left(\frac{\partial X_J}{\partial J}\right)^2 + \left(\frac{\partial Z_{I,J}}{\partial J}\right)^2 = 1$$

$$\left(\frac{\partial Y_I}{\partial I}\right)^2 + \left(\frac{\partial Z_{I,J}}{\partial I}\right)^2 = 1.$$

6. The complex image acquisition device of claim 1, wherein;
the Z coordinate of the said object point is a sole function of the lateral pixel coordinate J and given by the following equation, $$Z_{I,J} = Z(I,J) = Z(J) = Z_J.$$

7. The complex image acquisition device of claim 6, wherein;
the said object plane satisfies the following equation on differentiable regions, $$\left(\frac{\partial X_J}{\partial J}\right)^2 + \left(\frac{\partial Z_J}{\partial J}\right)^2 = 1.$$

8. The complex image acquisition device of claim 7, wherein;
the said object plane satisfies the following equation on differentiable regions, $$\left(\frac{\partial Y_I}{\partial I}\right)^2 = 1.$$

9. The complex image acquisition device of claim 1, wherein;
the Z coordinate of the said object point is a sole function of the longitudinal pixel coordinate I and given by the following equation, $$Z_{I,J} = Z(I,J) = Z(I) = Z_I.$$

10. The complex image acquisition device of claim 9, wherein;
the said object plane satisfies the following equation on differentiable regions.

$$\left(\frac{\partial Y_I}{\partial I}\right)^2 + \left(\frac{\partial Z_I}{\partial I}\right)^2 = 1.$$

11. The complex image acquisition device of claim 10, wherein;
the said object plane satisfies the following equation on differentiable regions, $$\left(\frac{\partial X_J}{\partial J}\right)^2 = 1.$$

12. A complex image acquisition device comprising:
an image acquisition means for acquiring an uncorrected image plane using a camera equipped with a wide-angle imaging lens rotationally symmetric about an optical axis,
an image processing means for extracting a processed image plane from the uncorrected image plane; and
an image display means for displaying the processed image plane,
wherein;
the said uncorrected image plane is a two-dimensional array with $K_{max}$ rows and $L_{max}$ columns,
the said processed image plane is a two-dimensional array with $I_{max}$ rows and $J_{max}$ columns,
a signal value of a live pixel with a pixel coordinate (I, J) on the said processed image plane and having a video signal is given as a signal value of an imaginary image point having a pixel coordinate $(x'_{I,J}, y'_{I,J})$ on the uncorrected image plane due to an incident ray originating from an object point on an imaginary object plane in a world coordinate system,
the said world coordinate system takes a nodal point of the said wide-angle lens as an origin and takes the said optical axis as a Z-axis,
wherein a direction from the said origin to the object plane is the positive(+) direction,
an axis passing through the origin and parallel to the sides of the image sensor plane of the said camera along the longitudinal direction is a Y-axis, wherein a direction from the top end of the image sensor plane to the bottom end is the positive(+) Y-axis direction, and the said world coordinate system is a right-handed coordinate system, a zenith angle of the said incident ray is given as $\theta_{I,J}=\theta(I,J)$, an azimuth angle of the said incident ray is given as $\phi_{I,J}=\phi(I,J)$, a pixel coordinate of the optical axis on the said uncorrected image plane is $(K_o, L_o)$, a pixel coordinate of the said imaginary image point is given by the following equation, $$x'_{I,J}=L_o+gr(\theta_{I,J})\cos\phi_{I,J}$$

$$y'_{I,J}=K_o+gr(\theta_{I,J})\sin\phi_{I,J}$$

a real projection scheme of the said lens is an image height r given as a function of the zenith angle θ of the corresponding incident ray and given as $r=r(\theta)$, the said g is a camera magnification ratio and given as $$g = \frac{r'}{r},$$

here, r' is a pixel distance on the uncorrected image plane corresponding to the image height r.

13. The complex image acquisition device of claim 12, wherein;

a pixel coordinate of the optical axis on the said processed image plane is $(I_o, J_o)$, a zenith angle of the said incident ray is given by the following equation, $$\theta(I, J) = 2\tan^{-1}\left[\frac{\tan\left(\frac{\theta_2}{2}\right)}{r''_2}r''_{I,J}\right]$$

here, a pixel distance corresponding to a pixel coordinate (I, J) on the processed image plane is given by the following equation, $$r''_{I,J}=\sqrt{(I-I_o)^2+(J-J_o)^2}$$

$\theta_2$ is a reference zenith angle of an incident ray, $r''_2$ is a pixel distance on the processed image plane corresponding to the said reference zenith angle $\theta_2$, and the azimuth angle of the said incident ray is given by the following equation, $$\phi(I, J) = \tan^{-1}\left(\frac{I - I_o}{J - J_o}\right).$$

14. The complex image acquisition device of claim 12, wherein;

a pixel coordinate of the optical axis on the said processed image plane is $(I_o, J_o)$, a zenith angle of the said incident ray is given by the following equation, $$\theta(I, J) = \frac{\theta_2}{r''_2}r''_{I,J}$$

here, a pixel distance corresponding to a pixel coordinate (I, J) on the processed image plane is given by the following equation, $$r''_{I,J}=\sqrt{(I-I_o)^2+(J-J_o)^2}$$

$\theta_2$ is a reference zenith angle of an incident ray, $r''_2$ is a pixel distance on the processed image plane corresponding to the said reference zenith angle $\theta_2$, and the azimuth angle of the said incident ray is given by the following equation, $$\phi(I, J) = \tan^{-1}\left(\frac{I - I_o}{J - J_o}\right).$$

15. A complex image acquisition device comprising:

an image acquisition means for acquiring an uncorrected image plane using a camera equipped with a wide-angle imaging lens rotationally symmetric about an optical axis, an image processing means for extracting a processed image plane from the uncorrected image plane; and an image display means for displaying the processed image plane, wherein;

the said uncorrected image plane is a two-dimensional array with $K_{max}$ rows and $L_{max}$ columns, the said processed image plane is a two-dimensional array with $I_{max}$ rows and $J_{max}$ columns, a signal value of a live pixel with a pixel coordinate (I, J) on the said processed image plane and having a video signal is given as a signal value of an imaginary image point having a pixel coordinate $(x'_{I,J},y'_{I,J})$ on the uncorrected image plane due to an incident ray originating from an object point on an imaginary object plane in a world coordinate system, the said world coordinate system takes a nodal point of the said wide-angle lens as an origin and takes the said optical axis as a Z-axis, wherein a direction from the said origin to the object plane is the positive(+) direction, an axis passing through the origin and parallel to the sides of the image sensor plane of the said camera along the longitudinal direction is a Y-axis, wherein a direction from the top end of the image sensor plane to the bottom end is the positive(+) Y-axis direction, and the said world coordinate system is a right-handed coordinate system, a lateral incidence angle of the said incident ray is given as a sole function of the lateral pixel coordinate J and given as $\psi_J=\psi(J)$, a longitudinal incidence angle of the said incident ray is given as a sole function of the longitudinal pixel coordinate I and given as $\delta_I=\delta(I)$, a pixel coordinate of the optical axis on the said uncorrected image plane is $(K_o, L_o)$, a pixel coordinate of the said imaginary image point is given by the following equation, $$\phi_{I,J} = \tan^{-1}\left(\frac{\tan\delta_I}{\sin\psi_J}\right)$$

$$\theta_{I,J} = \cos^{-1}(\cos\delta_I\cos\psi_J)$$

$$x'_{I,J} = L_o + gr(\theta_{I,J})\cos\phi_{I,J}$$

$$y'_{I,J} = K_o + gr(\theta_{I,J})\sin\phi_{I,J}$$

a real projection scheme of the said lens is an image height r given as a function of the zenith angle θ of the corresponding incident ray and given as r=r(θ), the said g is a camera magnification ratio and given as $$g = \frac{r'}{r},$$

here, r' is a pixel distance on the uncorrected image plane corresponding to the image height r.

16. A CMOS image sensor that is used as a set with a wide-angle imaging lens rotationally symmetric about an optical axis, wherein;

the said CMOS image sensor has a multitude of pixels in an image sensor plane given in a form of an array having $I_{max}$ rows and $J_{max}$ columns, the said multitude of pixels contain at least one sensitive pixel having a video signal, an intersection point between the image sensor plane and the optical axis is a reference point O having a row number $I_o$ and a column number $J_o$, the said row number $I_o$ is a real number larger than 1 and smaller than $I_{max}$, the said column number $J_o$ is a real number larger than 1 and smaller than $J_{max}$, in a first rectangular coordinate system, wherein;

an axis that passes through the said reference point and is parallel to the sides of the image sensor plane along the lateral direction is taken as an x-axis, and the positive x-axis runs from the left side of the said image sensor plane to the right side, an axis that passes through the said reference point and is parallel to the sides of the image sensor plane along the longitudinal direction is taken as an y-axis, and the positive y-axis runs from the top end of the said image sensor plane to the bottom end, a center coordinate of a sensitive pixel P(I, J) with a row number I and a column number J and having a video signal is given as $(x_{I,J}, y_{I,J})$, wherein;

the center coordinate $(x_{I,J}, y_{I,J})$ of the said sensitive pixel P(I, J) is given as a coordinate of an imaginary image point due to an incident ray originating from an object point on an imaginary object plane in a world coordinate system having a coordinate $(X_{I,J}, Y_{I,J}, Z_{I,J}) \equiv (X(I, J), Y(I, J), Z(I, J))$, the said world coordinate system takes a nodal point of the said wide-angle lens as an origin and takes the said optical axis as a Z-axis, wherein a direction from the said origin to the object plane is the positive(+) direction, an axis passing through the origin and is parallel to the sides of the image sensor plane of the said camera along the longitudinal direction is a Y-axis, wherein a direction from the top end of the image sensor plane to the bottom end is the positive(+) Y-axis direction, and the said world coordinate system is a right-handed coordinate system, the X coordinate of the said object point is given as a sole function of the lateral pixel coordinates J as in the following equation, $X_{I,J} \equiv X(I,J) = X(J) \equiv X_J$ and the Y coordinate of the said object point is given as a sole function of the longitudinal pixel coordinate I as in the following equation, $Y_{I,J} \equiv Y(I,J) = Y(I) \equiv Y_I$.

17. The CMOS image sensor of claim 16, wherein;

a Z coordinate of any one object point among the said object points is given as a sole function of the lateral pixel coordinate J as in the following equation, $Z_{I,J} \equiv Z(I,J) = Z(J) \equiv Z_J$ or, the Z coordinate is given as a sole function of the longitudinal pixel coordinate I as in the following equation, $Z_{I,J} \equiv Z(I,J) = Z(I) \equiv Z_I$.

18. The CMOS image sensor of claim 16, wherein;

a lateral incidence angle of the said incident ray given by the following equation is given as a monotonic function of the lateral pixel coordinates J, $$\psi_{I,J} = \tan^{-1}\left(\frac{X_J}{Z_{I,J}}\right)$$

and a longitudinal incidence angle of the said incident ray given by the following equation is given as a monotonic function of the longitudinal pixel coordinate I, $$\delta_{I,J} = \tan^{-1}\left(\frac{Y_I}{\sqrt{X_J^2 + Z_{I,J}^2}}\right).$$

19. The CMOS image sensor of claim 16, wherein;

a center coordinate of the said sensitive pixel is $(x_{I,J}, y_{I,J})$, wherein;

the said center coordinate is given by the following equations, $$\phi_{I,J} = \tan^{-1}\left(\frac{Y_I}{X_J}\right)$$

$$\theta_{I,J} = \cos^{-1}\left(\frac{Z_{I,J}}{\sqrt{X_J^2 + Y_I^2 + Z_{I,J}^2}}\right)$$

$$r_{I,J} = r(\theta_{I,J})$$

$$x_{I,J} = r_{I,J}\cos\phi_{I,J}$$

$$y_{I,J} = r_{I,J}\sin\phi_{I,J}$$

here, r=r(θ) is a real projection scheme of the said lens and is an image height r given as a function of the zenith angle θ of the corresponding incident ray.

20. The CMOS image sensor of claim 16, wherein;

the said object plane satisfies the following equations on differentiable regions, $$\left(\frac{\partial X_J}{\partial J}\right)^2 + \left(\frac{\partial Z_{I,J}}{\partial J}\right)^2 = 1$$

$$\left(\frac{\partial Y_I}{\partial I}\right)^2 + \left(\frac{\partial Z_{I,J}}{\partial I}\right)^2 = 1.$$

21. The CMOS image sensor of claim 16,
wherein;
the Z coordinate of the said object point is a sole function of the lateral pixel coordinate J and given by the following equation, $$Z_{I,J}=Z(I,J)=Z(J)=Z_J.$$

22. The CMOS image sensor of claim 21,
wherein;
the said object plane satisfies the following equation on differentiable regions, $$\left(\frac{\partial X_J}{\partial J}\right)^2 + \left(\frac{\partial Z_J}{\partial J}\right)^2 = 1.$$

23. The CMOS image sensor of claim 22,
wherein;
the said object plane satisfies the following equation on differentiable regions, $$\left(\frac{\partial Y_I}{\partial I}\right)^2 = 1.$$

24. The CMOS image sensor of claim 16,
wherein;
the Z coordinate of the said object point is a sole function of the longitudinal pixel coordinate I and given by the following equation, $$Z_{I,J}=Z(I,J)=Z(I)=Z_I.$$

25. The CMOS image sensor of claim 24,
wherein;
the said object plane satisfies the following equation on differentiable regions, $$\left(\frac{\partial Y_I}{\partial I}\right)^2 + \left(\frac{\partial Z_I}{\partial I}\right)^2 = 1.$$

26. The CMOS image sensor of claim 25,
wherein;
the said object plane satisfies the following equation on differentiable regions.

$$\left(\frac{\partial X_J}{\partial J}\right)^2 = 1.$$

27. A CMOS image sensor that is used as a set with a wide-angle imaging lens rotationally symmetric about an optical axis,
wherein;
the said CMOS image sensor has a multitude of pixels in an image sensor plane given in a form of an array having $I_{max}$ rows and $J_{max}$ columns,
the said multitude of pixels contain at least one sensitive pixel having a video signal,
an intersection point between the image sensor plane and the optical axis is a reference point O having a row number $I_o$ and a column number $J_o$,
the said row number $I_o$ is a real number larger than 1 and smaller than $I_{max}$,
the said column number $J_o$ is a real number larger than 1 and smaller than $J_{max}$,
in a first rectangular coordinate system,
wherein;
an axis that passes through the said reference point and is parallel to the sides of the image sensor plane along the lateral direction is taken as an x-axis,
and the positive x-axis runs from the left side of the said image sensor plane to the right side,
an axis that passes through the said reference point and is parallel to the sides of the image sensor plane along the longitudinal direction is taken as an y-axis,
and the positive y-axis runs from the top end of the said image sensor plane to the bottom end,
a center coordinate $(x_{I,J}, y_{I,J})$ of a sensitive pixel P(I, J) with a row number I and a column number J and having a video signal is given as a coordinate of an imaginary image point due to an incident ray originating from an object point on an imaginary object plane,
wherein;
a zenith angle of the said incident ray is given as $\theta_{I,J}=\theta(I,J)$ and an azimuth angle is given as $\phi_{I,J}=\phi(I,J)$,
the center coordinate of the said sensitive pixel is given by the following equation, $$x_{I,J}=r(\theta_{I,J})\cos\phi_{I,J}$$

$$y_{I,J}=r(\theta_{I,J})\sin\phi_{I,J}$$

here, $r=r(\theta)$ is a real projection scheme of the said lens and is an image height r given as a function of the zenith angle $\theta$ of the corresponding incident ray.

28. The CMOS image sensor of claim 27,
wherein;
the zenith angle of the said incident ray is given by the following equation, $$\theta(I,J) = 2\tan^{-1}\left[\frac{\tan\left(\frac{\theta_2}{2}\right)}{r''_2}r''_{I,J}\right]$$

here, a pixel distance corresponding to the pixel coordinate (I, J) is given by the following equation, $$r''_{I,J}=\sqrt{(I-I_o)^2+(J-J_o)^2}$$

$\theta_2$ is a reference zenith angle of an incident ray,
$r''_2$ is a pixel distance corresponding to the said reference zenith angle $\theta_2$,
and the azimuth angle of the said incident ray is given by the following equation, $$\phi(I,J) = \tan^{-1}\left(\frac{I-I_o}{J-J_o}\right).$$

29. The CMOS image sensor of claim 27,
wherein;
the zenith angle of the said incident ray is given by the following equation, $$\theta(I,J) = \frac{\theta_2}{r''_2}r''_{I,J}$$

here, a pixel distance corresponding to the pixel coordinate (I, J) is given by the following equation, $$r''_{I,J}=\sqrt{(I-I_o)^2+(J-J_o)^2}$$

$\theta_2$ is a reference zenith angle of an incident ray,
$r''_2$ is a pixel distance corresponding to the said reference zenith angle $\theta_2$,
and the azimuth angle of the said incident ray is given by the following equation, $$\phi(I, J) = \tan^{-1}\left(\frac{I - I_o}{J - J_o}\right).$$

30. A CMOS image sensor that is used as a set with a wide-angle imaging lens rotationally symmetric about an optical axis,
wherein;
the said CMOS image sensor has a multitude of pixels in an image sensor plane given in a form of an array having $I_{max}$ rows and $J_{max}$ columns,
the said multitude of pixels contain at least one sensitive pixel having a video signal,
an intersection point between the image sensor plane and the optical axis is a reference point O having a row number $I_o$ and a column number $J_o$,
the said row number $I_o$ is a real number larger than 1 and smaller than $I_{max}$,
the said column number $J_o$ is a real number larger than 1 and smaller than $J_{max}$,
in a first rectangular coordinate system,
wherein;
an axis that passes through the said reference point and is parallel to the sides of the image sensor plane along the lateral direction is taken as an x-axis,
and the positive x-axis runs from the left side of the said image sensor plane to the right side,
an axis that passes through the said reference point and is parallel to the sides of the image sensor plane along the longitudinal direction is taken as an y-axis,
and the positive y-axis runs from the top end of the said image sensor plane to the bottom end,
a center coordinate $(x_{I,J}, y_{I,J})$ of a sensitive pixel $P(I, J)$ with a row number I and a column number J and having a video signal is given as a coordinate of an imaginary image point due to an incident ray originating from an object point on an imaginary object plane,
wherein;
a lateral incidence angle of the said incidence ray is given as a sole function of the lateral pixel coordinate J and is given as $\psi_J = \psi(J)$,
a longitudinal incidence angle is given as a sole function of the longitudinal pixel coordinate I and is given as $\delta_I = \delta(I)$,
the center coordinate of the said pixel is given by the following equations, $$\phi_{I,J} = \tan^{-1}\left(\frac{\tan\delta_I}{\sin\psi_J}\right)$$

$$\theta_{I,J} = \cos^{-1}(\cos\delta_I \cos\psi_J)$$

$$x_{I,J} = r(\theta_{I,J})\cos\phi_{I,J}$$

$$y_{I,J} = gr(\theta_{I,J})\sin\phi_{I,J}$$

here, $r=r(\theta)$ is a real projection scheme of the said lens and is an image height r given as a function of the zenith angle $\theta$ of the corresponding incident ray.

* * * * *